United States Patent
Kawabata et al.

(10) Patent No.: US 8,940,471 B2
(45) Date of Patent: Jan. 27, 2015

(54) ACTINIC-RAY- OR RADIATION-SENSITIVE RESIN COMPOSITION AND METHOD OF FORMING PATTERN USING THE COMPOSITION

(75) Inventors: Takeshi Kawabata, Haibara-gun (JP); Tomotaka Tsuchimura, Haibara-gun (JP); Takayuki Ito, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 407 days.

(21) Appl. No.: 12/895,300

(22) Filed: Sep. 30, 2010

(65) Prior Publication Data

US 2011/0076615 A1    Mar. 31, 2011

(30) Foreign Application Priority Data

Sep. 30, 2009 (JP) ................................. 2009-227030
Feb. 15, 2010 (JP) ................................. 2010-030630

(51) Int. Cl.
*G03F 7/004* (2006.01)
*G03F 7/028* (2006.01)
*G03F 7/039* (2006.01)

(52) U.S. Cl.
CPC .............. *G03F 7/0045* (2013.01); *G03F 7/028* (2013.01); *G03F 7/0046* (2013.01); *G03F 7/0397* (2013.01); *Y10S 430/12* (2013.01); *Y10S 430/122* (2013.01); *Y10S 430/126* (2013.01)
USPC .......... 430/270.1; 430/919; 430/921; 430/925

(58) Field of Classification Search
CPC ......... G03F 7/004; G03F 7/028; G03F 7/029; G03F 7/039; G03F 7/0392
USPC .............. 430/270.1, 913, 914, 921, 326, 919, 430/920, 922, 925, 927; 522/59
See application file for complete search history.

(56) References Cited

U.S. PATENT DOCUMENTS

| | | | |
|---|---|---|---|
| 6,680,157 B1 | 1/2004 | Fedynyshyn | |
| 6,749,987 B2 | 6/2004 | Kodama et al. | |
| 7,105,267 B2 | 9/2006 | Hatakeyama et al. | |
| 7,449,573 B2 | 11/2008 | Kodama et al. | |
| 2003/0113658 A1 | 6/2003 | Ebata et al. | |
| 2006/0040203 A1* | 2/2006 | Kodama et al. | 430/270.1 |
| 2006/0172228 A1 | 8/2006 | Wada | |
| 2007/0042290 A1 | 2/2007 | Inabe et al. | |
| 2007/0141512 A1* | 6/2007 | Wada et al. | 430/270.1 |
| 2009/0075202 A1 | 3/2009 | Kodama et al. | |
| 2009/0274978 A1 | 11/2009 | Ohashi et al. | |
| 2010/0167201 A1* | 7/2010 | Tsubaki | 430/270.1 |
| 2010/0190106 A1* | 7/2010 | Tsubaki | 430/270.1 |
| 2010/0233617 A1* | 9/2010 | Wada | 430/270.1 |
| 2010/0310991 A1 | 12/2010 | Inabe et al. | |
| 2012/0100481 A1* | 4/2012 | Ito et al. | 430/283.1 |

FOREIGN PATENT DOCUMENTS

| | | |
|---|---|---|
| EP | 1270553 A2 | 1/2003 |
| EP | 1480078 A1 | 11/2004 |
| JP | 2002-131897 A | 5/2002 |
| JP | 2002-214774 A | 7/2002 |
| JP | 2003-140332 A | 5/2003 |
| JP | 2005-148291 A | 9/2005 |
| JP | 2005-266766 A | 9/2005 |
| JP | 2006-208781 A | 8/2006 |
| JP | 2007-052346 A | 3/2007 |
| JP | 2008-074843 A | 4/2008 |
| JP | 2009-269953 A | 11/2009 |
| WO | 02/42845 A2 | 5/2002 |
| WO | WO 2008/153109 | * 12/2008 |
| WO | WO 2008/153110 | * 12/2008 |

OTHER PUBLICATIONS

Japanese Office Action issued in corresponding application No. 2010-030630 dated Aug. 20, 2013.

* cited by examiner

*Primary Examiner* — Anca Eoff
(74) *Attorney, Agent, or Firm* — Sughrue Mion, PLLC

(57) ABSTRACT

According to one embodiment, an actinic-ray- or radiation-sensitive resin composition includes a compound that when exposed to actinic rays or radiation, generates any of acids of general formula (I) below,

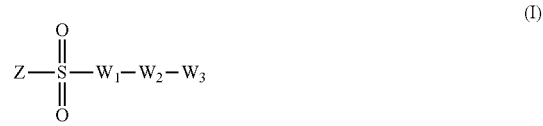

in which
$W_1$ represents an optionally substituted alkylene group,
$W_2$ represents a bivalent connecting group,
$W_3$ represents an optionally substituted organic group having 15 or more carbon atoms, and
Z represents a hydroxyl group or a fluoroalkylsulfonamido group having at least one fluorine atom introduced therein as a substituent.

14 Claims, No Drawings

ACTINIC-RAY- OR RADIATION-SENSITIVE RESIN COMPOSITION AND METHOD OF FORMING PATTERN USING THE COMPOSITION

CROSS-REFERENCE TO RELATED APPLICATIONS

This application is based upon and claims the benefit of priority from prior Japanese Patent Applications No. 2009-227030, filed Sep. 30, 2009; and No. 2010-030630, filed Feb. 15, 2010, the entire contents of both of which are incorporated herein by reference.

BACKGROUND OF THE INVENTION

1. Field of the Invention

The present invention relates to an actinic-ray- or radiation-sensitive resin composition that when exposed to actinic rays or radiation, makes a reaction to thereby change its properties and a method of forming a pattern using the composition. More particularly, the present invention relates to an actinic-ray- or radiation-sensitive resin composition for use in a semiconductor production process for an IC or the like, the production of a liquid crystal, a thermal head or the like, the fabrication of a nanoimprint mold structure, other photofabrication processes, a lithographic printing plate and a thermosetting composition and also relates to a method of forming a pattern with the use of the composition.

In the present invention, the terms "actinic rays" and "radiation" mean, for example, brightline spectra from a mercury lamp, far ultraviolet represented by an excimer laser, extreme ultraviolet, X-rays, electron beams and the like. In the present invention, the term "light" means actinic rays or radiation.

2. Description of the Related Art

A resist composition of chemical amplification type is a pattern forming material that is capable of, upon exposure to far ultraviolet or other radiation, generating an acid in exposed areas and, by a reaction catalyzed by the acid, changing the solubility in a developer between the areas having been exposed to actinic radiation and the nonexposed areas to thereby attain pattern formation on a substrate.

When a KrF excimer laser is used as an exposure light source, a resin whose fundamental skeleton is composed of a poly(hydroxystyrene) exhibiting a low absorption mainly in the region of 248 nm is employed as a major component of a resist composition. Accordingly, there can be attained a high sensitivity, high resolution and favorable pattern formation. Thus, a system superior to the conventional naphthoquinone diazide/novolak resin system is realized.

However, in using a light source of a further shorter wavelength, for example, an exposure light source of an ArF excimer laser (193 nm), as the compounds containing aromatic groups inherently exhibit a sharp absorption in the region of 193 nm, the above-mentioned chemical amplification system has not been satisfactory.

Consequently, resists for ArF excimer laser containing a resin with an alicyclic hydrocarbon structure have been developed.

It is of conventional practice to use compounds capable of generating a perfluoroalkanesulfonic acid, such as trifluoromethanesulfonic acid or nonafluorobutanesulfonic acid, as a photoacid generator. To now, it has been proposed to use photosensitive compositions comprising compounds capable of generating specified sulfonic acids (see, for example, patent references 1 to 4) and to use photosensitive compositions comprising a compound capable of generating any of specified sulfonic acids and a resin that when acted on by an acid, is decomposed to thereby increase its solubility in an alkali developer (see, for example, patent references 5 and 6).

When use is made of, for example, a light source emitting electron beams, X-rays or EUV, the exposure is carried out in vacuum. This tends to cause any low-boiling-point compounds, such as solvents, and resist materials decomposed by high energy to evaporate to thereby dirty the exposure apparatus. This outgas problem is becoming serious. In recent years, various researches have been made on the reduction of the outgas. Various proposals have been made, which include a proposal to inhibit the evaporation of low-molecular compounds by providing a top coat layer (see, for example, patent reference 7) and a proposal to add a radical trapping agent for the inhibition of any polymer decomposition (see, for example, patent reference 8). For the acid generator as well, an ingenuity for outgas reduction is demanded.

Now, there is a demand in the art for the development of a photosensitive composition that is enhanced in not only the outgas reduction but also the sensitivity, resolution, pattern configuration, roughness characteristic, aging stability, etc. through improvement of such acid generators.

In particular, the roughness characteristic and resolution become serious in accordance with the reduction of the pattern dimension. In the lithography using X-rays, electron beams or EUV, as the formation of a fine pattern of several tens of nanometers is targeted, the demand for excelling in the resolution and roughness characteristic is especially strong.

PRIOR ART REFERENCE

[Patent reference 1] Jpn. Pat. Appln. KOKAI Publication No. (hereinafter referred to as JP-A-) 2003-140332,

[Patent reference 2] European Patent Publication No. 1270553,

[Patent reference 3] International Publication No. 02/042845 (pamphlet),

[Patent reference 4] JP-A-2005-266766,

[Patent reference 5] JP-A-2002-131897,

[Patent reference 6] JP-A-2002-214774,

[Patent reference 7] European Patent No. 1480078, and

[Patent reference 8] U.S. Pat. No. 6,680,157.

BRIEF SUMMARY OF THE INVENTION

It is an object of the present invention to provide an actinic-ray- or radiation-sensitive resin composition excelling in the sensitivity, resolution, roughness characteristic, pattern configuration, aging stability and outgas performance. It is another object of the present invention to provide a method of forming a pattern using the composition.

The above objects can be attained by using a novel compound capable of generating a strong acid whose diffusion is inhibited.

Namely, the above objects can be attained by, for example, the following.

(1) An actinic-ray- or radiation-sensitive resin composition, comprising a compound that when exposed to actinic rays or radiation, generates any of acids of general formula (I) below,

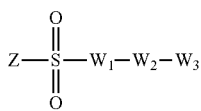

(I)

in which

W₁ represents an optionally substituted alkylene group,

W₂ represents a bivalent connecting group,

W₃ represents an optionally substituted organic group having 15 or more carbon atoms, and Z represents a hydroxyl group or a fluoroalkylsulfonamido group having at least one fluorine atom introduced therein as a substituent.

(2) The actinic-ray- or radiation-sensitive resin composition according to item (1), wherein in general formula (I), $W_3$ represents an optionally substituted organic group having 20 or more carbon atoms.

(3) The actinic-ray- or radiation-sensitive resin composition according to item (1) or (2), wherein in general formula (I), $W_1$ represents an alkylene group containing at least one fluorine atom.

(4) The actinic-ray- or radiation-sensitive resin composition according to any of items (1) to (3), wherein the acids of general formula (I) are compounds of general formula (I-1) below,

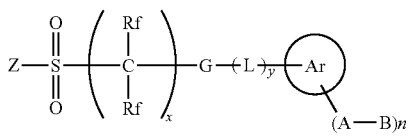

(I-1)

in which each of Rf's independently represents a fluorine atom or an alkyl group substituted with at least one fluorine atom, and x is an integer of 1 or greater, G represents a single bond, an alkylene group optionally containing an ether oxygen, a cycloalkylene group optionally containing an ether oxygen, an arylene group or a group composed of a combination of these, provided that combined groups may be linked to each other through an oxygen atom, Ar represents an aromatic ring optionally containing a heteroatom, in which a substituent other than -(A-B) groups may further be introduced, A represents a single bond or a bivalent connecting group, B represents a hydrocarbon group, and n is an integer of 1 or greater, Z represents a hydroxyl group, or a fluoroalkylsulfonamido group having at least one fluorine atom introduced therein as a substituent, and L represents a bivalent connecting group, and y is an integer of 0 or greater, provided that -(L)y- does not represent —SO₂—O—, provided that when x, y and n are each 2 or greater, Rf—C—Rf's, L's and A-B's may each be identical to or different from each other.

(5) The actinic-ray- or radiation-sensitive resin composition according to item (4), wherein in general formula (I-1), B is a hydrocarbon group having 3 or more carbon atoms.

(6) The actinic-ray- or radiation-sensitive resin composition according to item (4) or (5), wherein in general formula (I-1), B is a hydrocarbon group having 3 or more carbon atoms in which a tertiary or quaternary carbon atom is contained.

(7) The actinic-ray- or radiation-sensitive resin composition according to any of items (4) to (6), wherein in general formula (I-1), B is a cyclohydrocarbon group having 3 or more carbon atoms.

(8) The actinic-ray- or radiation-sensitive resin composition according to any of items (4) to (7), wherein in general formula (I-1), n is an integer of 2 or greater.

(9) The actinic-ray- or radiation-sensitive resin composition according to any of items (4) to (8), wherein in general formula (I-1), n is an integer of 3 or greater.

(10) The actinic-ray- or radiation-sensitive resin composition according to item (1) or (2), wherein the acids of general formula (I) are compounds of general formula (I-2) below,

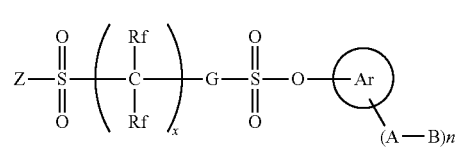

(I-2)

in which each of Rf's independently represents a fluorine atom, or an alkyl group substituted with at least one fluorine atom, and x is an integer of 1 or greater, G represents a single bond, an alkylene group optionally containing an ether oxygen, a cycloalkylene group optionally containing an ether oxygen, an arylene group or a group composed of a combination of these, provided that combined groups may be linked to each other through an oxygen atom, Ar represents an aromatic ring optionally containing a heteroatom, in which a substituent other than -(A-B) groups may further be introduced, A represents a single bond or a bivalent connecting group, B represents a hydrocarbon group, and n is an integer of 1 or greater, and Z represents a hydroxyl group, or a fluoroalkylsulfonamido group having at least one fluorine atom introduced therein as a substituent, provided that when x and n are each 2 or greater, Rf—C—Rf's and A-B's may each be identical to or different from each other.

(11) The actinic-ray- or radiation-sensitive resin composition according to item (10), wherein in general formula (I-2), B is a cyclohydrocarbon group having 3 or more carbon atoms.

(12) The actinic-ray- or radiation-sensitive resin composition according to item (10) or (11), wherein in general formula (I-2), n is an integer of 2 or greater.

(13) The actinic-ray- or radiation-sensitive resin composition according to any of items (10) to (12), wherein in general formula (I-2), n is an integer of 3 or greater.

(14) The actinic-ray- or radiation-sensitive resin composition according to any of items (1) to (13), further comprising a resin that when acted on by an acid, is decomposed to thereby increase its solubility in an alkali developer.

(15) The actinic-ray- or radiation-sensitive resin composition according to any of items (1) to (13), further comprising a resin soluble in an alkali developer and an acid crosslinking agent capable of crosslinking with the resin soluble in an alkali developer under the action of an acid.

(16) A resist film formed from the actinic-ray- or radiation-sensitive resin composition according to any of items (1) to (15).

(17) A method of forming a pattern, comprising forming the actinic-ray- or radiation-sensitive resin composition according to any of items (1) to (15) into a film, exposing the film and developing the exposed film.

(18) The method of forming a pattern according to item (17), wherein the exposure is performed using X-rays, electron beams or EUV.

The present invention has made it feasible to provide an actinic-ray- or radiation-sensitive resin composition excelling in the sensitivity, resolution, roughness characteristic, pattern configuration, aging stability and outgas performance and to provide a method of forming a pattern using the composition.

DETAILED DESCRIPTION OF THE INVENTION

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

The present invention has been made on the basis of finding of compounds (acid generators, hereinafter also referred to as "acid generators (A1)") that when exposed to actinic rays or radiation appropriate for an actinic-ray- or radiation-sensitive resin composition, generate novel acids of general formula (I).

The photosensitive composition comprising any of the acid generators (A1) may be a positive or a negative actinic-ray- or radiation-sensitive resin composition.

The positive actinic-ray- or radiation-sensitive resin composition (preferably, positive resist composition) of the present invention may comprise any of the acid generators (A1) and a resin (B) that when acted on by an acid, is decomposed to thereby increase its solubility in an alkali developer.

The negative actinic-ray- or radiation-sensitive resin composition (preferably, negative resist composition) of the present invention may comprise any of the acid generators (A1), a resin soluble in alkali developers (C) and an acid crosslinking agent (D) that crosslinks with the resin soluble in alkali developers (C) under the action of an acid.

[1] Compound that when Exposed to Actinic Rays or Radiation, Generates any of Acids of General Formula (I)

The acid generators (A1) contained in the actinic-ray- or radiation-sensitive resin composition of the present invention, when exposed to actinic rays or radiation, generate the acids of general formula (I) below.

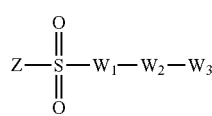

In the formula, $W_1$ represents an optionally substituted alkylene group.

$W_2$ represents a bivalent connecting group.

$W_3$ represents an optionally substituted organic group having 15 or more carbon atoms.

Z represents a hydroxyl group or a fluoroalkylsulfonamido group having at least one fluorine atom introduced therein as a substituent.

$W_1$ is preferably an alkylene group containing at least one fluorine atom, more preferably any of the fluoroalkylene groups of the following formula.

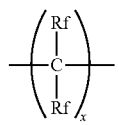

In the formula, each of Rf's independently represents a fluorine atom or an alkyl group substituted with at least one fluorine atom, and x is an integer of 1 or greater. When x is 2 or greater, the parenthesized Rf—C—Rf's may be identical to or different from each other.

Rf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, $CH_2CH_2C_4F_9$ or the like. Of these, a fluorine atom and a perfluoroalkyl group having 1 to 4 carbon atoms are preferred. A fluorine atom and $CF_3$ are more preferred. A fluorine atom is most preferred. In the formula, x is preferably 1 to 8, more preferably 1 to 4.

$W_2$ represents a bivalent connecting group. $W_2$ in its one form contains at least one oxygen atom.

$W_2$ is preferably any of the bivalent connecting groups of the following formula.

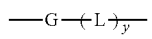

In the formula, G represents a single bond, an alkylene group optionally containing an ether oxygen, a cycloalkylene group optionally containing an ether oxygen, an arylene group or a group composed of a combination of these, provided that combined groups may be linked to each other through an oxygen atom.

The alkylene group or cycloalkylene group represented by G is preferably a linear, branched or cyclic alkylene group having 1 to 20 carbon atoms, more preferably 1 to 10 carbon atoms (for example, a methylene group, an ethylene group, a propylene group or a 1,4-cyclohexylene group). The hydrogen atoms thereof bonded to carbon may be wholly or partially replaced by fluorine atoms. An ether oxygen may be contained therein.

The arylene group represented by G is preferably an arylene group having 6 to 20 carbon atoms, more preferably 6 to 10 carbon atoms (for example, phenylene or naphthylene). The hydrogen atoms thereof bonded to carbon may be wholly or partially replaced by fluorine atoms. These alkylene groups, cycloalkylene groups and arylene groups may be used individually or in combination. When used in combination, these alkylene groups, cycloalkylene groups and arylene groups can be combined together through an oxygen atom.

L represents a bivalent connecting group, and y is an integer of 0 or greater.

As the bivalent connecting group, there can be mentioned, for example, —COO—, —OCO—, —CO—, —O—, —S—, —SO—, —SO$_2$—, —SO$_3$—, —NH—, an alkylene group, a cycloalkylene group or an alkenylene group. Of these, —COO—, —OCO—, —CO—, —O—, —S—, —SO—, —SO₂— and —SO₃— are preferred. —COO—, —OCO—, —SO₂— and —SO₃— are more preferred.

In the formula, y is preferably an integer of 0 to 4, more preferably 0 to 2. When y is 2 or greater, the parenthesized L's may be identical to or different from each other.

The bivalent connecting group represented by -G-(L)y- in its one form contains at least one oxygen atom.

A substituent may be introduced in the organic group represented by W₃. As the organic group, there can be mentioned an aliphatic or aromatic group having 15 or more carbon atoms. The aliphatic or aromatic group may contain a heteroatom.

W₃ is preferably any of the aromatic rings each having 15 or more carbon atoms of the following formula.

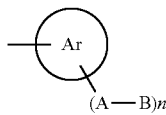

Ar represents an aromatic ring optionally containing a heteroatom, in which a substituent other than -(A-B) groups may further be introduced, and n is an integer of 1 or greater.

The aromatic ring represented by Ar is preferably one having 6 to 30 carbon atoms, in which a heteroatom may be contained. In particular, as the aromatic ring, there can be mentioned a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an iodolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, a phenazine ring or the like. Of these, a benzene ring, a naphthalene ring and an anthracene ring are preferred from the viewpoint of simultaneous attainment of roughness enhancement and sensitivity increase. A benzene ring is more preferred.

A represents a single bond or a bivalent connecting group. As preferred examples of the bivalent connecting groups represented by A, there can be mentioned any one selected from among an alkylene group, —O—, —S—, —C(=O)—, —S(=O)—, —S(=O)₂— and —OS(=O)₂—, and a combination thereof.

It is preferred for A to have a small number of carbon atoms from the viewpoint of resolution and roughness. A is preferably a single bond, —O—, —CO₂— or —S—. A single bond is most preferred.

B represents a hydrocarbon group in which a substituent may be introduced. B is preferably a hydrocarbon group having 1 to 30 carbon atoms, more preferably 3 to 30 carbon atoms. Further more preferably, B is a group containing a hydrocarbon group having 3 to 30 carbon atoms in which a tertiary or quaternary carbon atom is contained.

When n is 2 or greater, the individual -(A-B)'s may be identical to or different from each other.

The hydrocarbon group represented by B may be an aliphatic group or an aromatic group. An aliphatic group is preferred. The aliphatic group may be a noncyclic hydrocarbon group or a cycloaliphatic group.

As the noncyclic hydrocarbon group having 3 to 30 carbon atoms in which a tertiary or quaternary carbon atom is contained, there can be mentioned an isopropyl group, a t-butyl group, a t-pentyl group, a neopentyl group, an s-butyl group, an isobutyl group, an isohexyl group, a 3,3-dimethylpentyl group, a 2-ethylhexyl group or the like. The noncyclic hydrocarbon group is preferably one having 5 to 20 carbon atoms. A substituent may be introduced in the noncyclic hydrocarbon group.

As the cycloaliphatic group having 3 to 30 carbon atoms, there can be mentioned a cycloalkyl group such as a cyclopropyl group, a cyclobutyl group, a cyclopentyl group, a cyclohexyl group, a cycloheptyl group or a cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group, a pinenyl group or the like. The cycloaliphatic group is preferably one having 5 to 20 carbon atoms. A substituent may be introduced in the cycloaliphatic group.

As substituents that may be introduced in the noncyclic hydrocarbon groups and cycloaliphatic groups, there can be mentioned, for example, a halogen atom such as a fluorine atom, a chlorine atom, a bromine atom or an iodine atom; an alkoxy group such as a methoxy group, an ethoxy group or a tert-butoxy group; an aryloxy group such as a phenoxy group or a p-tolyloxy group; an alkylthioxy group such as a methylthioxy group, an ethylthioxy group or a tert-butylthioxy group; an arylthioxy group such as a phenylthioxy group or a p-tolylthioxy group; an alkoxycarbonyl group such as a methoxycarbonyl group or a butoxycarbonyl group; an aryloxycarbonyl group such as a phenoxycarbonyl group; an acetoxy group; a linear or branched alkyl group such as a methyl group, an ethyl group, a propyl group, a butyl group, a heptyl group, a hexyl group, a dodecyl group or a 2-ethylhexyl group; a cycloalkyl group such as a cyclohexyl group; an alkenyl group such as a vinyl group, a propenyl group or a hexenyl group; an alkynyl group such as an acetylene group, a propynyl group or a hexynyl group; an aryl group such as a phenyl group or a tolyl group; a hydroxyl group, a carboxyl group, a sulfonate group, a carbonyl group, and the like. Of these, a linear or branched alkyl group is preferred from the viewpoint of simultaneous attainment of roughness enhancement and sensitivity increase.

Specific examples of the groups containing these cycloaliphatic groups or noncyclic hydrocarbon groups will be shown below. In the formulae, * represents the site of bonding to A (when A is a single bond, Ar).

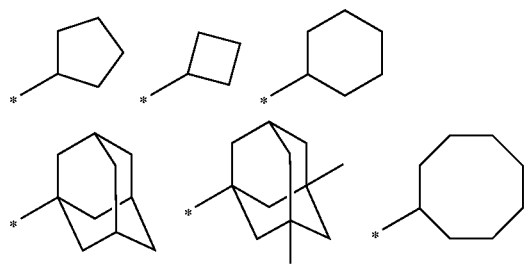

-continued
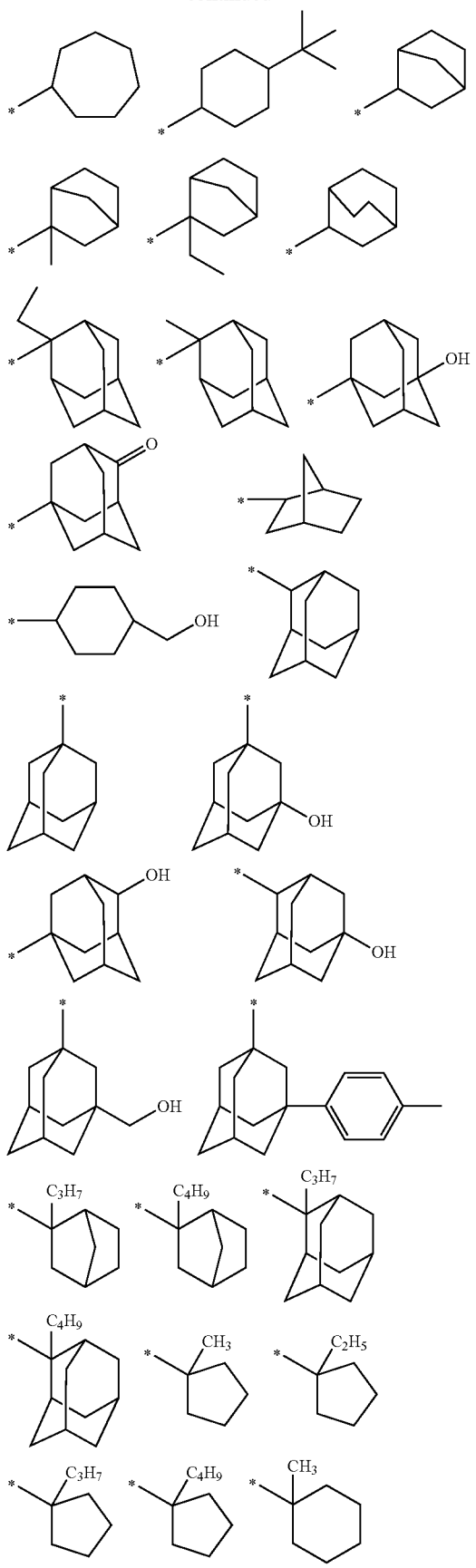
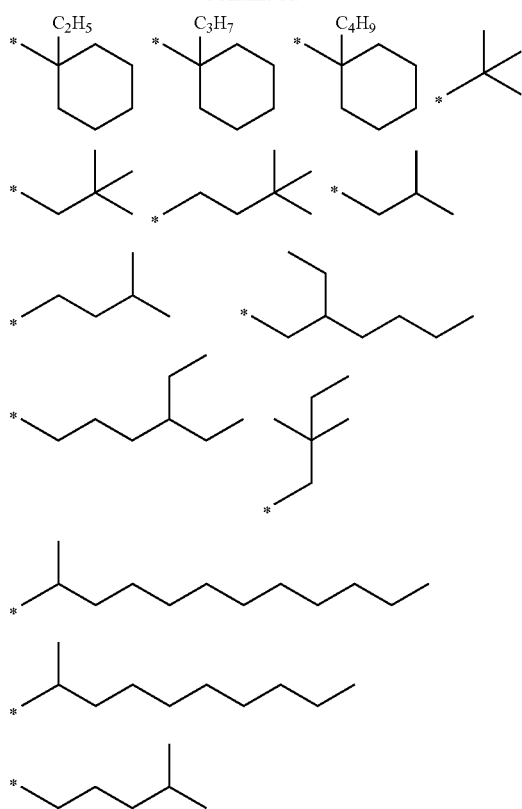
Among the above structures, the following structures are preferred.
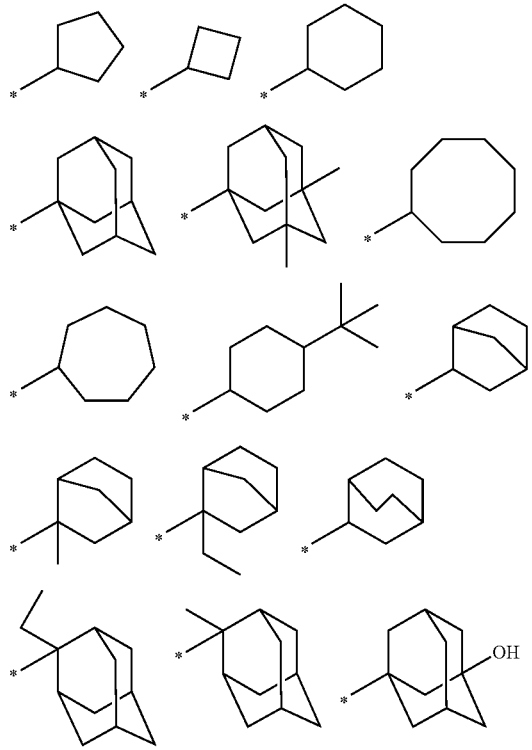

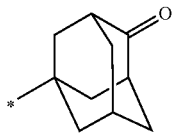

It is preferred for the group containing a hydrocarbon group having 4 or more carbon atoms in which a tertiary or quaternary carbon atom is contained, represented by B, to be a cycloaliphatic group from the viewpoint of resolution and roughness. Among the above cycloaliphatic groups, a cycloalkyl group, an adamantyl group and a norbornyl group are preferred from the viewpoint of roughness enhancement. A cycloalkyl group is more preferred. Among the cycloalkyl groups, a cyclohexyl group is most preferred.

In the formula, n is an integer of 1 or greater. From the viewpoint of roughness enhancement, it is preferred for n to be in the range of 2 to 5, especially 2 to 4. Most preferably, n is 3.

It is preferred for the substitution with the -(A-B) group to take place at least one o-position with respect to the site of L substitution from the viewpoint of roughness enhancement. More preferably, the substitution with the -(A-B) group takes place at two o-positions mentioned above.

A substituent other than -(A-B) groups may further be introduced in the aromatic ring represented by Ar.

As preferred examples of such other substituents, there can be mentioned a halogen group such as a fluorine atom, a chlorine atom, a bromine atom or an iodine atom, a hydroxyl group, a carboxyl group, a sulfonate group, a nitro group, a cyano group, an amino group, a formyl group, an amido group, a formylamino group and the like.

When Z is a fluoroalkylsulfonamido group, general formula (I) in its one form is expressed by general formula (I') below.

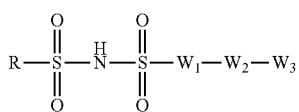

(I')

In the formula, R represents an alkyl group substituted with at least one fluorine atom. R is preferably a perfluoroalkyl group. $CF_3$, $C_2F_5$, $C_3F_7$, $C_4F_9$ and $C_5F_{11}$ are more preferred.

The acids of general formula (I) in preferred forms thereof are expressed by general formula (I-1) or general formula (I-2) below.

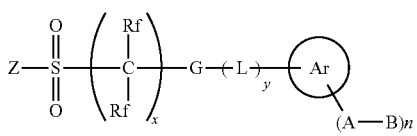

(I-1)

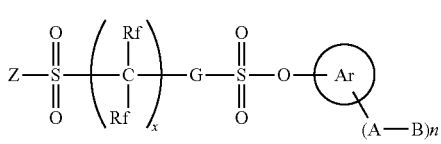

(I-2)

In the formulae, Z, Rf, G, L, Ar, A, B, x, y and n are as defined above except for the following.

Namely, in general formula (I-1), -(L)y- does not represent $—SO_2—O—$. Further, in general formula (I-2), the carbon atom of B bonded to A (when A is a single bond, Ar) is not quaternary.

The compounds (A1) that when exposed to actinic rays or radiation, generate the acids of general formula (I-1) in particular forms thereof are expressed by general formula (II-1) or (II'-1) below.

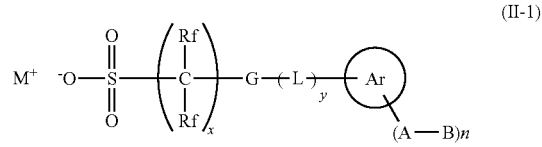

(II-1)

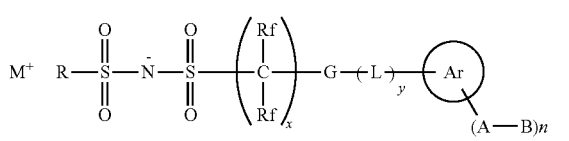

(II'-1)

In the formulae, R is as defined above in connection with general formula (I'). Rf, G, L, Ar, A, B, x, y and n are as defined above in connection with general formula (I-1).

$M^+$ represents an organic onium ion.

The compounds (A1) that when exposed to actinic rays or radiation, generate the acids of general formula (I-2) in particular forms thereof are expressed by general formula (II-2) or (II'-2) below.

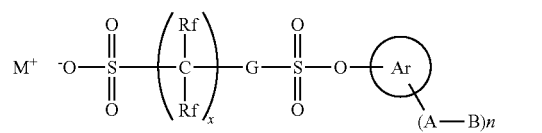

(II-2)

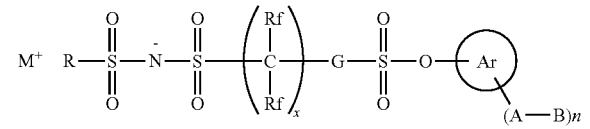

(II'-2)

In the formulae, R is as defined above in connection with general formula (I'). Rf, G, L, Ar, A, B, x, y and n are as defined above in connection with general formula (I-2).

$M^+$ represents an organic onium ion.

The organic onium ion represented by $M^+$ in general formulae (II-1), (II'-1), (II-2) and (II'-2) in its one form is any of the onium ions of general formulae (ZI) and (ZII) below.

(ZI)

(ZII)

In general formula (ZI) above, each of $R_{201}$, $R_{202}$ and $R_{203}$ independently represents an organic group. The number of carbon atoms of each of the organic groups represented by $R_{201}$, $R_{202}$ and $R_{203}$ is, for example, in the range of 1 to 30, preferably 1 to 20.

Two of $R_{201}$ to $R_{203}$ may be bonded to each other through a single bond or a bivalent connecting group to thereby form a ring structure. As the bivalent connecting group, there can be mentioned, for example, an ether group, a thioether group, an ester group, an amido group, a carbonyl group, a methylene group and an ethylene group. As the group formed by bonding of two of $R_{201}$ to $R_{203}$, there can be mentioned, for example, an alkylene group such as a butylene group or a pentylene group.

As the organic groups represented by $R_{201}$, $R_{202}$ and $R_{203}$, there can be mentioned, for example, corresponding groups of the following compounds (ZI-1), (ZI-2) and (ZI-3).

The photo acid generators (A1) may be compounds with two or more of the structures of general formula (ZI). For example, use may be made of compounds having a structure wherein at least one of $R_{201}$ to $R_{203}$ of a cation of general formula (ZI) is bonded to at least one of $R_{201}$ to $R_{203}$ of another cation of general formula (ZI).

As preferred (ZI) components, there can be mentioned the following cations (ZI-1), (ZI-2) and (ZI-3).

Cations (ZI-1) are arylsulfonium cations of general formula (ZI) wherein at least one of $R_{201}$ to $R_{203}$ is an aryl group.

In the cations (ZI-1), all of the $R_{201}$ to $R_{203}$ may be aryl groups. It is also appropriate that the $R_{201}$ to $R_{203}$ are partially an aryl group and the remainder is an alkyl group. When each of the compounds (ZI-1) contains a plurality of aryl groups, the aryl groups may be identical to or different from each other.

As the cations (ZI-1), there can be mentioned, for example, a triarylsulfonium ion, a diarylalkylsulfonium ion and an aryldialkylsulfonium ion.

The aryl group of the cations (ZI-1) is preferably a phenyl group, a naphthyl group or a heteroaryl group such as an indole residue, a pyrrole residue or the like. The aryl group is more preferably a phenyl group, a naphthyl group or an indole residue.

The alkyl group contained in the cation (ZI-1) according to necessity is preferably a linear or branched alkyl group or a cycloalkyl group having 1 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group and alkyl group represented by $R_{201}$ to $R_{203}$ may have a substituent. As the substituent, there can be mentioned an alkyl group (preferably having 1 to 15 carbon atoms), an aryl group (preferably having 6 to 14 carbon atoms), an alkoxy group (preferably having 1 to 15 carbon atoms), a halogen atom, a hydroxyl group or a phenylthio group.

Preferred substituents are a linear, branched or cyclic alkyl group having 1 to 12 carbon atoms and a linear, branched or cyclic alkoxy group having 1 to 12 carbon atoms. More preferred substituents are an alkyl group having 1 to 6 carbon atoms and an alkoxy group having 1 to 6 carbon atoms. The substituents may be contained in any one of the three $R_{201}$ to $R_{203}$, or alternatively may be contained in all three of $R_{201}$ to $R_{203}$. When $R_{201}$ to $R_{203}$ represent a phenyl group, the substituent preferably lies at the p-position of the aryl group.

It is also appropriate that any one or two of the three $R_{201}$ to $R_{203}$ is an optionally substituted aryl group and the remainder is a linear, branched or cyclic alkyl group. As particular examples of the structures, there can be mentioned the structures described in Paragraphs 0141 to 0153 of JP-A-2004-210670.

As the aryl group, there can be mentioned the same aryl groups as mentioned with respect to $R_{201}$ to $R_{203}$. It is preferred for the aryl group to have a substituent selected from a hydroxyl group, an alkoxy group and an alkyl group. More preferred substituent is an alkoxy group having 1 to 12 carbon atoms. Especially preferred is an alkoxy group having 1 to 6 carbon atoms.

The linear, branched or cyclic alkyl group of the remainder is preferably an alkyl group having 1 to 6 carbon atoms. These groups may further have substituents. When the two remainders exist, they may be bonded to each other to thereby form a ring.

The cations (ZI-1) in one form thereof are those of general formula (ZI-1A) below.

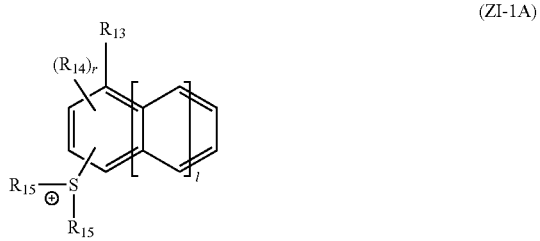

(ZI-1A)

In general formula (ZI-1A), $R_{13}$ represents any of a hydrogen atom, a fluorine atom, a hydroxyl group, an alkyl group, a cycloalkyl group, an alkoxy group, a cycloalkyloxy group, an alkoxycarbonyl group and a group with a cycloalkyl skeleton of a single ring or multiple rings. These groups may have substituents.

$R_{14}$, each independently in the instance of $R_{14}$s, represents any of an alkyl group, a cycloalkyl group, an alkoxy group, an alkylsulfonyl group, an alkoxycarbonyl group, an alkylcarbonyl group, a cycloalkylsulfonyl group and a group with a cycloalkyl skeleton of a single ring or multiple rings. These groups may have substituents.

Each of $R_{15}$s independently represents an alkyl group, a cycloalkyl group or a naphthyl group, provided that the two $R_{15}$s may be bonded to each other to thereby form a ring. These groups may have substituents.

In the formula, 1 is an integer of 0 to 2, and r is an integer of 0 to 8.

The alkyl groups represented by $R_{13}$, $R_{14}$ and $R_{15}$ may be linear or branched and preferably each has 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are especially preferred.

As the cycloalkyl groups represented by $R_{13}$, $R_{14}$ and $R_{15}$, there can be mentioned a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, a norbornyl group, a tricyclodecanyl group, a tetracyclodecanyl group, an adamantyl group, a cyclooctadienyl group and the like. Of these a cyclopropyl group, a cyclopentyl group, a cyclohexyl group and a cyclooctyl group are especially preferred.

With respect to the alkyl group of the alkoxy group represented by $R_{13}$ or $R_{14}$, there can be mentioned, for example, the same specific examples as mentioned above with respect to the alkyl groups represented by $R_{13}$ to $R_{15}$. As the alkoxy group, a methoxy group, an ethoxy group, an n-propoxy group and an n-butoxy group are especially preferred.

With respect to the cycloalkyl group of the cycloalkyloxy group represented by $R_{13}$, there can be mentioned, for example, the same specific examples as mentioned above with respect to the cycloalkyl groups represented by $R_{13}$ to $R_{15}$. As the cycloalkyloxy group, a cyclopentyloxy group and a cyclohexyloxy group are especially preferred.

With respect to the alkoxy group of the alkoxycarbonyl group represented by $R_{13}$, there can be mentioned, for example, the same specific examples as mentioned above with respect to the alkoxy groups represented by $R_{13}$ or $R_{14}$. As the alkoxycarbonyl group, a methoxycarbonyl group, an ethoxycarbonyl group and an n-butoxycarbonyl group are especially preferred.

With respect to the alkyl group of the alkylsulfonyl group represented by $R_{14}$, there can be mentioned, for example, the same specific examples as mentioned above with respect to the alkyl groups represented by $R_{13}$ to $R_{15}$. With respect to the cycloalkyl group of the cycloalkylsulfonyl group represented by $R_{14}$, there can be mentioned, for example, the same specific examples as mentioned above with respect to the cycloalkyl groups represented by $R_{13}$ to $R_{15}$. As the alkylsulfonyl group and cycloalkylsulfonyl group, a methanesulfonyl group, an ethanesulfonyl group, an n-propanesulfonyl group, an n-butanesulfonyl group, a cyclopentanesulfonyl group and a cyclohexanesulfonyl group are especially preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have substituents.

In the formula, l is preferably 0 or 1, more preferably 1, and r is preferably 0 to 2.

Each of the groups represented by $R_{13}$ to $R_{15}$ may further have a substituent. As such a substituent, there can be mentioned, for example, a halogen atom (e.g., a fluorine atom), a hydroxyl group, a carboxyl group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, a cycloalkyloxycarbonyloxy group or the like.

As the alkoxy group, there can be mentioned, for example, a linear or branched group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group and the like.

As the cycloalkyloxy group, there can be mentioned, for example, a cycloalkyloxy group having 3 to 20 carbon atoms, such as a cyclopentyloxy group, a cyclohexyloxy group and the like.

As the alkoxyalkyl group, there can be mentioned, for example, a linear or branched alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group. As the cycloalkyloxyalkyl group, there can be mentioned, for example, a cycloalkyloxyalkyl group having 4 to 21 carbon atoms, such as a cyclohexyloxymethyl group, a cyclopentyloxymethyl group or a cyclohexyloxyethyl group.

As the alkoxycarbonyl group, there can be mentioned, for example, a linear or branched alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group or a t-butoxycarbonyl group.

As the cycloalkyloxycarbonyl group, there can be mentioned, for example, a cycloalkyloxycarbonyl group having 4 to 21 carbon atoms, such as a cyclopentyloxycarbonyl group or a cyclohexyloxycarbonyl group.

As the alkoxycarbonyloxy group, there can be mentioned, for example, a linear or branched alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group or a t-butoxycarbonyloxy group.

As the cycloalkyloxycarbonyloxy group, there can be mentioned, for example, a cycloalkyloxycarbonyloxy group having 4 to 21 carbon atoms, such as a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-1A).

The cyclic structure may further have a substituent. As such substituent, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like.

It is especially preferred for the $R_{15}$ to be a methyl group, an ethyl group, a bivalent group allowing two $R_{15}$s to be bonded to each other so as to form a tetrahydrothiophene ring structure in cooperation with the sulfur atom of the general formula (ZI-1A).

Each of $R_{13}$ and $R_{14}$ may further have a substituent. As such a substituent, there can be mentioned, for example, a hydroxyl group, an alkoxy group, an alkoxycarbonyl group, a halogen atom (especially, a fluorine atom) or the like.

Specific examples of the cations of general formula (ZI-1A) will be shown below.

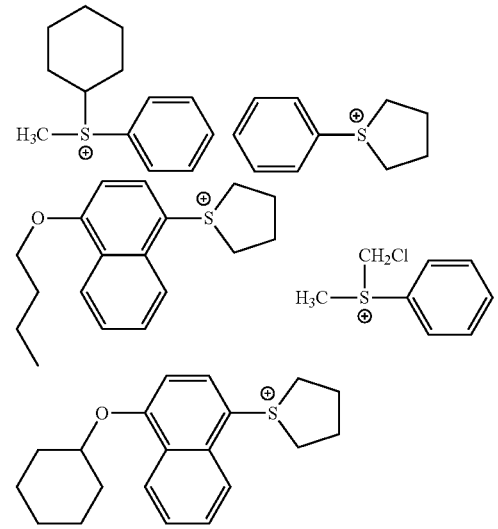

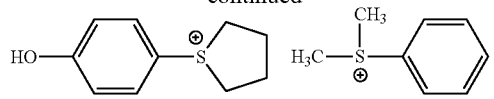
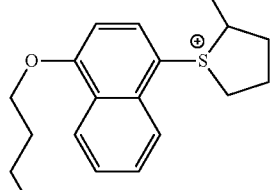
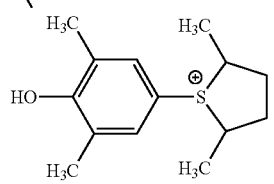
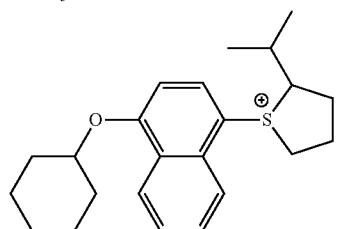
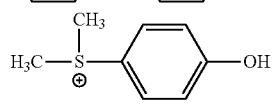
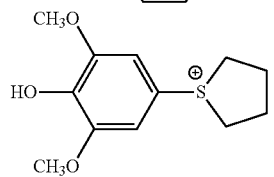
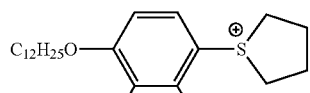
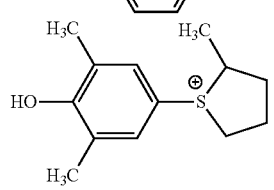
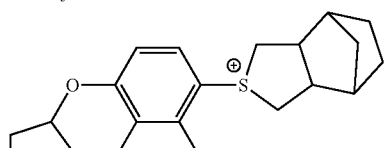
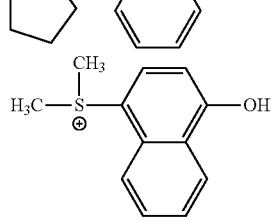
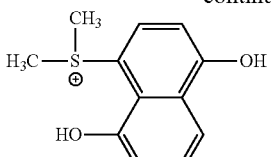
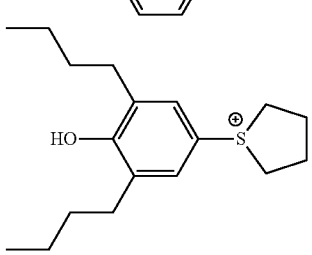
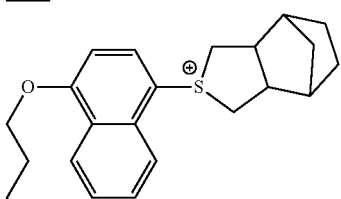
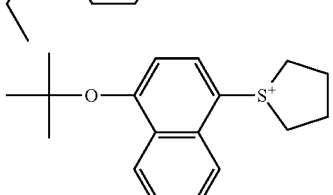
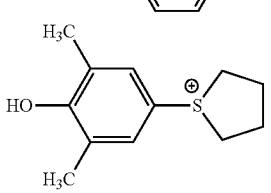
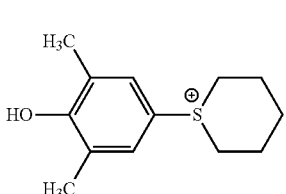
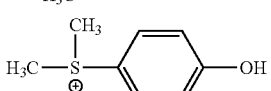
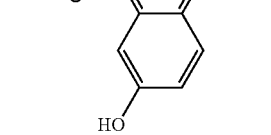
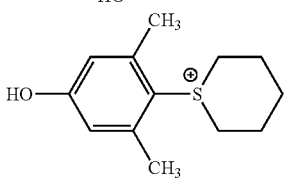
The cations (ZI-1) in other forms thereof are those of general formula (ZI-1B) below. The cations of general formula (ZI-1B) are effective in outgas suppression.

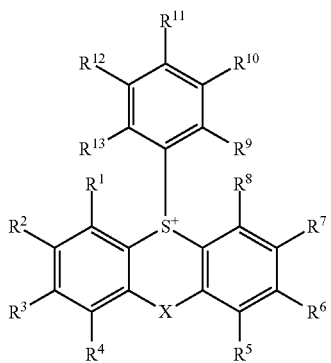

(ZI-1B)

In general formula (ZI-1B), each of $R^1$ to $R^{13}$ independently represents a hydrogen atom or a substituent, provided that at least one of $R^1$ to $R^{13}$ is a substituent containing an alcoholic hydroxyl group. In the present invention, the alcoholic hydroxyl group refers to a hydroxyl group bonded to a carbon atom of an alkyl group.

X represents a single bond or a bivalent connecting group.

When $R^1$ to $R^{13}$ represent substituents containing an alcoholic hydroxyl group, it is preferred for the $R^1$ to $R^{13}$ to represent the groups of the formula —W—Y, wherein Y represents a hydroxyl-substituted alkyl group and W represents a single bond or a bivalent connecting group.

As preferred examples of the alkyl group represented by Y, there can be mentioned an ethyl group, a propyl group and an isopropyl group. Especially preferably, Y contains the structure of —CH$_2$CH$_2$OH.

W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R^1$ to $R^{13}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R^1$ to $R^{13}$ may have two or more alcoholic hydroxyl groups. The number of alcoholic hydroxyl groups contained in each of the substituents containing an alcoholic hydroxyl group represented by $R^1$ to $R^{13}$ is in the range of 1 to 6, preferably 1 to 3 and more preferably 1.

The number of alcoholic hydroxyl groups contained in any of the compounds of the general formula (ZI-1B) as the total of those of $R^1$ to $R^{13}$ is in the range of 1 to 10, preferably 1 to 6 and more preferably 1 to 3.

When $R^1$ to $R^{13}$ do not contain any alcoholic hydroxyl group, the substituents of $R^1$ to $R^{13}$ are, for example, a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclooxy group, an acyloxy group, a carbamoyloxy group, an alkoxycarbonyloxy group, an aryloxycarbonyloxy group, an amino group (containing an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, heterocyclothio group, a sulfamoyl group, a sulfo group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocycloazo group, an imido group, a phosphino group, a phosphynyl group, a phosphynyloxy group, a phosphynylamino group, a phosphono group, a silyl group, a hydrazino group, a ureido group, a boron acid group [—B(OH)$_2$], a phosphato group [—OPO(OH)$_2$], a sulphato group [—OSO$_3$H] or other publicly known compounds.

When $R^1$ to $R^{13}$ do not contain any alcoholic hydroxyl group, each of $R^1$ to $R^{13}$ preferably represents a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^1$ to $R^{13}$ do not contain any alcoholic hydroxyl group, each of $R^1$ to $R^{13}$ more preferably represents a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^1$ to $R^{13}$ do not contain any alcoholic hydroxyl group, especially preferably, each of $R^1$ to $R^{13}$ represents a hydrogen atom, an alkyl group, a cycloalkyl group, a halogen atom or an alkoxy group.

Any two adjacent to each other of $R^1$ to $R^{13}$ may be bonded to each other to thereby form a ring structure. This ring structure includes an aromatic or nonaromatic cyclohydrocarbon or heterocycle. This cyclic structure can form a condensed cycle through further combination.

In general formula (ZI-1B), at least one of $R^1$ to $R^{13}$ preferably contains an alcoholic hydroxyl group. More preferably, at least one of $R^9$ to $R^{13}$ contains an alcoholic hydroxyl group.

X represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, an aminocarbonylamino group, an aminosulfonylamino group or the like.

The bivalent connecting group may have a substituent. As the substituents, there can be mentioned, for example, the same substituents as mentioned with respect to $R^1$ to $R^{13}$.

Preferably, X is a single bond or a group exhibiting no electron withdrawing properties, such as an alkylene group, an arylene group, an ether group, a thioether group, an amino group, —CH=CH—, an aminocarbonylamino group or an aminosulfonylamino group. More preferably, X is a single bond, an ether group or a thioether group. Most preferably, X is a single bond.

Now, cations (ZI-2) will be described.

The cations (ZI-2) are those of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group or a vinyl group. More preferred groups are a linear, branched or cyclic 2-oxoalkyl group or an alkoxycarbonylmethyl group. Especially preferred is a linear or branched 2-oxoalkyl group.

The Alkyl group represented by $R_{201}$ to $R_{203}$ may be linear, branched or cyclic. As preferred alkyl groups, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The 2-oxoalkyl group represented by $R_{201}$ to $R_{203}$ may be linear or branched. A group having $>C=O$ at the 2-position of the alkyl group is preferred.

As preferred alkoxy groups of the alkoxycarbonylmethyl group represented by $R_{201}$ to $R_{203}$, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Two of $R_{201}$ to $R_{203}$ may be bonded to each other to thereby form a ring structure. This ring structure within the ring may contain an oxygen atom, a sulfur atom, an ester bond, an amido bond and/or a carbonyl group. As the group formed by the mutual bonding of two of $R_{201}$ to $R_{203}$, there can be mentioned, for example, an alkylene group (for example, a butylene group or a pentylene group).

Now, the cations (ZI-3) will be described.

The cations (ZI-3) are those represented by general formula (ZI-3), below, which have a phenacylsulfonium salt structure.

(ZI-3)

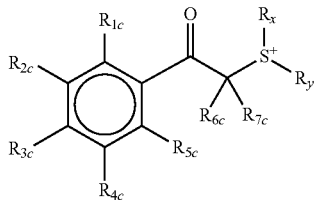

In general formula (ZI-3), each of $R_{1c}$ to $R_{5c}$ independently represents a hydrogen atom, an alkyl group, a cycloalkyl group, an alkoxy group, a phenylthio group or a halogen atom. The numbers of carbon atoms of the alkyl group and the alkoxy group are preferably 5 to 12.

Each of $R_{6c}$ and $R_{7c}$ independently represents a hydrogen atom, an alkyl group or a cycloalkyl group, a halogen atom, a cyano group or an aryl group. The number of carbon atoms of the alkyl group is preferably 1 to 6. The number of carbon atoms of the aryl group is preferably 5 to 15. As the aryl group, there can be mentioned, for example, a phenyl group or a naphthyl group.

Any two or more of $R_{1c}$ to $R_{7c}$ may be bonded to each other to thereby form a ring structure. Also, $R_x$ and $R_y$ may be bonded to each other to thereby form a ring structure. These ring structures may contain an oxygen atom, a sulfur atom, an ester bond and/or an amido bond.

In particular, when $R_{6c}$ and $R_{7c}$ are bonded to each other to thereby form a ring, the group formed by the mutual bonding of $R_{6c}$ and $R_{7c}$ is preferably an alkylene group having 2 to 10 carbon atoms.

As particular examples of the cations (ZI-3), there can be mentioned the cations of the compounds set forth by way of example in Paragraphs 0047 and 0048 of JP-A-2004-233661 and set forth by way of example in Paragraphs 0040 to 0046 of JP-A-2003-35948.

Now, general formula (ZII) will be described.

In general formula (ZII), each of $R_{204}$ and $R_{205}$ independently represents an aryl group, an alkyl group or a cycloalkyl group. Substituents may be introduced in these aryl group, alkyl group and cycloalkyl group.

Preferred examples of the aryl groups represented by $R_{204}$ and $R_{205}$ are the same as set forth above in connection with $R_{201}$ to $R_{203}$ of the compounds (ZI-1).

As preferred examples of the alkyl groups and cycloalkyl groups represented by $R_{204}$ and $R_{205}$, there can be mentioned the linear, branched or cyclic alkyl groups set forth above in connection with $R_{201}$ to $R_{203}$ of the compounds (ZI-2).

Specific examples of the compounds (A) that when exposed to actinic rays or radiation, generates any of acids of general formula (I) will be shown below, which however in no way limit the scope of the present invention.

A1-1

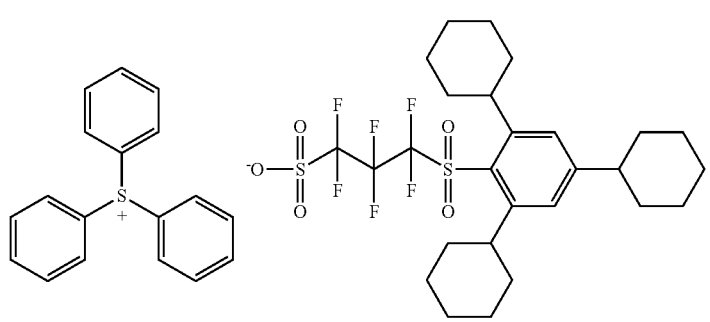

-continued
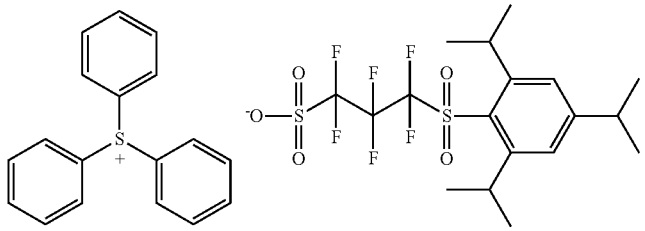
A1-2
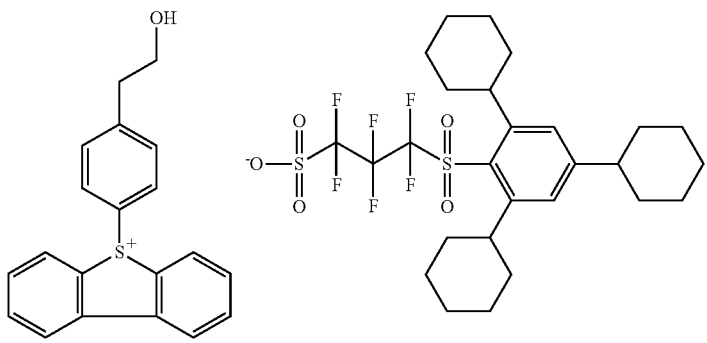
A1-3
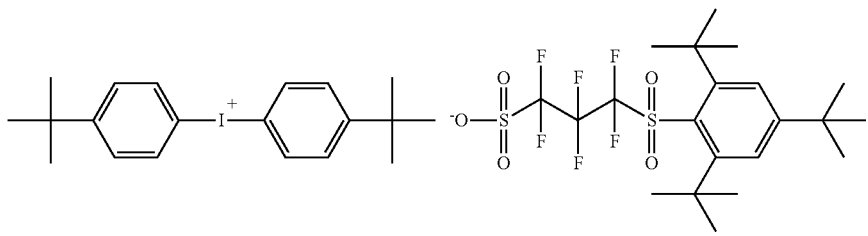
A1-4
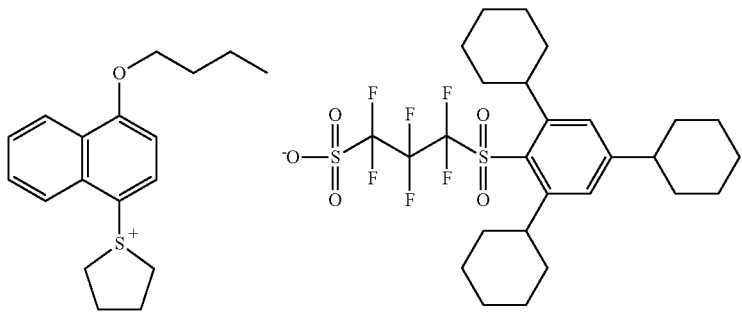
A1-5
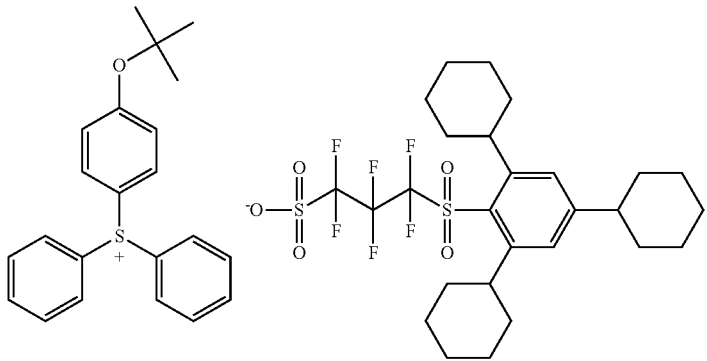
A1-6

-continued
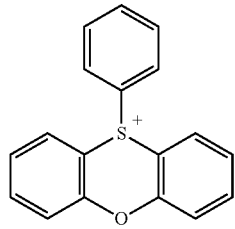 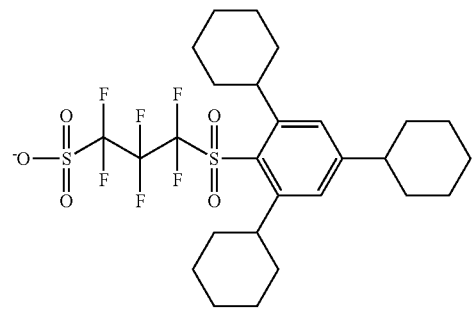
A1-7
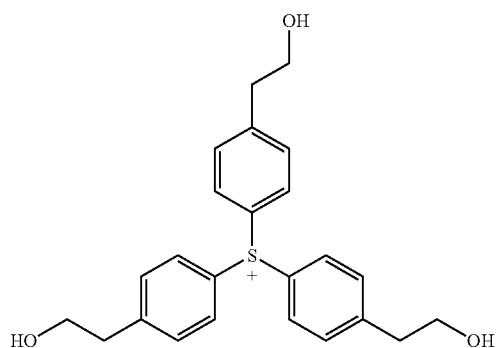 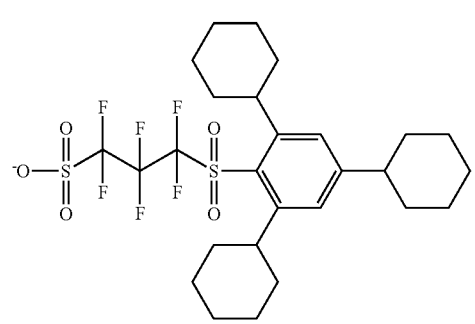
A1-8
A1-9
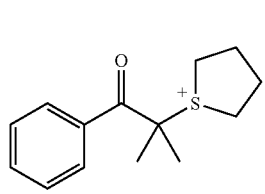 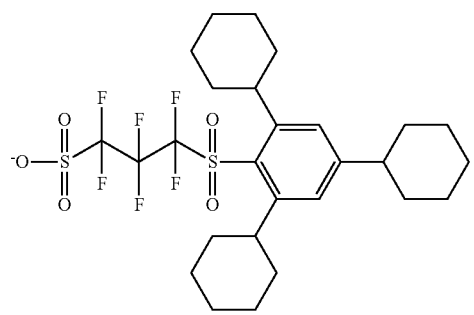
A1-10
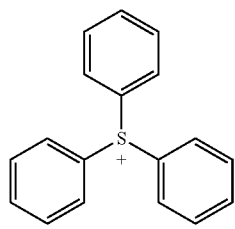 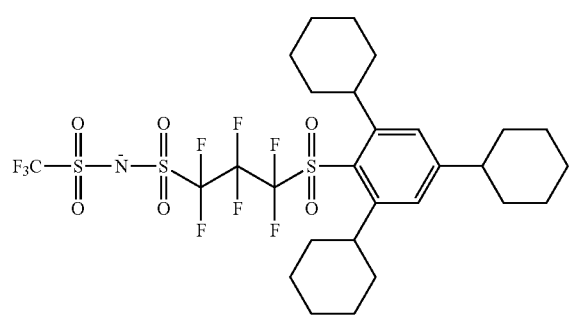
A1-11
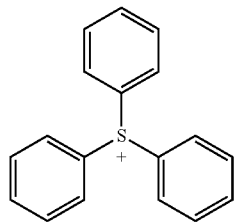 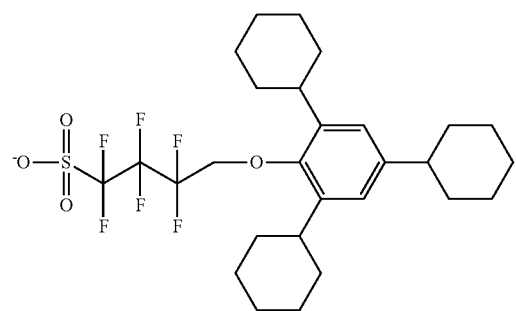

-continued
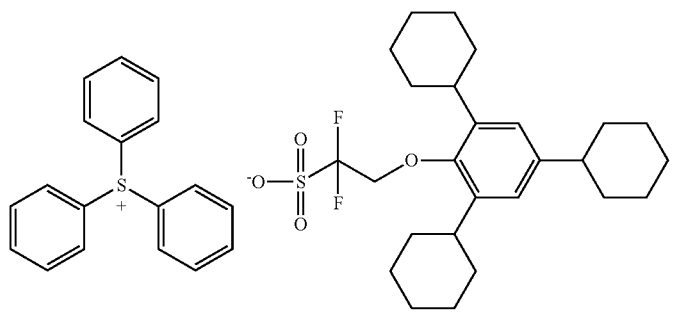
A1-12
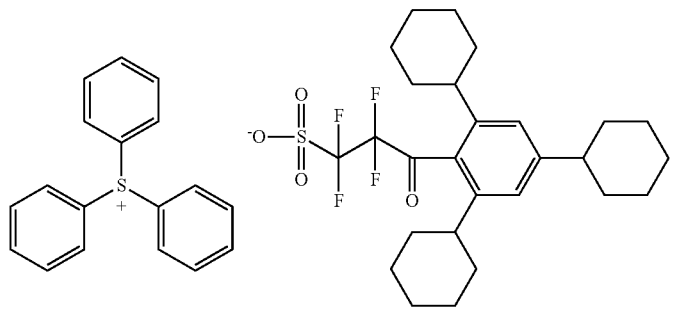
A1-13
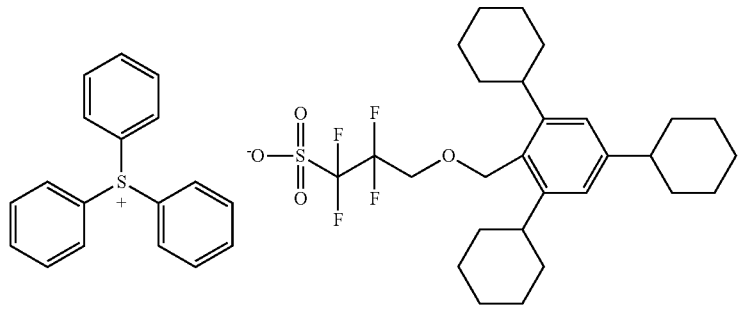
A1-14
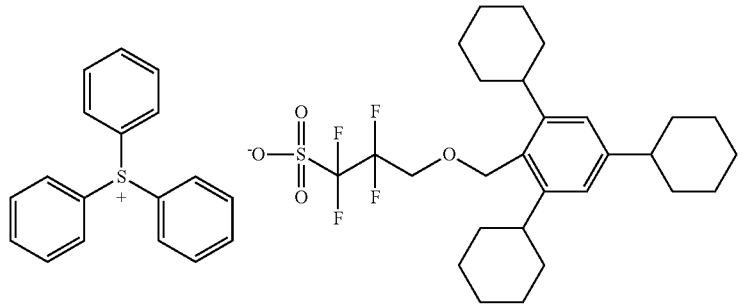
A1-15
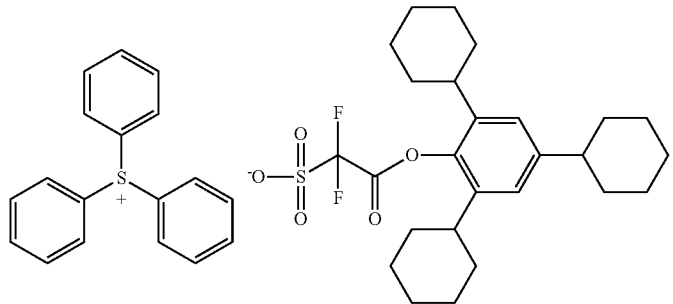
A1-16

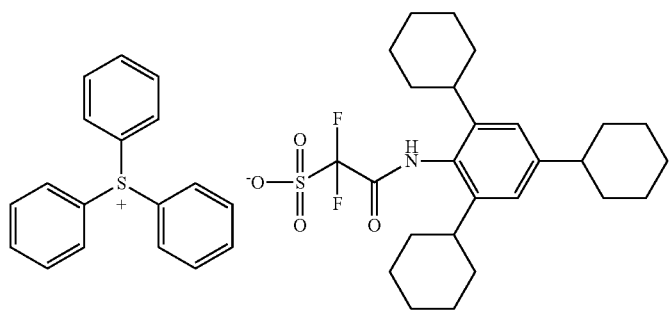
A1-17
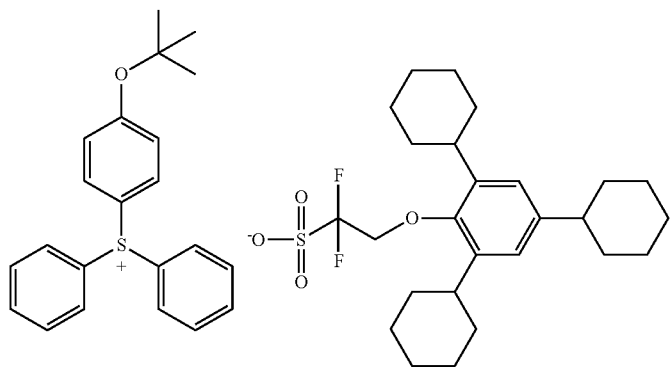
A1-18
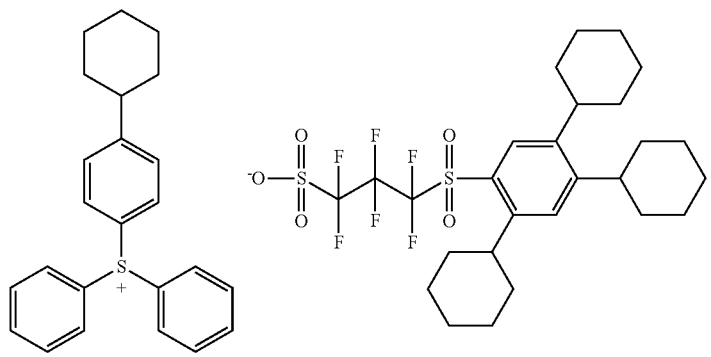
A1-19
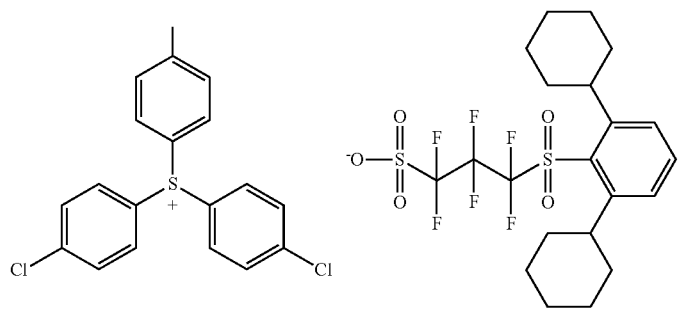
A1-20

-continued
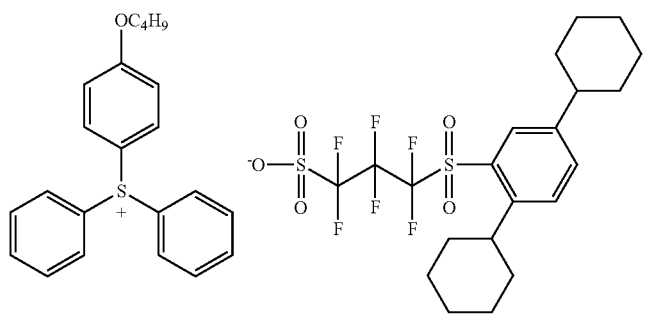
A1-21
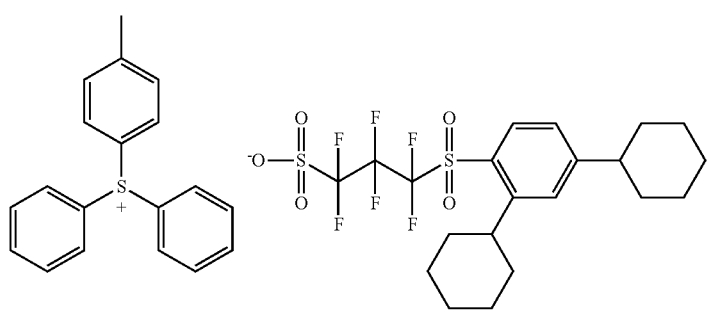
A1-22
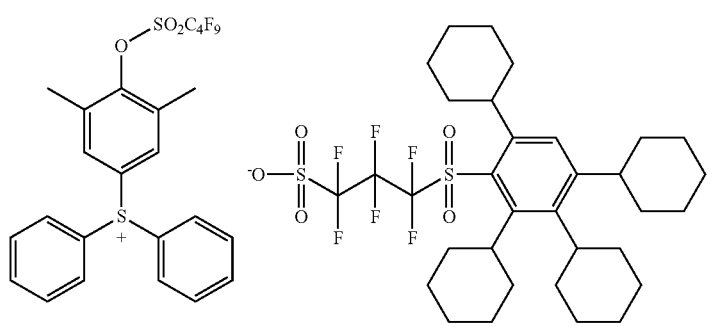
A1-23
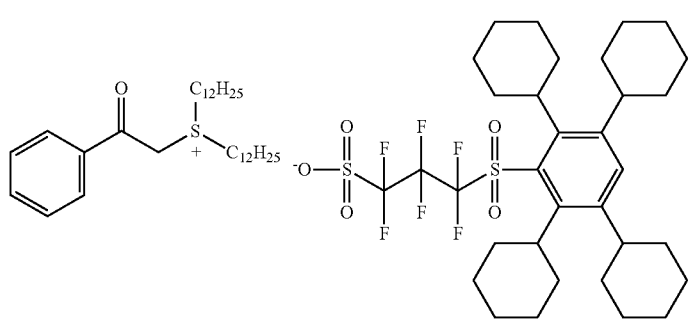
A1-24
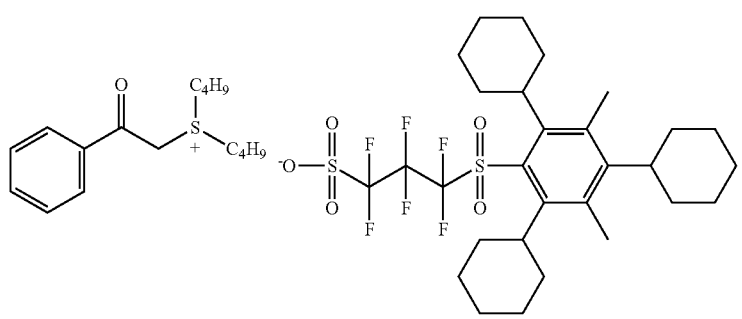
A1-25

-continued
A1-26
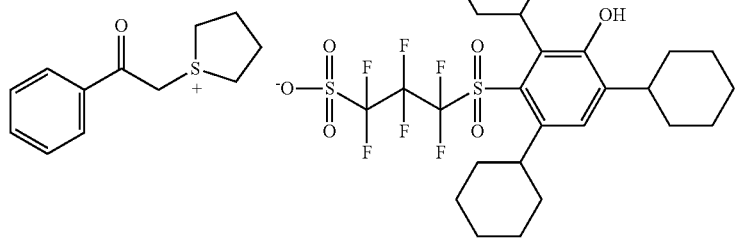
A1-27
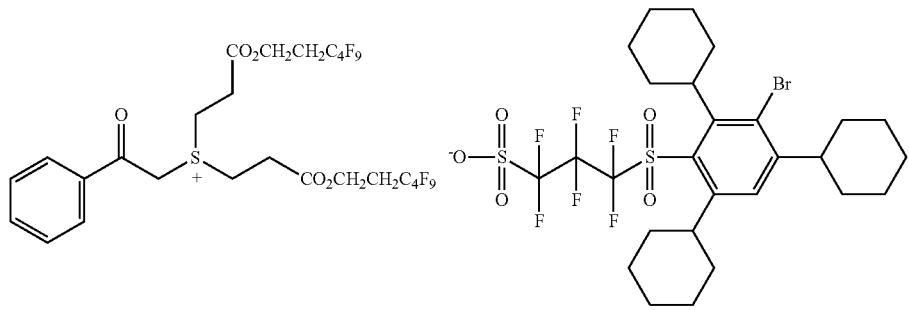
A1-28
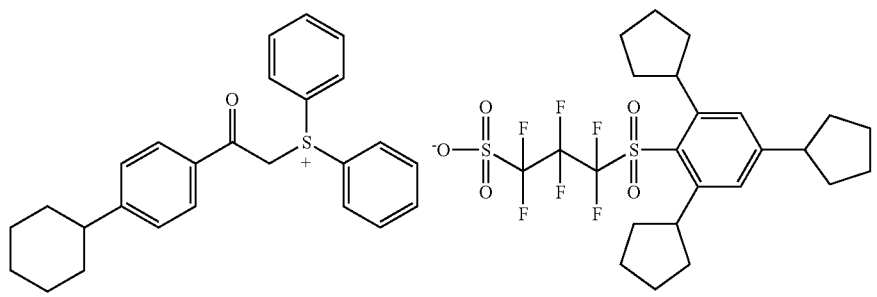
A1-29
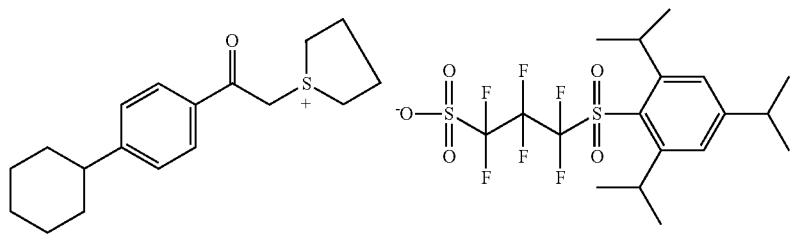
A1-30
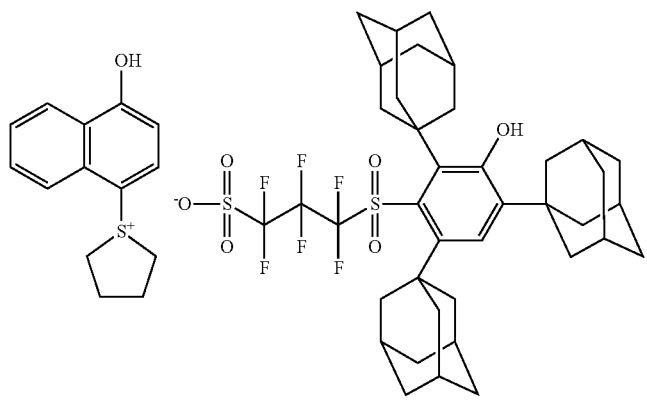

-continued
A1-31
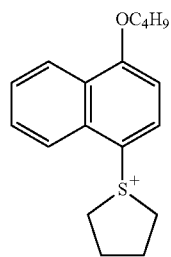 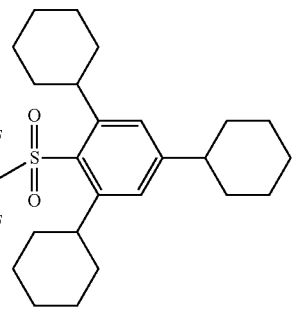
A1-32
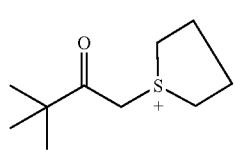 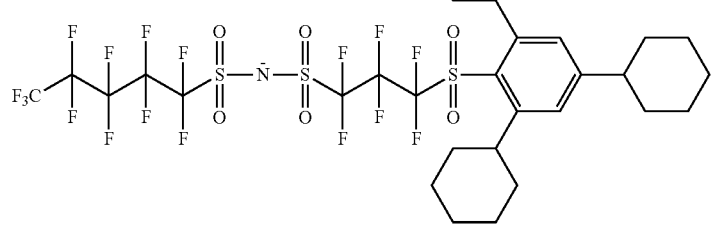
A1-33
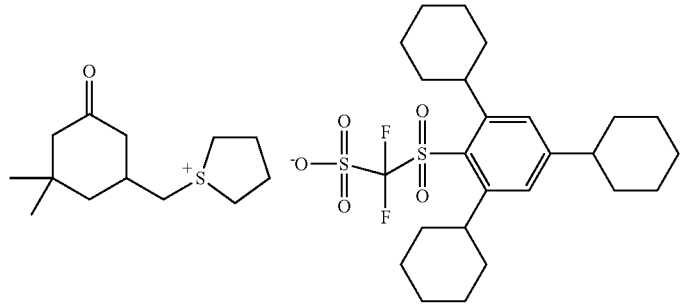
A1-34
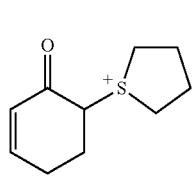 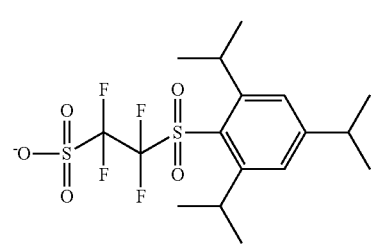

-continued
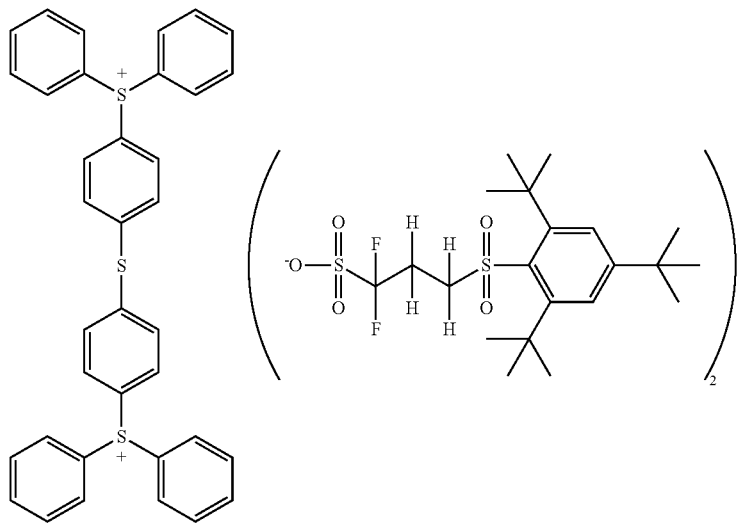
A1-35
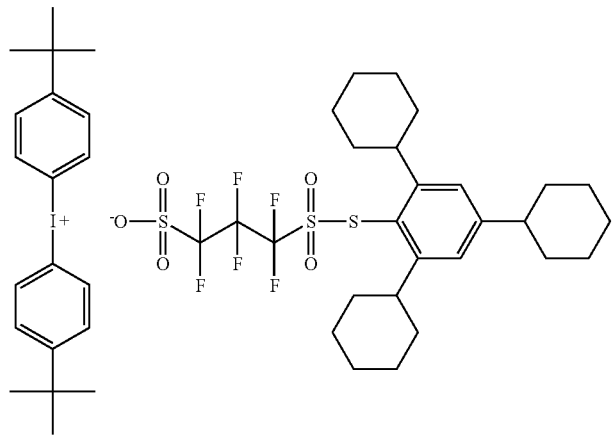
A1-36
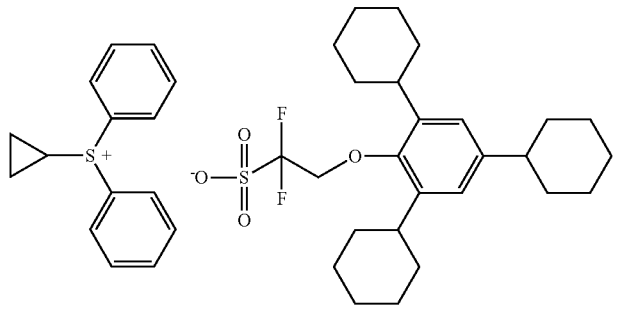
A1-37
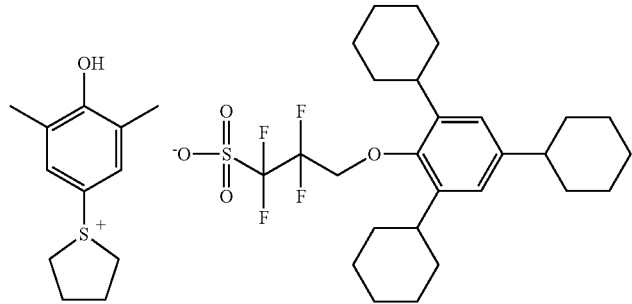
A1-38

-continued
A1-39
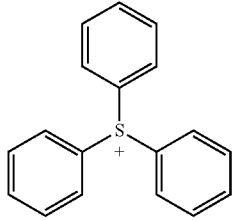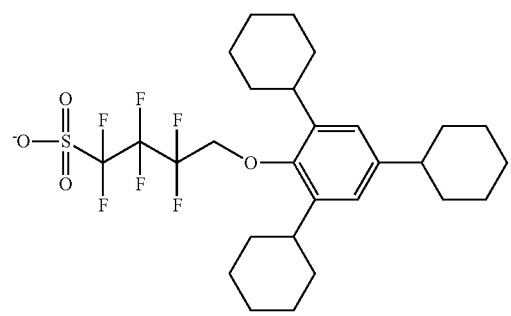
A1-40
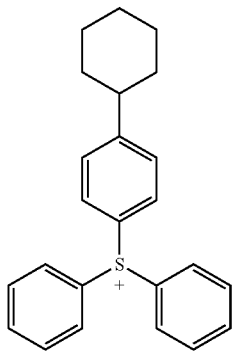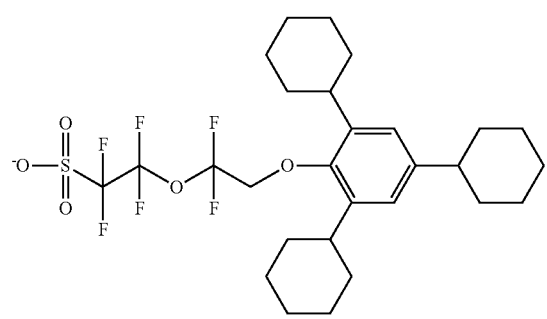
A1-41
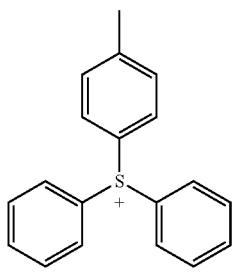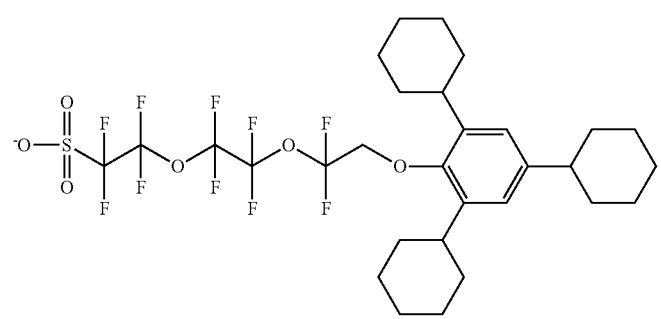
A1-42
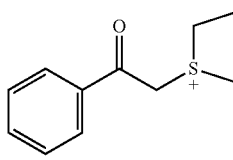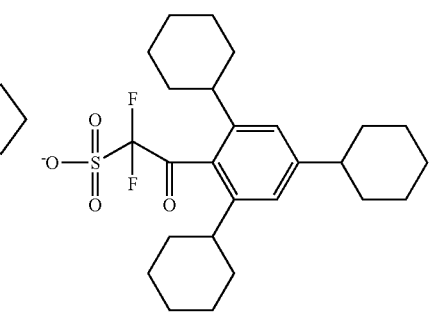
A1-43
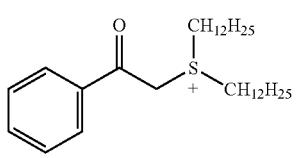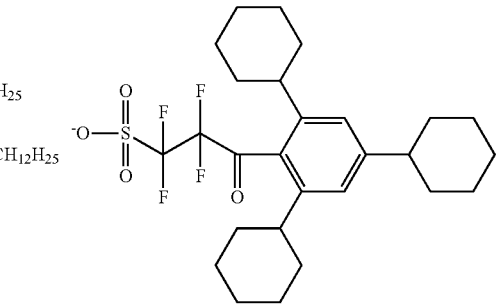

A1-44
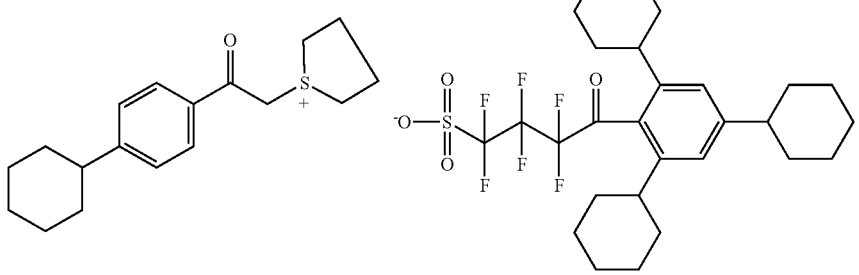
A1-45
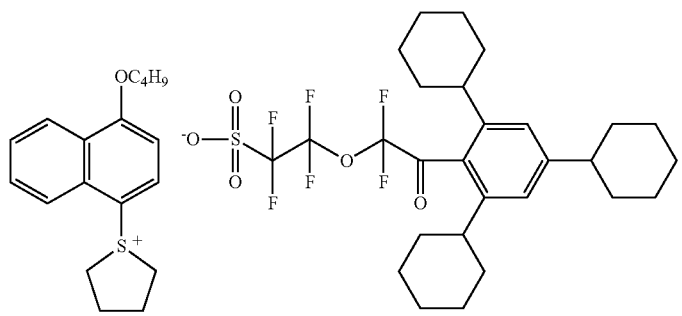
A1-46
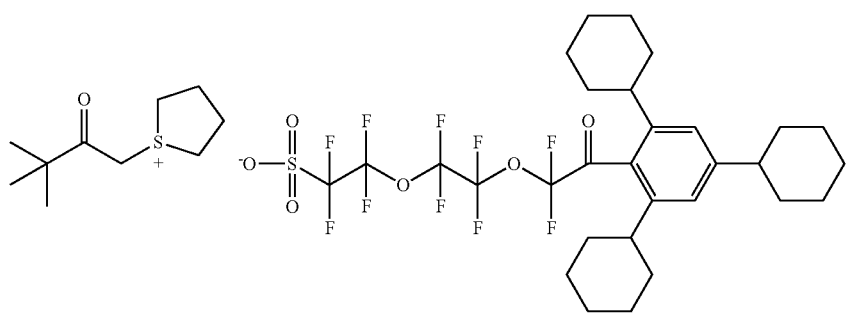
A1-47
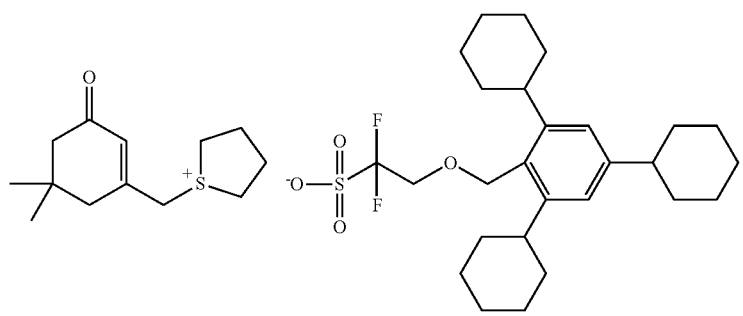
A1-48
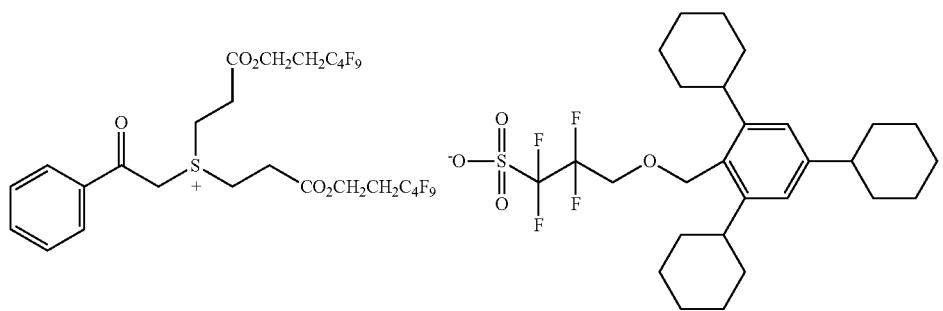

-continued
A1-49
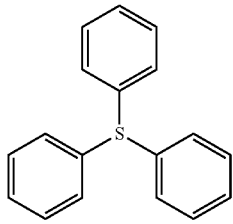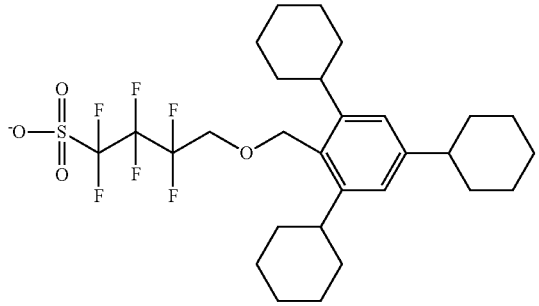
A1-50
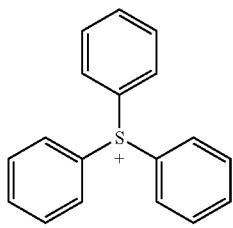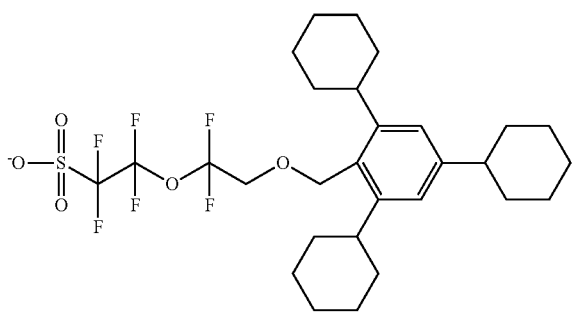
A1-51
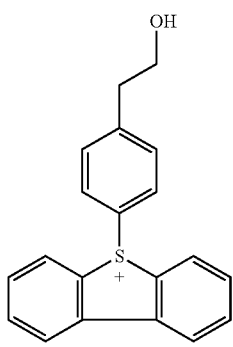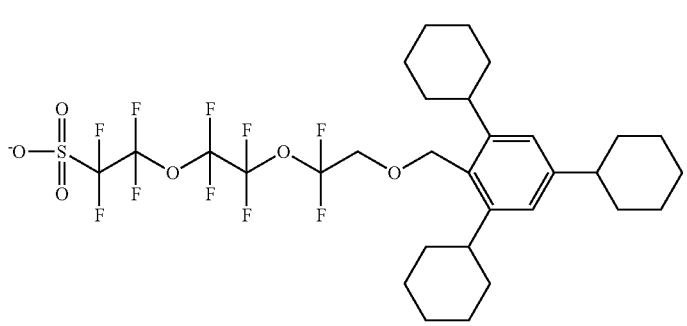
A1-52
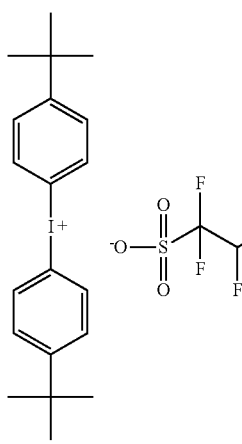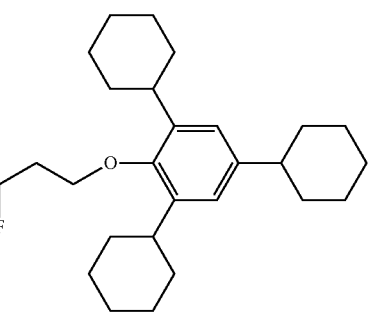

-continued
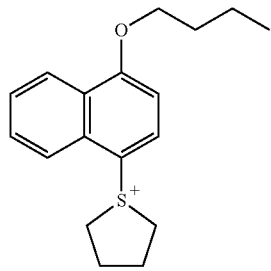 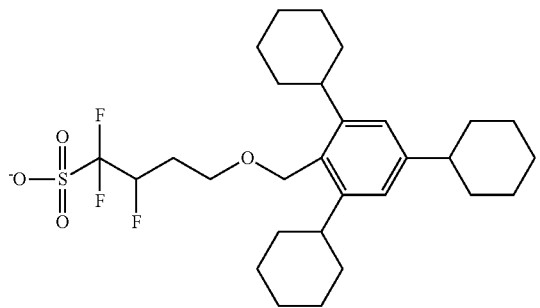
A1-53
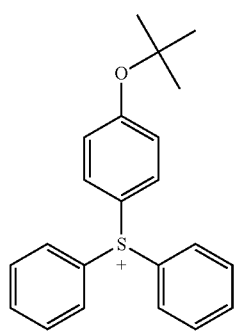 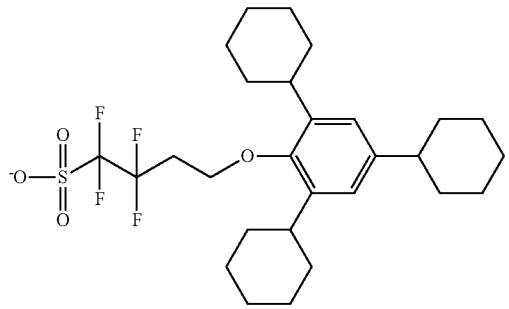
A1-54
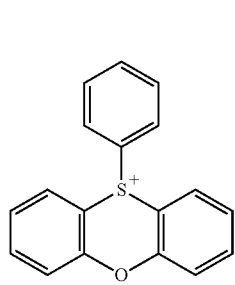 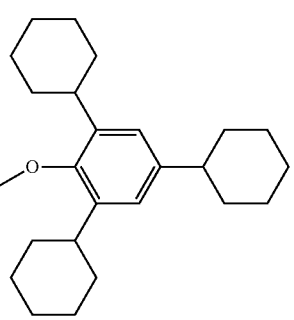
A1-55
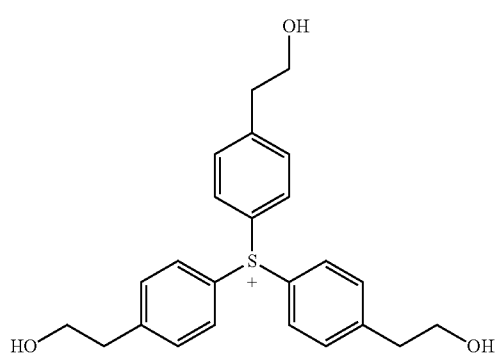 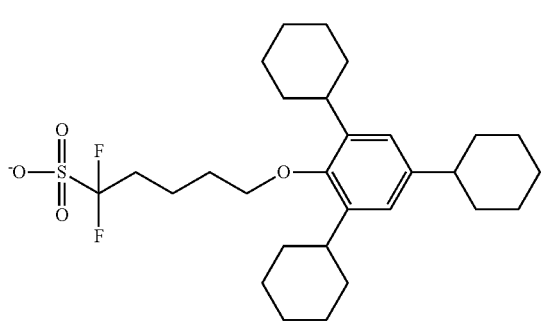
A1-56
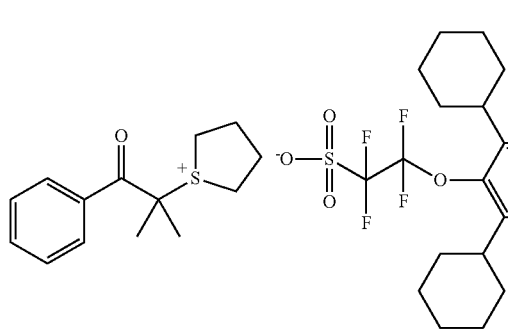 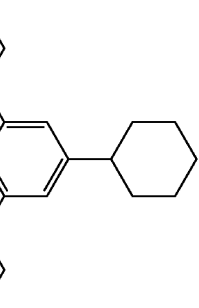
A1-57

-continued
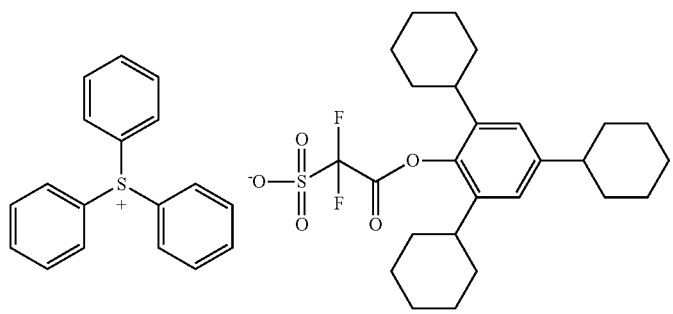
A1-58
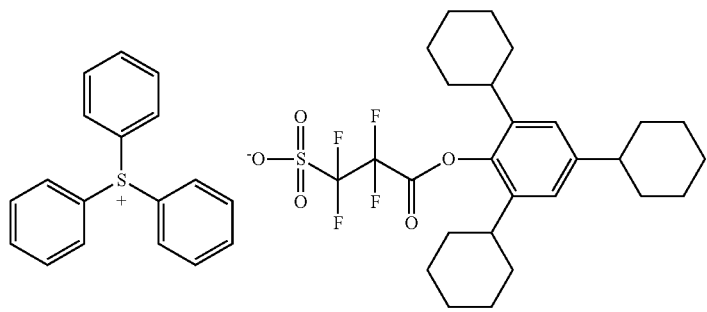
A1-59
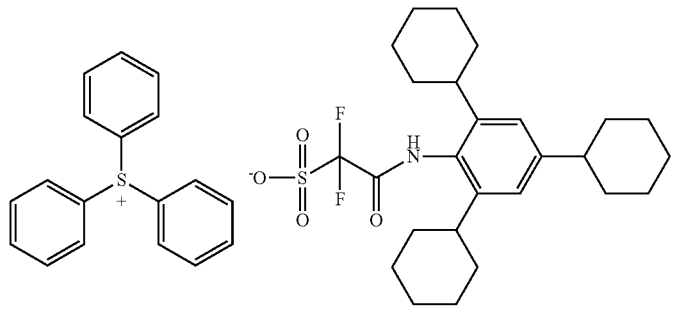
A1-60
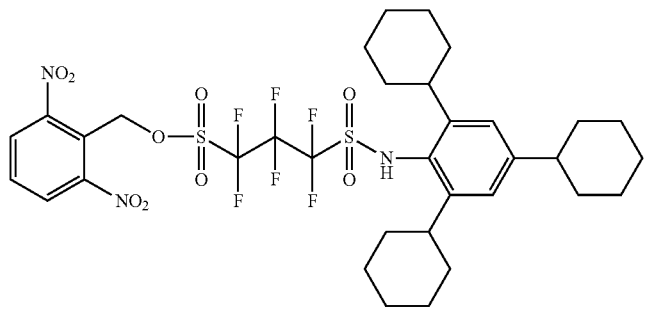
A1-61
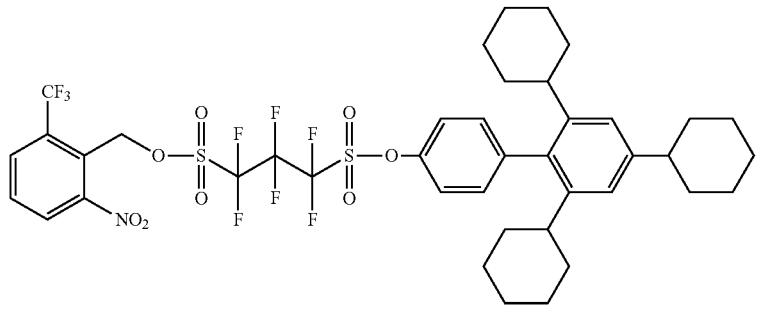
A1-62

A1-63
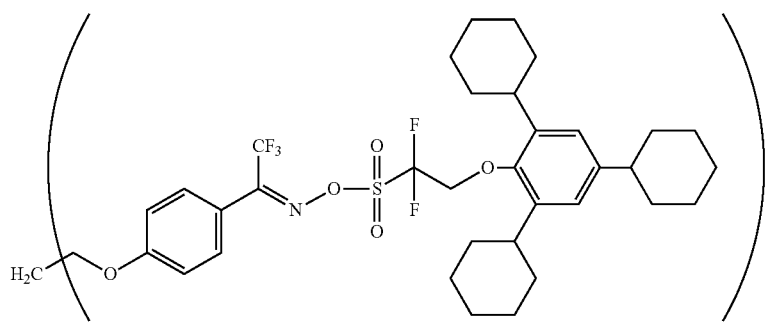
A1-64
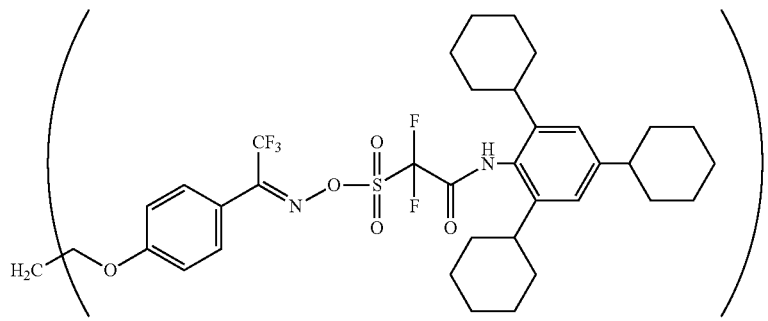
A1-65
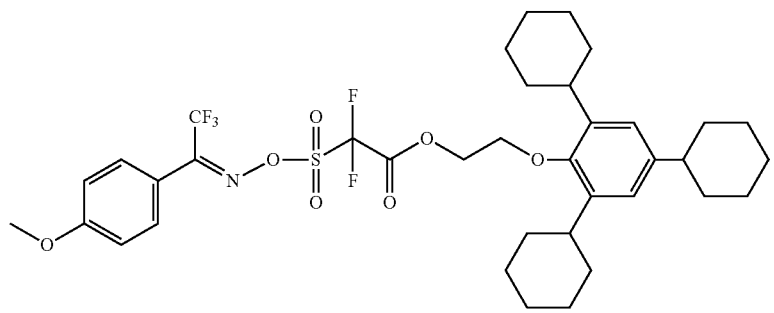
A1-66
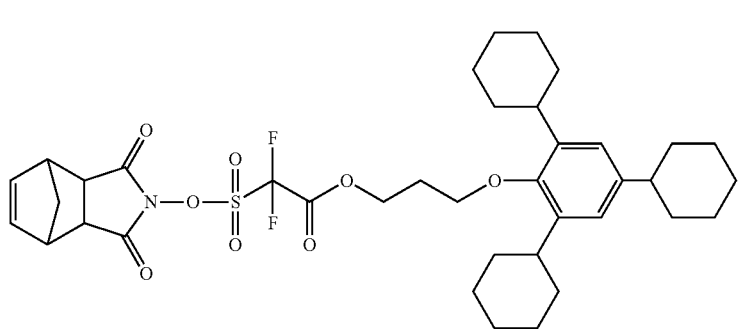
A1-67
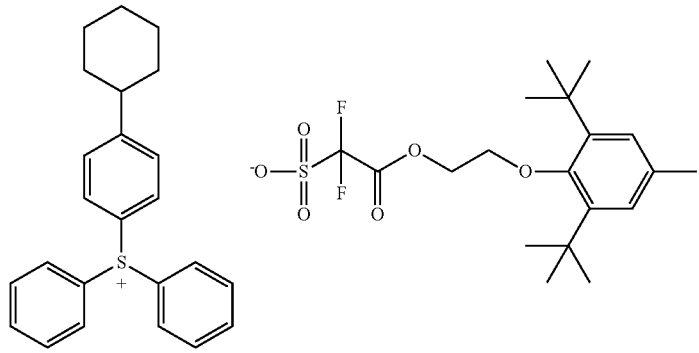

A1-68
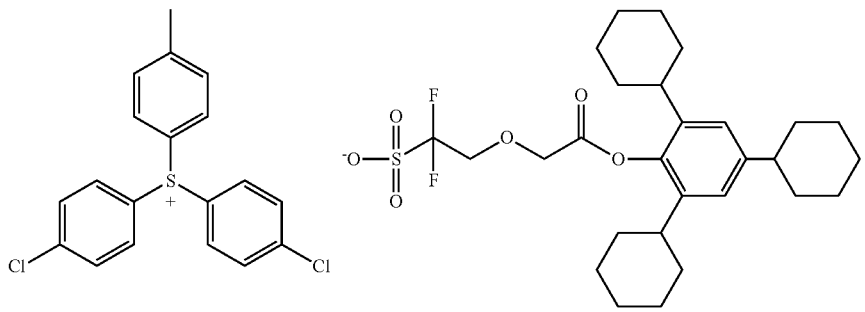
A1-69
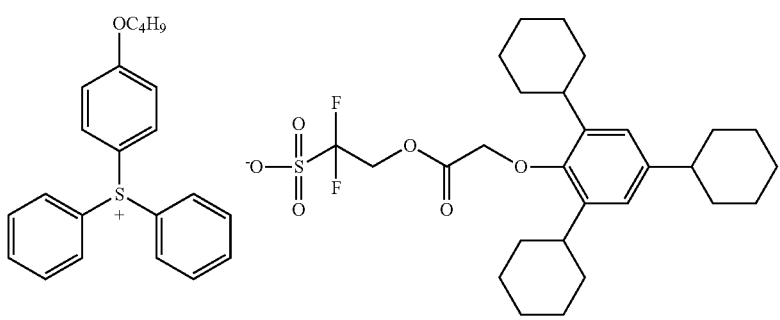
A1-70
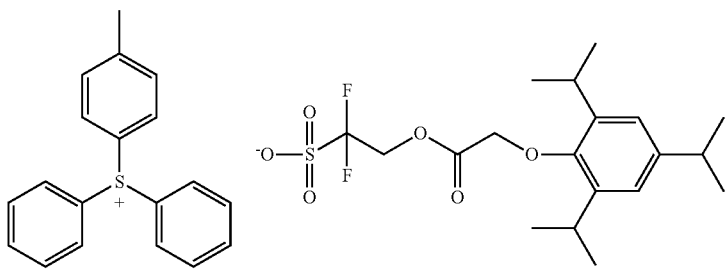
A1-71
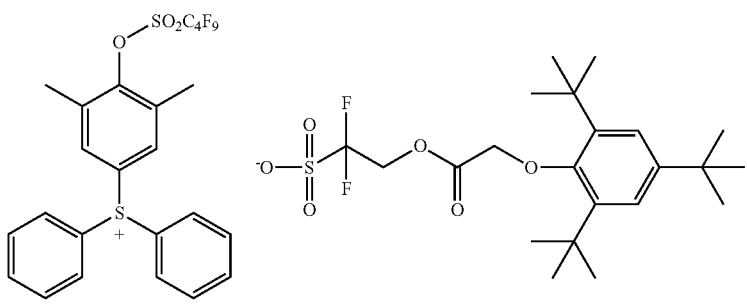
A1-72
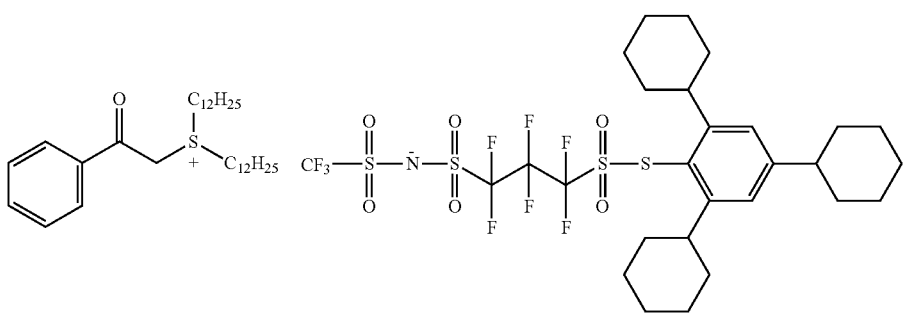

-continued
A1-73
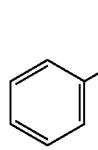 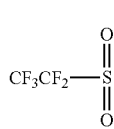 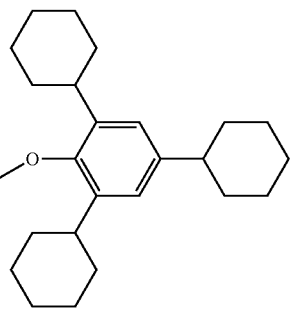
A1-74
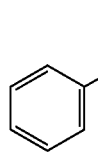 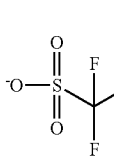 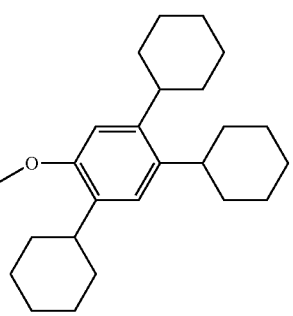
A1-75
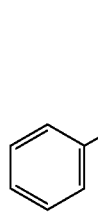 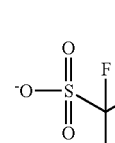 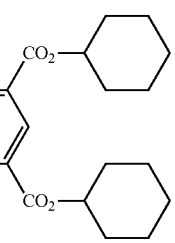
A1-76
 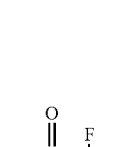 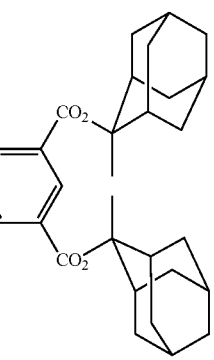
A1-77
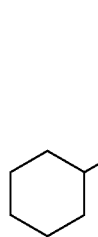 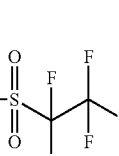 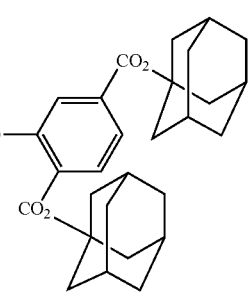

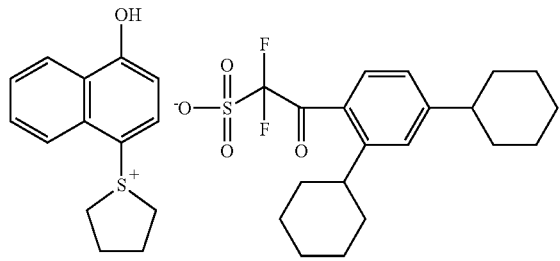
A1-78
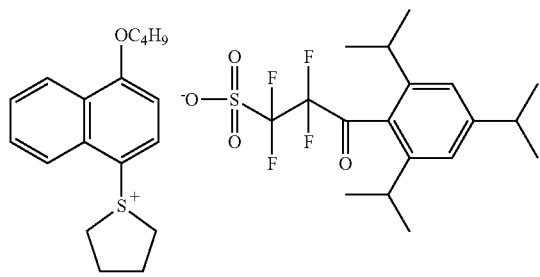
A1-79
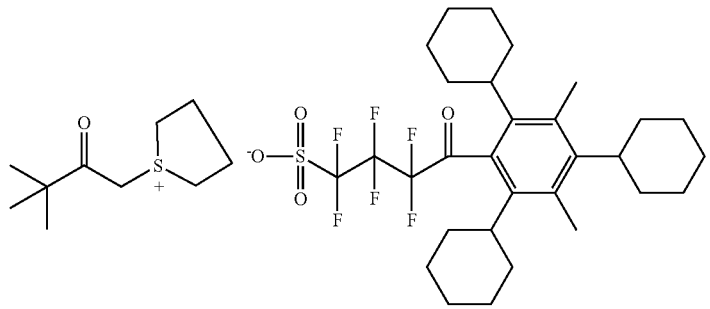
A1-80
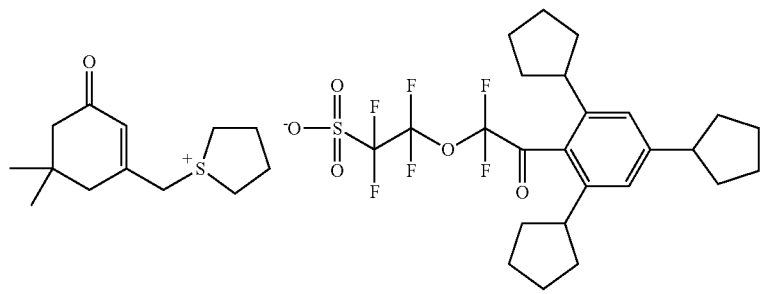
A1-81
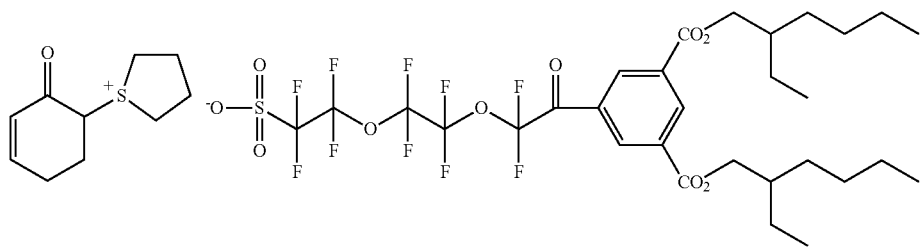
A1-82

A1-83
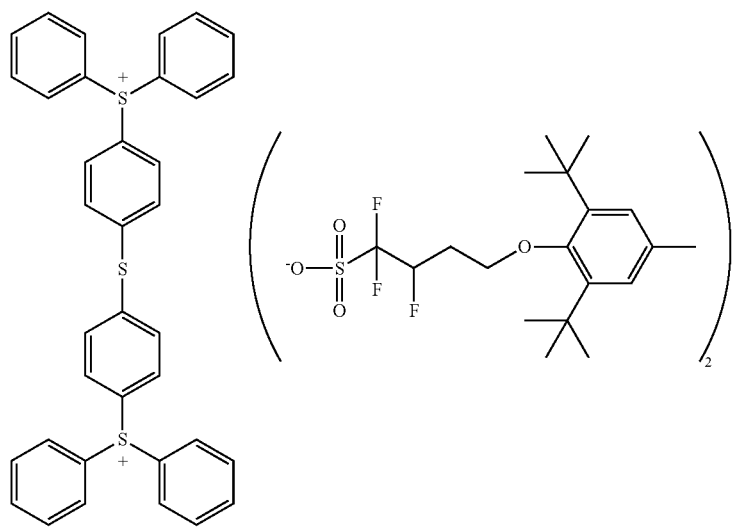
A1-84
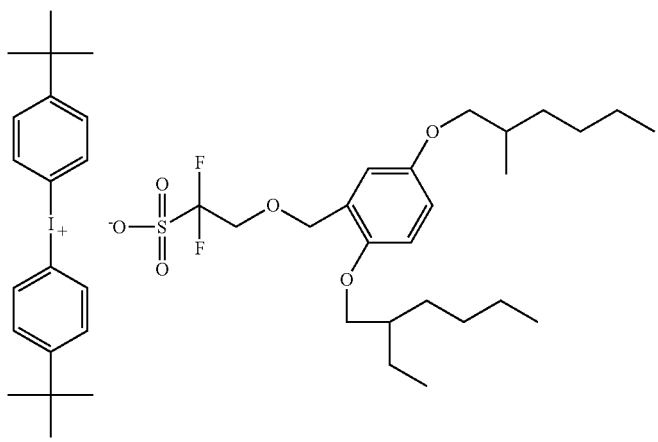
A1-85
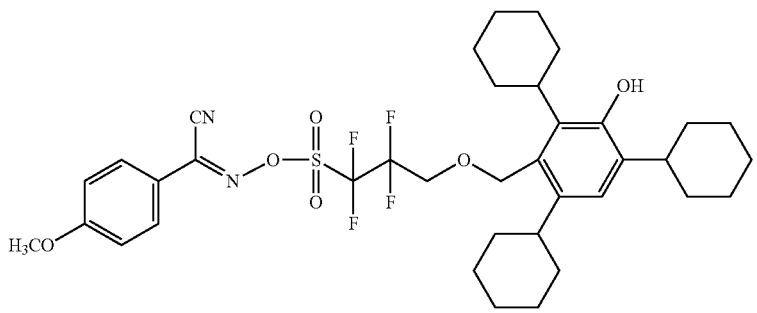
A1-86
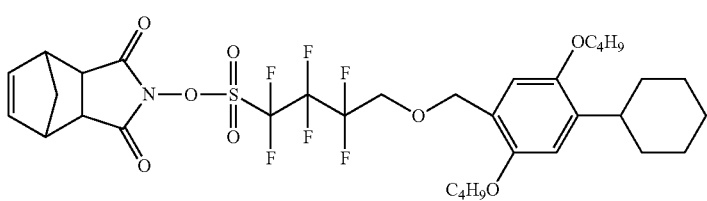

-continued
A1-87
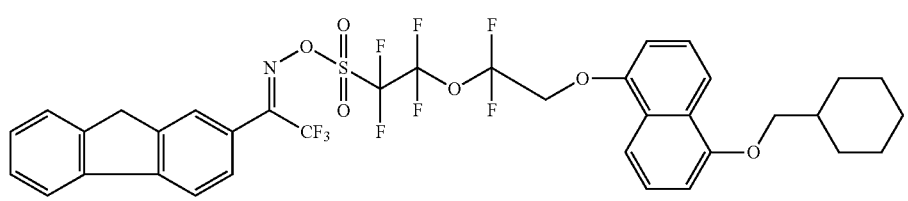
A1-88
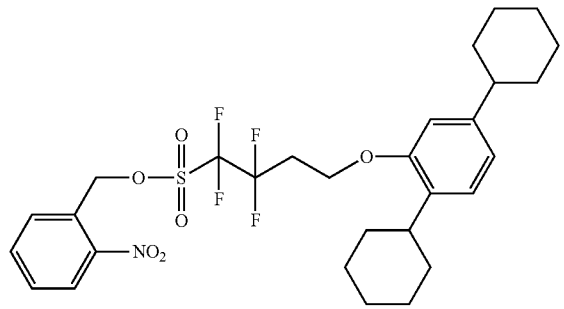
A1-89
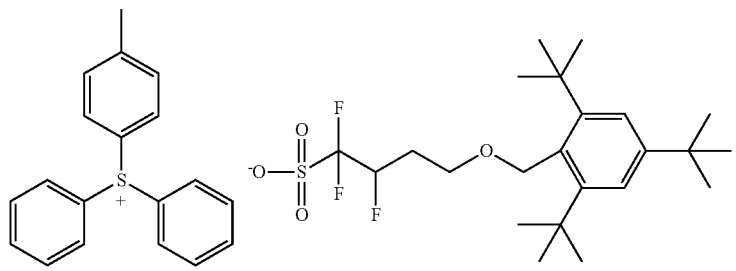
A1-90
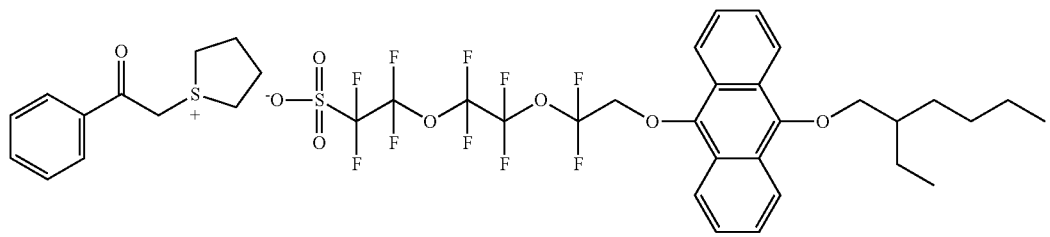
A1-91
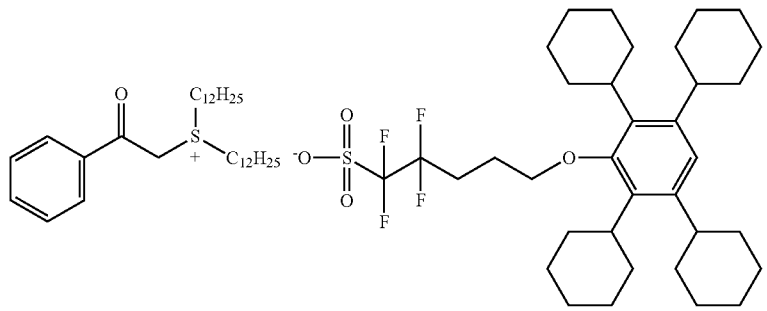
A1-92
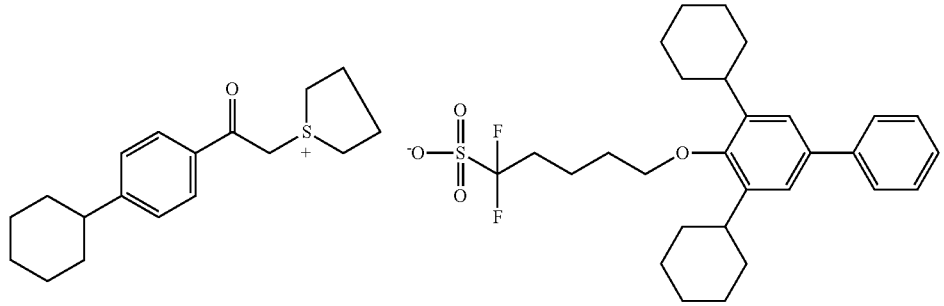

-continued
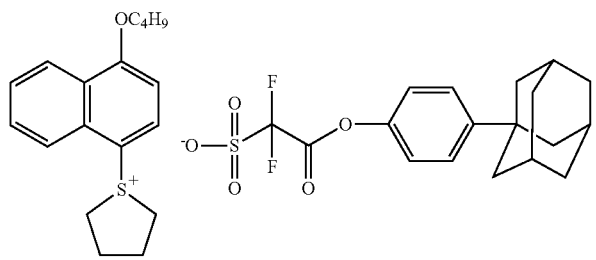
A1-93
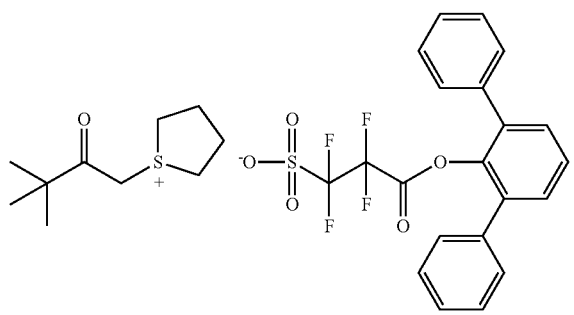
A1-94
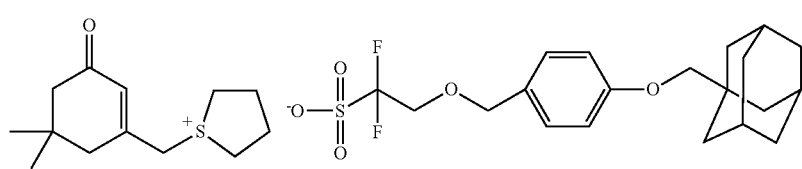
A1-95
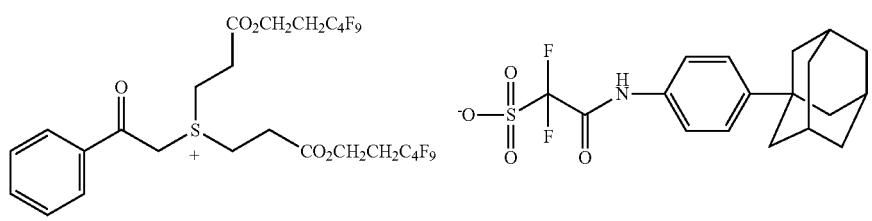
A1-96
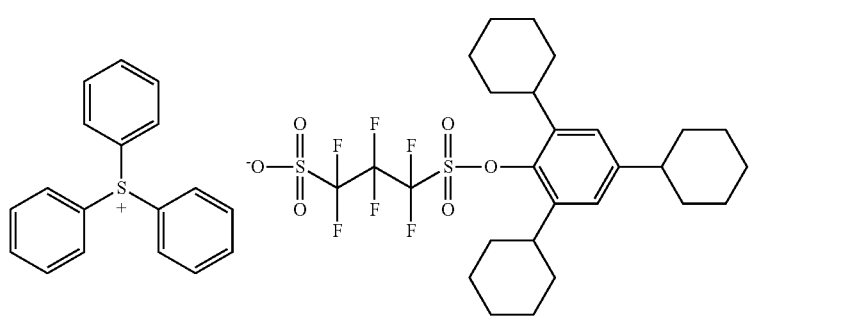
A1-97
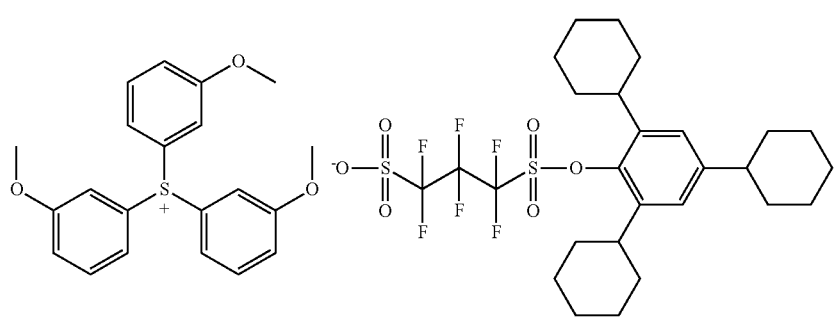
A1-98

-continued
A1-99
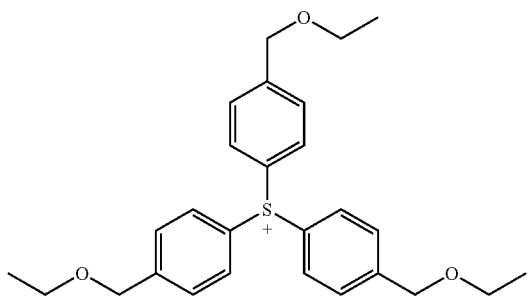 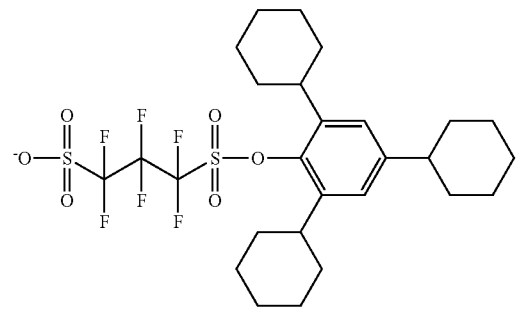
A1-100
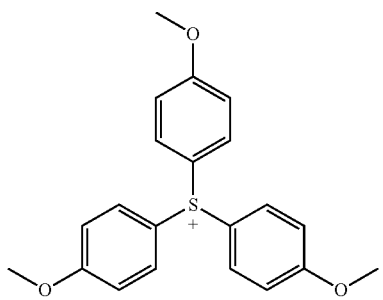 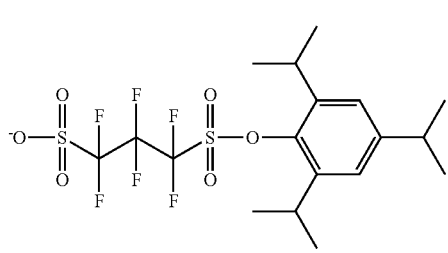
A1-101
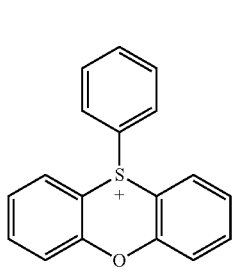 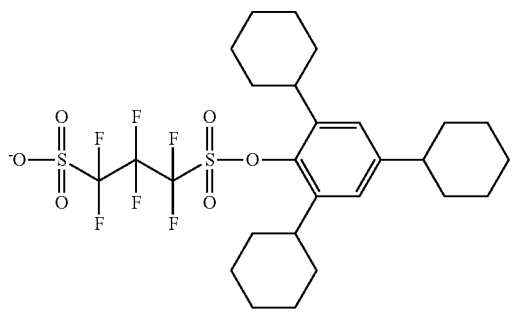
A1-102
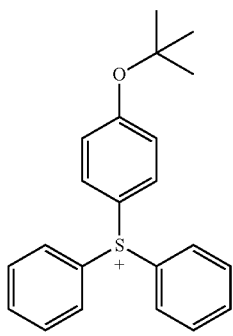 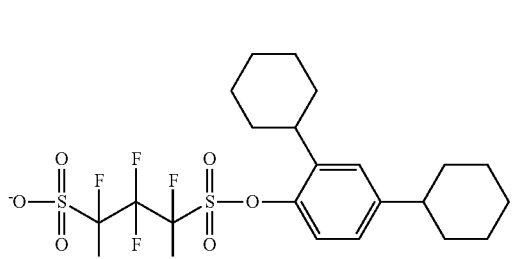
A1-103
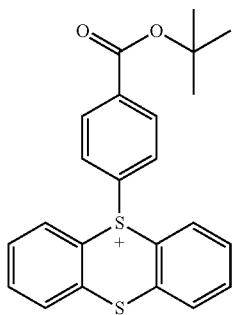 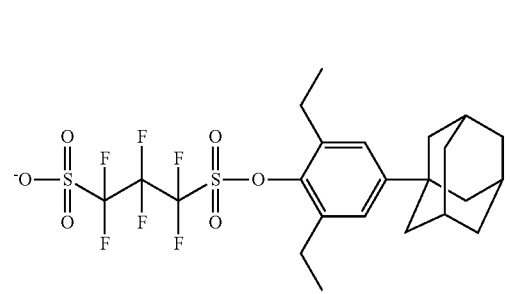

-continued
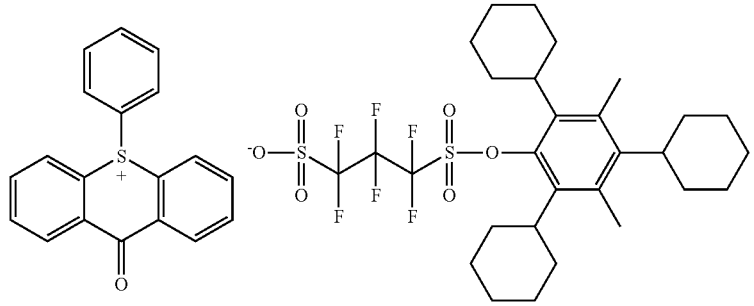
A1-104
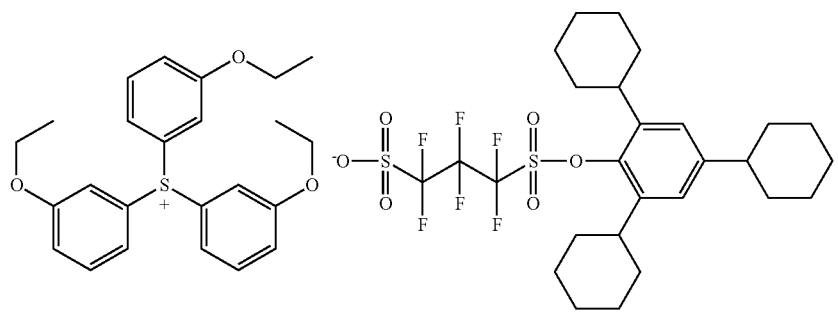
A1-105
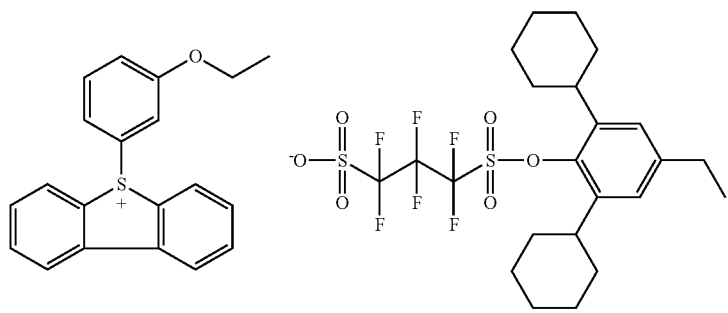
A1-106
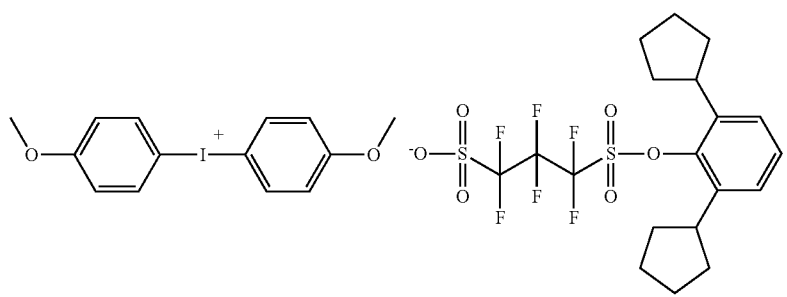
A1-107
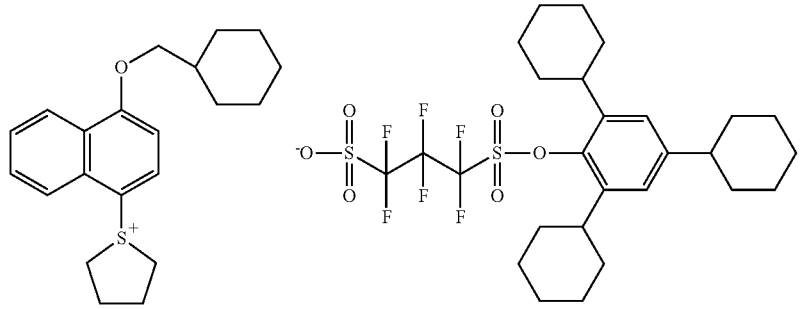
A1-108

-continued
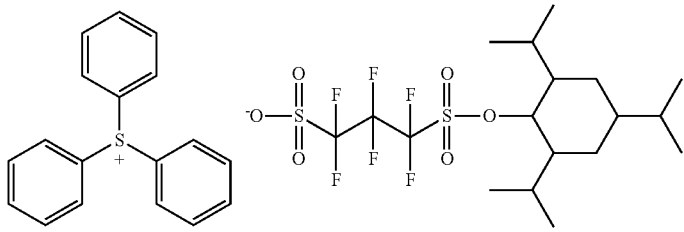
A1-109
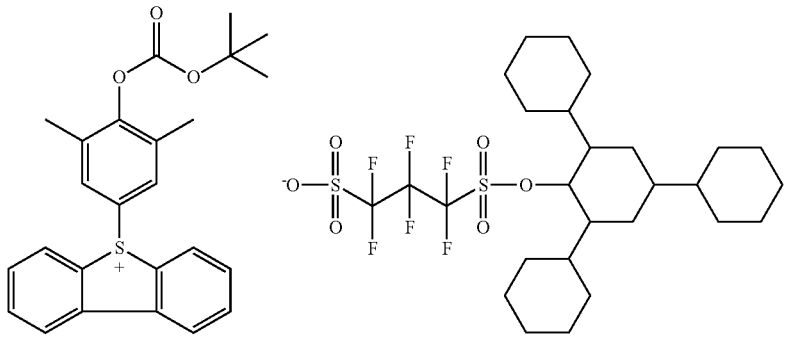
A1-110
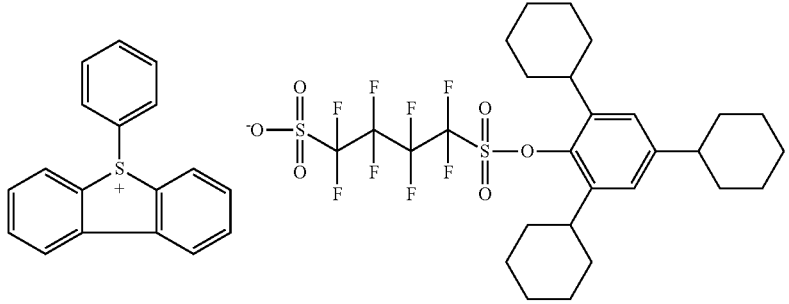
A1-111
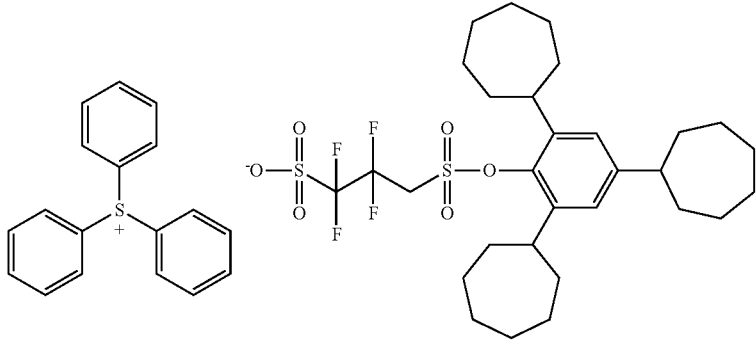
A1-112
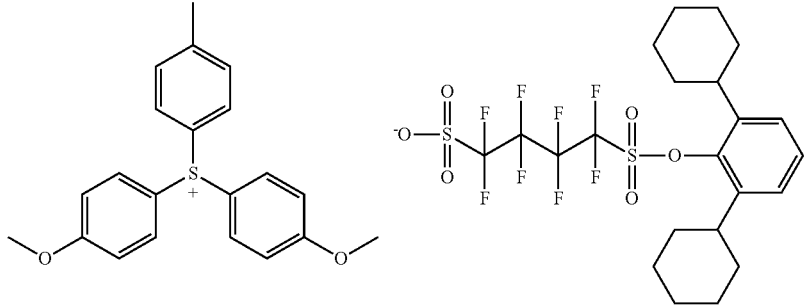
A1-113

-continued
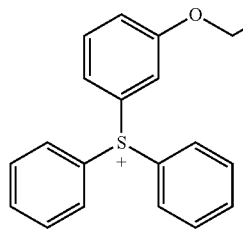 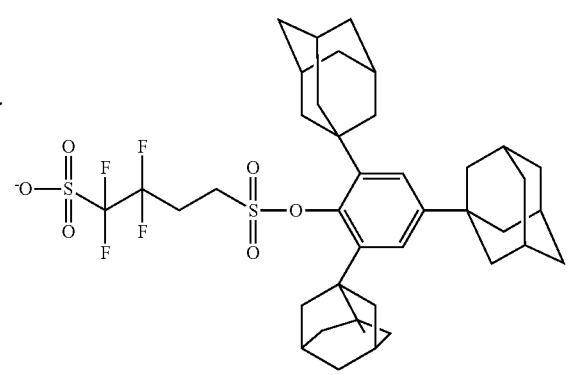
A1-114
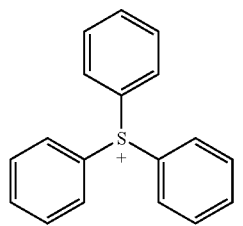 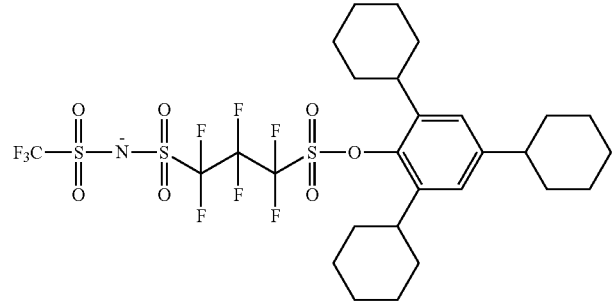
A1-115
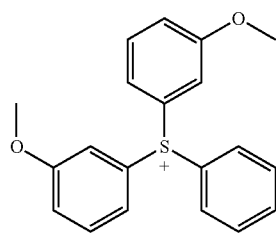 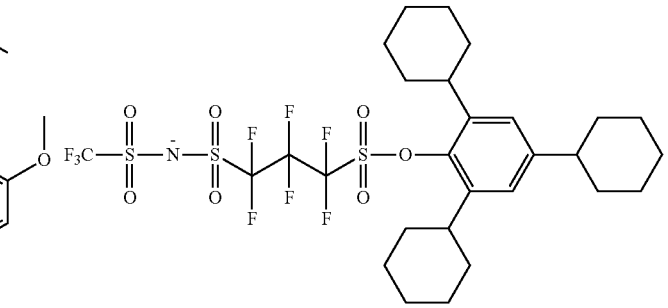
A1-116
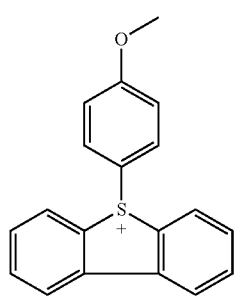 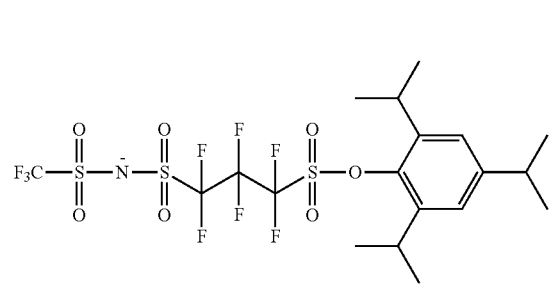
A1-117
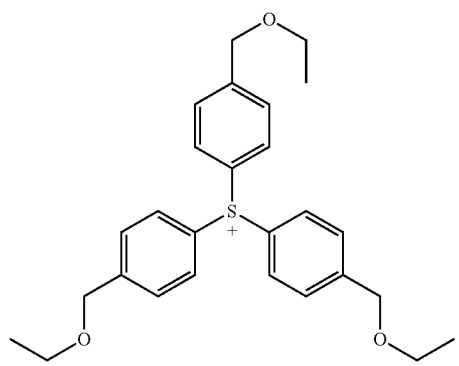 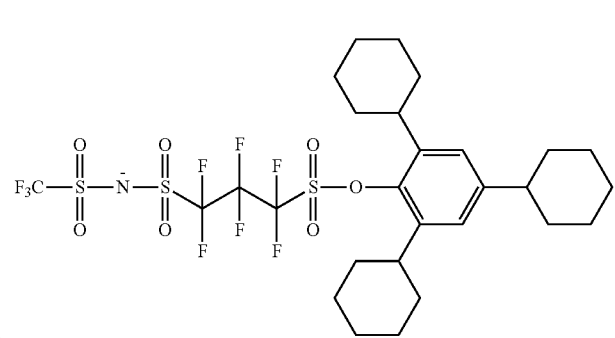
A1-118

A1-119

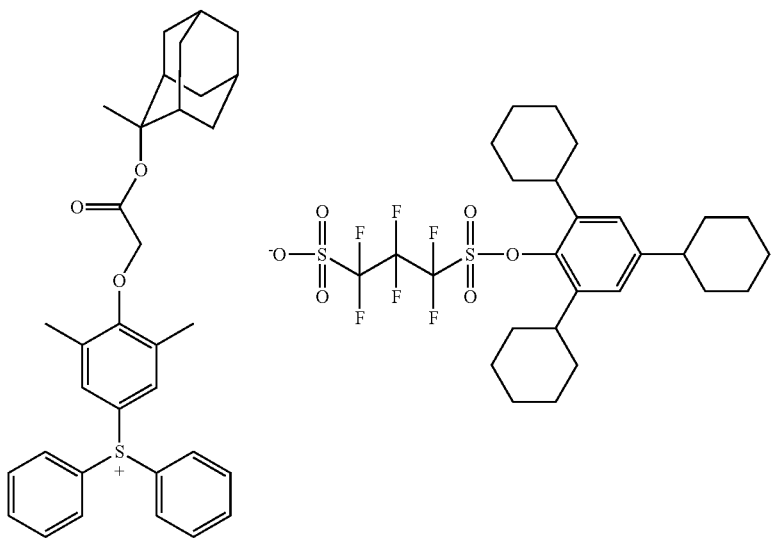

A1-120

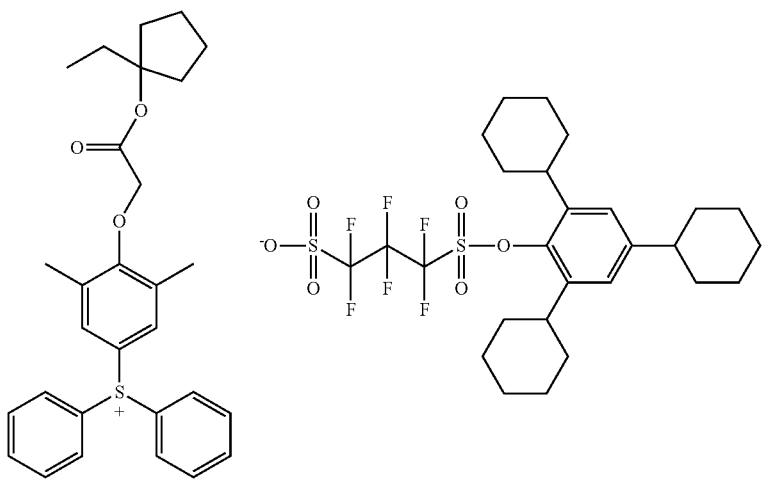

A1-121

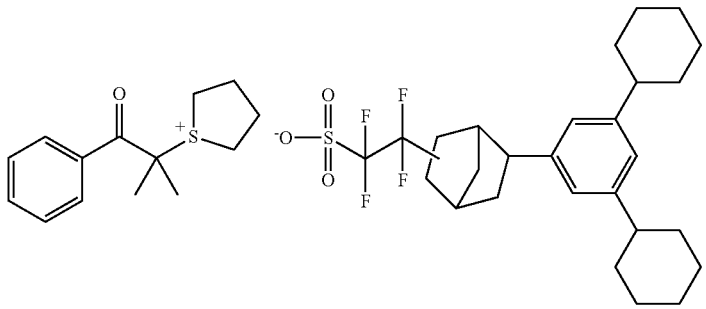

In the present invention, the acid generators (AI) may be used either individually or in combination.

The content of the acid generators (AI) based on the total solids of the composition of the present invention is preferably in the range of 0.1 to 50 mass %, more preferably 1 to 30 mass %.

[Other Acid Generation]

In the present invention, another acid generator may be used in combination with any of the acid generators (AI). As the other acid generators for use in combination with any of the acid generators (AI), use can be made of a member appropriately selected from among a photoinitiator for photocationic polymerization, a photoinitiator for photoradical polymerization, a photo-achromatic agent and photo-discoloring agent for dyes, any of publicly known compounds that when exposed to actinic rays or radiation, generate an acid, employed in microresists, etc., and mixtures thereof. For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

[2] Resin that is Decomposed by the Action of an Acid to Thereby Exhibit an Increased Solubility in an Alkali Developer The positive actinic-ray- or radiation-sensitive resin composition of the present invention may include a resin (B) that is decomposed by the action of an acid to thereby exhibit an increased solubility in an alkali developer. The resin (B) usually contain, in its principal chain or side chain or both thereof, a group (hereinafter also referred to as "acid-decomposable group") that is decomposed by the action of an acid to thereby generate an alkali-soluble group. Among them, a resin containing an acid-decomposable group in its side chain is preferred.

The acid-decomposable group is preferably a group resulting from substitution of the hydrogen atom of an alkali-soluble group, such as a —COOH group or an —OH group, with an acid-eliminable group. The acid-eliminable group is preferably an acetal group or a tertiary ester group.

The matrix resin to which the above groups decomposable by the action of an acid are bonded as side chains refers to an alkali-soluble resin having an —OH or —COOH group in its side chain. For example, there can be mentioned the alkali-soluble resins to be described hereinafter.

The alkali dissolution rate of the alkali-soluble resins as measured in a 0.261 N tetramethylammonium hydroxide (TMAH) (23° C.) is preferably 17 nm/sec or greater. The alkali dissolution rate is especially preferably 33 nm/sec or greater.

The alkali-soluble resins especially preferred from this viewpoint include resins containing hydroxystyrene structural units, such as o-, m- or p-poly(hydroxystyrene) and copolymers thereof, hydrogenated poly(hydroxystyrene), halogenated or alkylated poly(hydroxystyrene), poly(hydroxystyrene) having its part O-alkylated or O-acylated, styrene-hydroxystyrene copolymer, α-methylstyrene-hydroxystyrene copolymer and hydrogenated novolak resin, and also include resins containing carboxylated repeating units, such as those of (meth)acrylic acid and norbornenecarboxylic acid.

As the repeating units containing preferred acid-decomposable groups, there can be mentioned, for example, those of t-butoxycarbonyloxystyrene, a 1-alkoxyethoxystyrene and a (meth)acrylic acid tertiary alkyl ester. Repeating units of a 2-alkyl-2-adamantyl (meth)acrylate and a dialkyl(1-adamantyl)methyl (meth)acrylate are more preferred.

The resin that when acted on by an acid, is decomposed to thereby increase its solubility in an alkali developer can be obtained by, for example, reaction of a precursor of a group cleavable under the action of an acid with a resin, or by copolymerization of an alkali-soluble resin monomer having a group cleavable under the action of an acid bonded thereto with various monomers, as disclosed in, for example, European Patent No. 254853 and JP-A's H2-25850, H3-223860 and H4-251259.

In the event of exposing the actinic-ray- or radiation-sensitive resin composition of the present invention to KrF excimer laser beams, electron beams, X-rays or high-energy light rays of wavelength 50 nm or less (EUV, etc.), it is preferred for the resin to have hydroxystyrene repeating units. More preferably, the resin is a copolymer of hydroxystyrene/hydroxystyrene protected by an acid-eliminable group or hydroxystyrene/(meth)acrylic acid tert-alkyl ester.

As such, there can be mentioned a repeating units of general formula (A), below.

In the formula, each of $R_{01}$, $R_{02}$ and $R_{03}$ independently represents, for example, a hydrogen atom, an alkyl group, a cycloalkyl group, a halogen atom, a cyano group or an alkoxycarbonyl group. $Ar_1$ represents, for example, an aromatic ring group. In other forms, $R_{03}$ and $Ar_1$ may be simultaneously alkylene groups and bonded to each other so as to form a 5-membered or 6-membered ring in cooperation with the —C—C— chain.

Each of n Ys independently represents a hydrogen atom or a group that is cleaved by the action of an acid, provided that at least one of n Ys is a group that is cleaved by the action of an acid.

In the formula, n is an integer of 1 to 4. n is preferably 1 or 2, more preferably 1.

The alkyl group represented by each of $R_{01}$ to $R_{03}$ is preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. These alkyl groups may have a substituent.

The alkyl group contained in the alkoxycarbonyl group is preferably the same as the alkyl group mentioned above with respect to $R_{01}$ to $R_{03}$.

The cycloalkyl group may be monocyclic or polycyclic. A monocyclic alkyl group having 3 to 8 carbon atoms, such as a cyclopropyl group, a cyclopentyl group or a cyclohexyl group, is preferred. These cycloalkyl groups may have a substituent.

As the halogen atom, there can be mentioned a fluorine atom, a chlorine atom, a bromine atom or an iodine atom. A fluorine atom is preferred.

When $R_{03}$ represents an alkylene group, the alkylene group is preferably an alkylene group having 1 to 8 carbon atoms, such as a methylene group, an ethylene group, a propylene group, a butylene group, a hexylene group or an octylene group.

The aromatic ring represented by $Ar_1$ is preferably an aromatic ring having 3 to 8 carbon atoms, such as a benzene ring, a toluene ring or a naphthalene ring. These aromatic rings may have a substituent.

As the group (Y) that is eliminated by the action of an acid, there can be mentioned, for example, —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), —CH($R_{36}$)(Ar) or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

Each of the alkyl groups represented by $R_{36}$ to $R_{39}$, $R_{01}$ and $R_{02}$ preferably has 1 to 8 carbon atoms. For example, there can be mentioned a methyl group, an ethyl group, a propyl group, an n-butyl group, a sec-butyl group, a hexyl group, an octyl group or the like.

The cycloalkyl groups represented by $R_{36}$ to $R_{39}$, $R_{01}$ and $R_{02}$ may be monocyclic or polycyclic. When the cycloalkyl group is monocyclic, it is preferably a cycloalkyl group having 3 to 8 carbon atoms. As such, there can be mentioned, for example, a cyclopropyl group, a cyclobutyl group, a cyclopentyl group, a cyclohexyl group, a cyclooctyl group or the like. When the cycloalkyl group is polycyclic, it is preferably a cycloalkyl group having 6 to 20 carbon atoms. As such, there can be mentioned, for example, an adamantyl group, a norbornyl group, an isobornyl group, a camphonyl group, a dicyclopentyl group, an α-pinel group, a tricyclodecanyl group, a tetracyclododecyl group, an androstanyl group or the like. With respect to these, the carbon atoms of each of the cycloalkyl groups may be partially substituted with a heteroatom, such as an oxygen atom.

Each of the aryl groups represented by $R_{36}$ to $R_{39}$, $R_{01}$, $R_{02}$ and Ar is preferably one having 6 to 10 carbon atoms. For example, there can be mentioned an aryl group, such as a phenyl group, a naphthyl group or an anthryl group.

Each of the aralkyl groups represented by $R_{36}$ to $R_{39}$, $R_{01}$ and $R_{02}$ is preferably an aralkyl group having 7 to 12 carbon atoms. For example, there can be mentioned a benzyl group, a phenethyl group, a naphthylmethyl group or the like.

Each of the alkenyl groups represented by $R_{36}$ to $R_{39}$, $R_{01}$ and $R_{02}$ preferably has 2 to 8 carbon atoms. For example, there can be mentioned a vinyl group, an allyl group, a butenyl group, a cyclohexenyl group or the like.

The ring formed by the mutual bonding of $R_{36}$ and $R_{37}$ may be monocyclic or polycyclic. The monocyclic structure is preferably a cycloalkane structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure or the like. The polycyclic structure is preferably a cycloalkane structure having 6 to 20 carbon atoms. As such, there can be mentioned, for example, an adamantane structure, a norbornane structure, a dicyclopentane structure, a tricyclodecane structure, a tetracyclododecane structure or the like. With respect to these, the carbon atoms of each of the ring structures may be partially replaced with a heteroatom, such as an oxygen atom.

A substituent may be introduced in each of the above groups. As the substituent, there can be mentioned, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group or the like. Preferably, the number of carbon atoms of each of the substituents is up to 8.

The group that is cleaved by the action of an acid, Y, preferably has any of the structures of general formula (B) below.

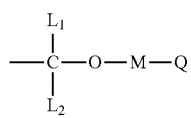 (B)

In the formula, each of $L_1$ and $L_2$ independently represents a hydrogen atom, an alkyl group, a cycloalkyl group, a aryl group or an aralkyl group.

M represents a single bond or a bivalent connecting group.

Q represents an alkyl group, a cycloalkyl group, a cycloaliphatic group, an aromatic ring group, an amino group, an ammonium group, a mercapto group, a cyano group or an aldehyde group. These cycloaliphatic group and aromatic ring group may contain a heteroatom.

At least two of Q, M and $L_1$ may be bonded to each other to thereby form a ring (preferably, a 5-membered or 6-membered ring).

The alkyl groups represented by $L_1$ and $L_2$ are, for example, alkyl groups having 1 to 8 carbon atoms. As preferred examples thereof, there can be mentioned a methyl group, an ethyl group, a propyl group, an n-butyl group, a sec-butyl group, a hexyl group and an octyl group.

The cycloalkyl groups represented by $L_1$ and $L_2$ are, for example, cycloalkyl groups each having 3 to 15 carbon atoms. As preferred examples thereof, there can be mentioned a cyclopentyl group, a cyclohexyl group, a norbornyl group, an adamantyl group and the like.

The aryl groups represented by $L_1$ and $L_2$ are, for example, aryl groups having 6 to 15 carbon atoms. As preferred examples thereof, there can be mentioned a phenyl group, a tolyl group, a naphthyl group, an anthryl group and the like.

The aralkyl groups represented by $L_1$ and $L_2$ are, for example, those having 6 to 20 carbon atoms. There can be mentioned aralkyl groups, such as a benzyl group and a phenethyl group.

The bivalent connecting group represented by M is, for example, an alkylene group (e.g., a methylene group, an ethylene group, a propylene group, a butylene group, a hexylene group, an octylene group, etc.), a cycloalkylene group (e.g., a cyclopentylene group or a cyclohexylene group, etc.), an alkenylene group (e.g., an ethylene group, a propenylene group, a butenylene group, etc.), an arylene group (e.g., a phenylene group, a tolylene group, a naphthylene group, etc.), —S—, —O—, —CO—, —SO$_2$—, —N(R$_0$)— or a bivalent connecting group resulting from combination of these groups. $R_0$ represents a hydrogen atom or an alkyl group (for example, an alkyl group having 1 to 8 carbon atoms; in particular, a methyl group, an ethyl group, a propyl group, an n-butyl group, a sec-butyl group, a hexyl group, an octyl group or the like).

The alkyl group or a cycloalkyl group represented by Q is the same as mentioned above with respect to $L_1$ and $L_2$.

As the cycloaliphatic group or the aromatic ring group represented by Q, there can be mentioned, for example, the cycloalkyl group and the aryl group mentioned above as being represented by each of $L_1$ and $L_2$. Preferably, each thereof has 3 to 15 carbon atoms.

As the cycloaliphatic group containing a heteroatom and the aromatic ring group containing a heteroatom, there can be mentioned, for example, groups having a heterocyclic structure, such as thiirane, cyclothiorane, thiophene, furan, pyrrole, benzothiophene, benzofuran, benzopyrrole, triazine, imidazole, benzimidazole, triazole, thiadiazole, triazole and pyrrolidone. However, the cycloaliphatic group containing a heteroatom and the aromatic ring group containing a heteroatom, above, are not limited to these as long as a structure generally known as a heteroring (ring formed by carbon and a heteroatom or ring formed by heteroatoms) is included.

As the ring that may be formed by the mutual bonding of at least two of Q, M and $L_1$, there can be mentioned one resulting from the mutual bonding of at least two of Q, M and $L_1$ so as to form, for example, a propylene group or a butylene group and the subsequent formation of a 5-membered or 6-membered ring containing an oxygen atom.

In general formula (VI-A), a substituent may be introduced in each of the groups represented by $L_1$, $L_2$, M and Q. As the substituent, there can be mentioned, for example, an alkyl group, a cycloalkyl group, an aryl group, an amino group, an amido group, a ureido group, a urethane group, a hydroxyl group, a carboxyl group, a halogen atom, an alkoxy group, thioether group, an acyl group, an acyloxy group, an alkoxycarbonyl group, a cyano group or a nitro group. Preferably, the number of carbon atoms of each of the substituents is up to 8.

The groups of the formula -M-Q are preferably groups each composed of 1 to 30 carbon atoms, more preferably groups each composed of 5 to 20 carbon atoms. The groups having 6 or more carbon atoms are preferred from the view point of outgas suppression.

As another preferred resin, there can be mentioned the resin containing any of repeating units of general formula (X), below.

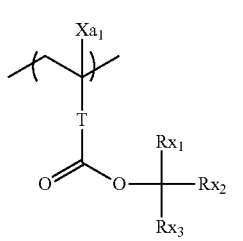

(X)

$Xa_1$ represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic). At least two of $Rx_1$ to $Rx_3$ may be bonded with each other to thereby form a cycloalkyl group (monocyclic or polycyclic).

As the bivalent connecting group represented by T, there can be mentioned, for example, an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$-group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

In a preferred mode, $Rx_1$ is a methyl group or an ethyl group, and $Rx_2$ and $Rx_3$ are bonded with each other to thereby form any of the above-mentioned cycloalkyl groups.

Specific examples of the repeating units of general formula (X) will be shown below, which however in no way limit the scope of the present invention.

In the following formulae, Rx represents a hydrogen atom, $CH_3$, $CF_3$ or $CH_2OH$. Each of Rxa and Rxb represents an alkyl group having 1 to 4 carbon atoms.

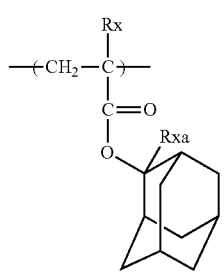

1

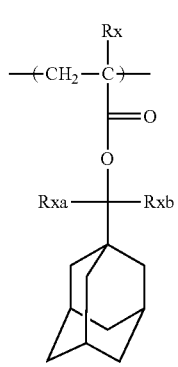

2

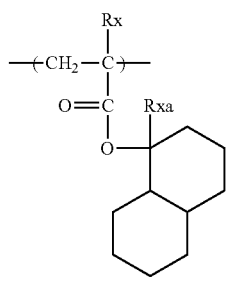

3

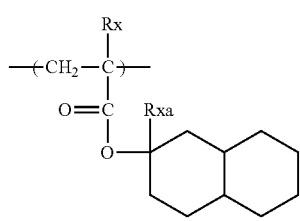

4

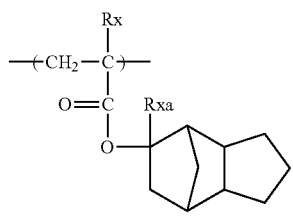

5

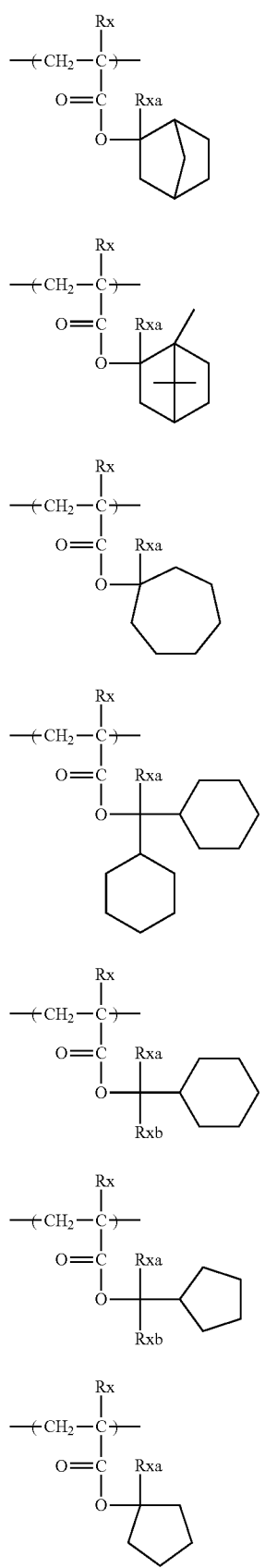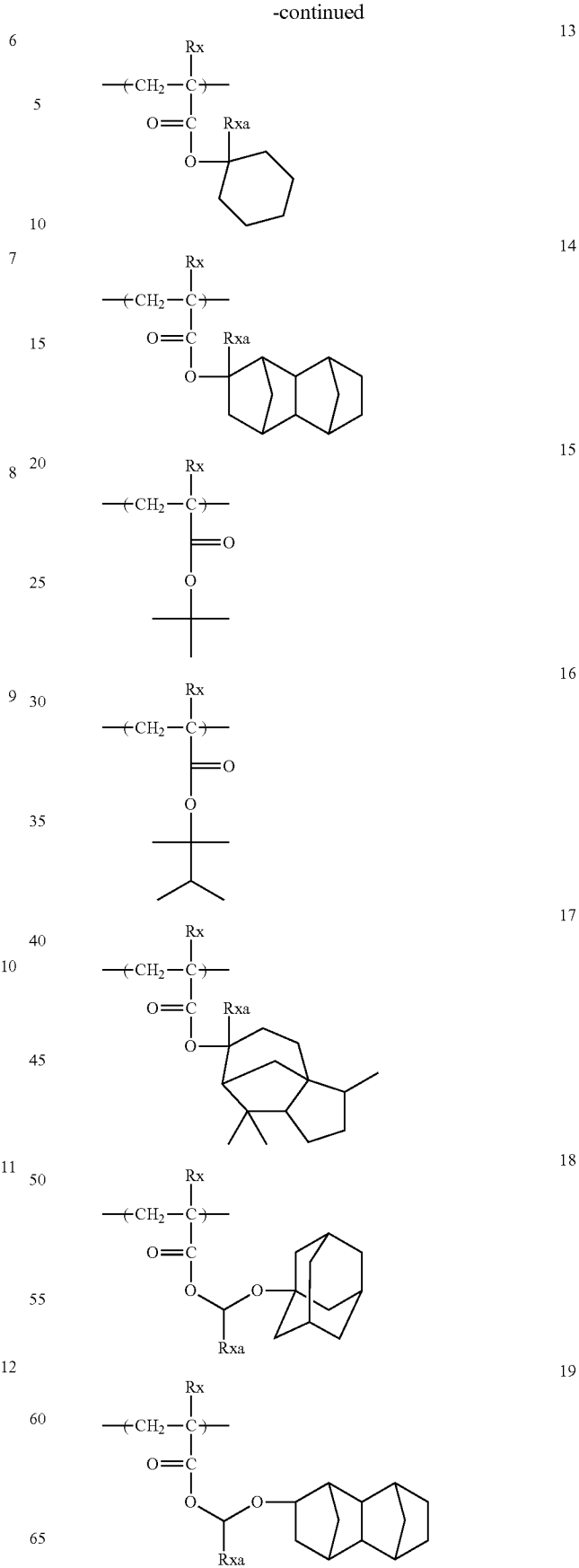

-continued

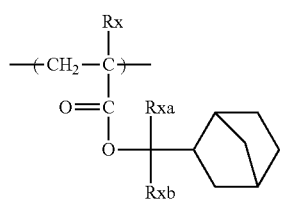
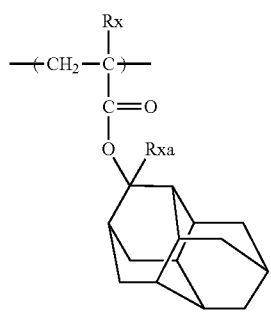
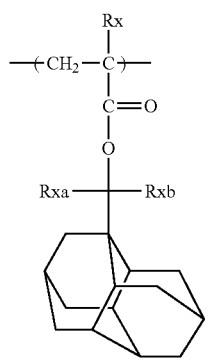
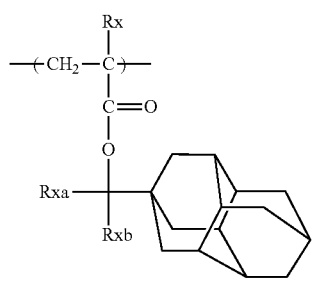
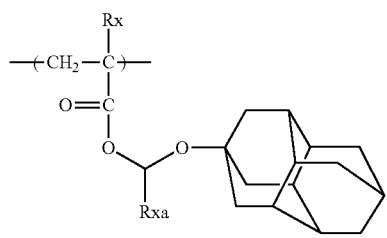
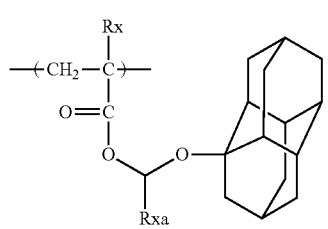

The content of repeating units of general formula (A) or (X) in the resin (when a plurality of repeating units are used, the sum thereof), based on all the repeating units of the resin, is preferably in the range of 3 to 90 mol %, more preferably 5 to 80 mol % and most preferably 7 to 70 mol %.

Specific examples of the above mentioned resins will be shown below, which however in no way limit the scope of the present invention.

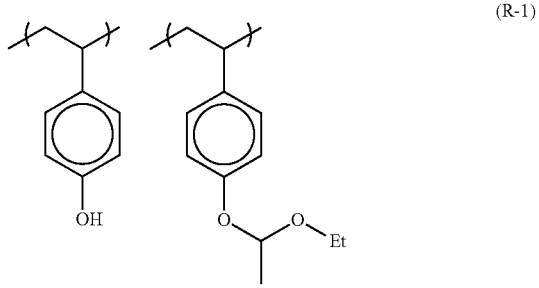
(R-1)

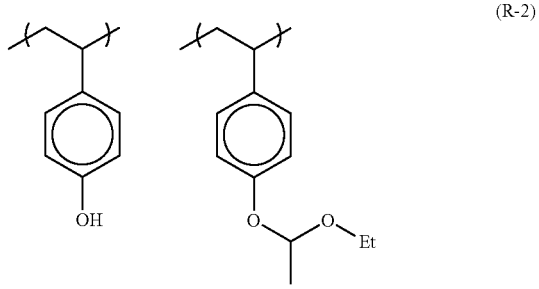
(R-2)

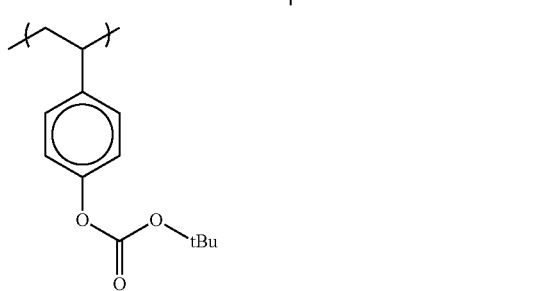

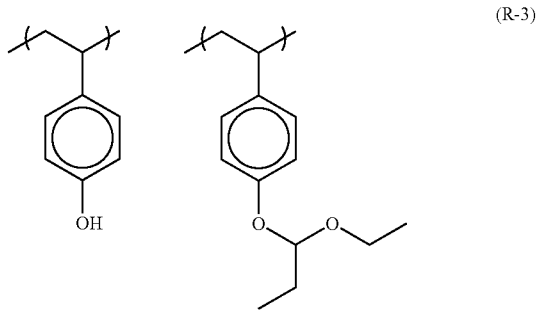
(R-3)

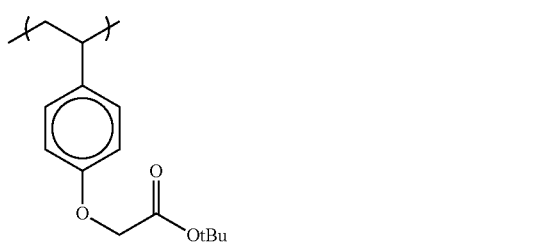

(R-4)
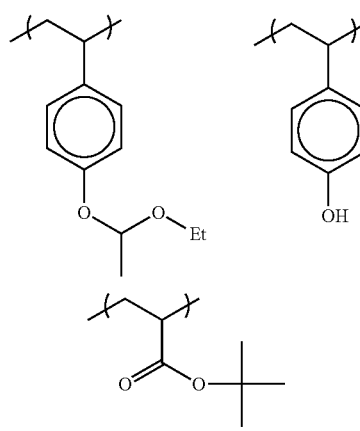
(R-5)
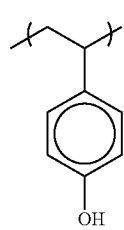
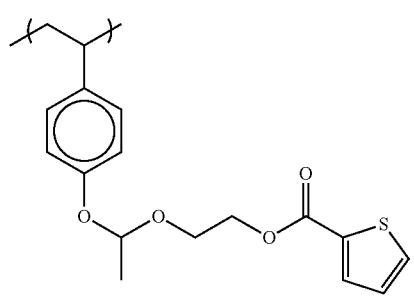
(R-6)
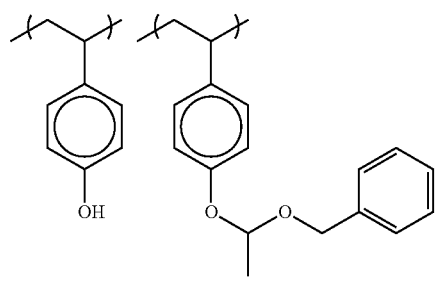
(R-7)
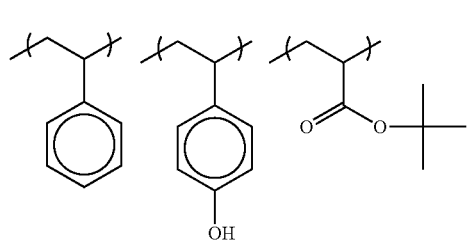
(R-8)
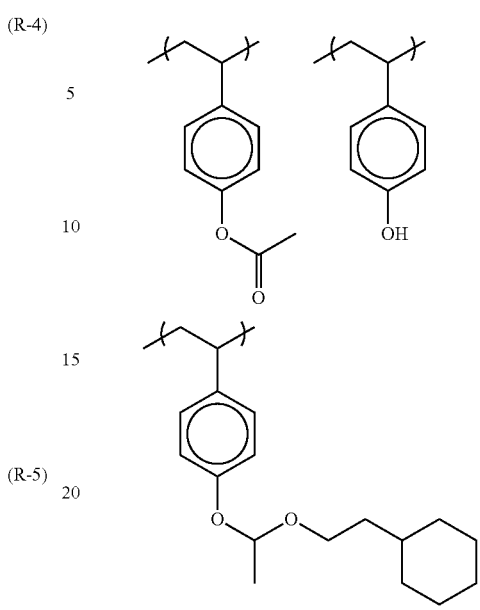
(R-9)
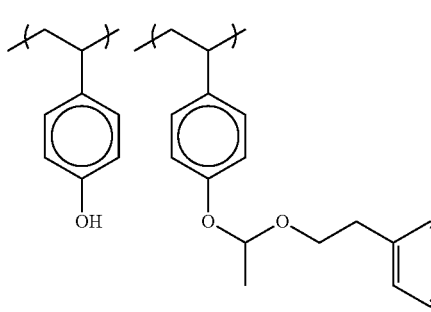
(R-10)
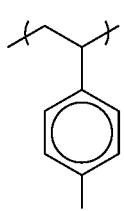
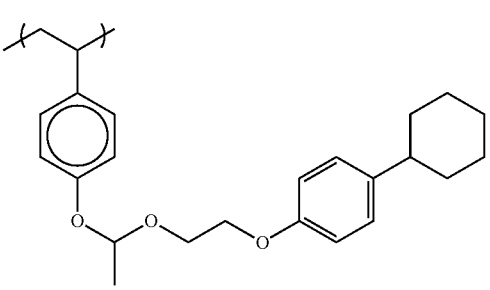
(R-11)
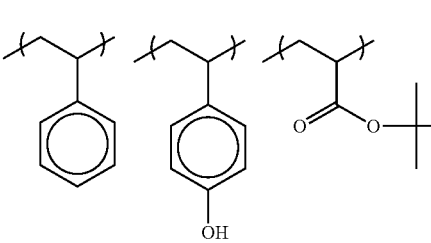

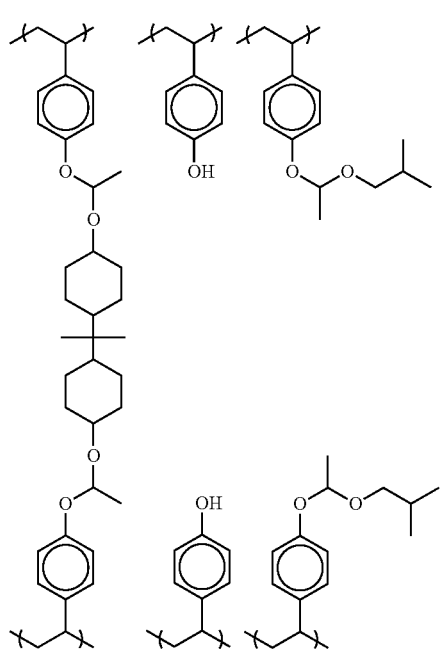
(R-12)
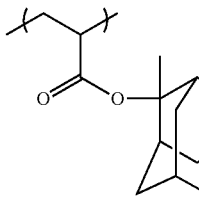
(R-13)
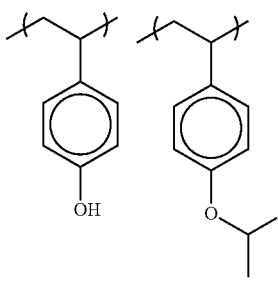
(R-14)
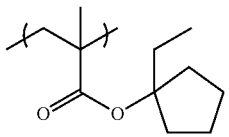
(R-15)
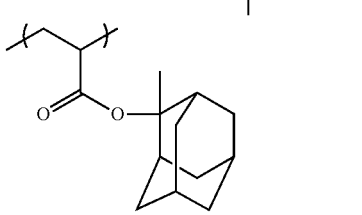
(R-16)
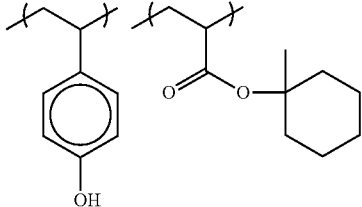
(R-17)
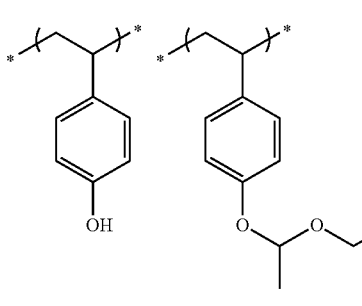
R-18
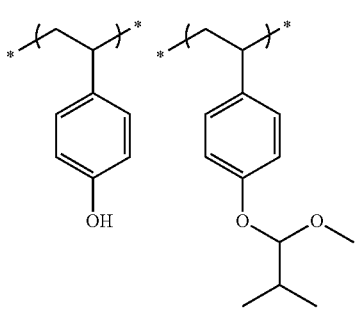
R-19

-continued
R-20
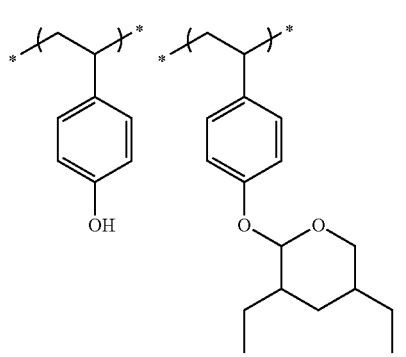
R-21
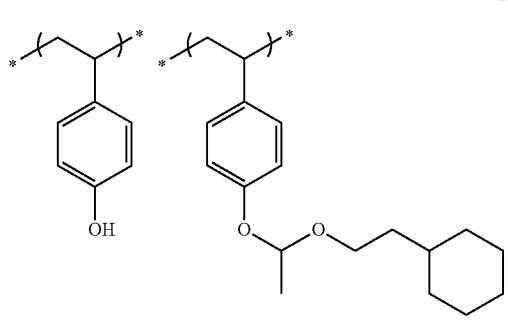
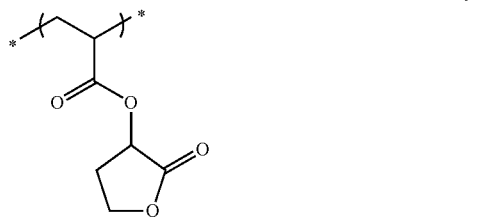
R-22
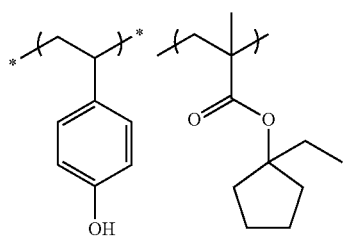
R-23
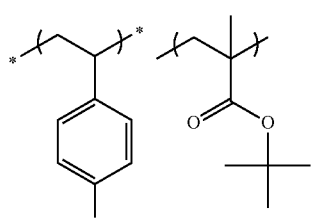
R-24
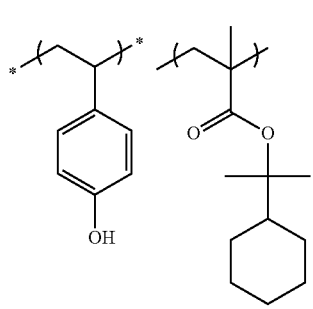
-continued
R-25
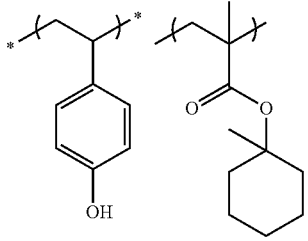
R-26
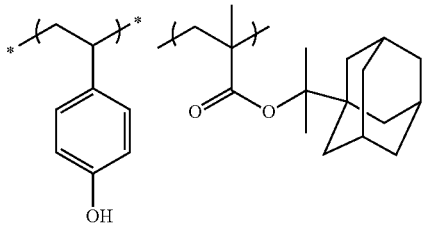
R-27
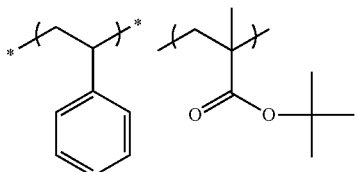
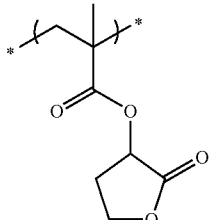
R-28
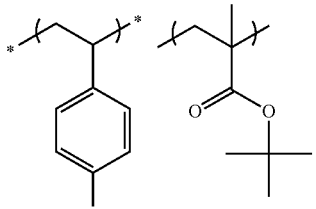
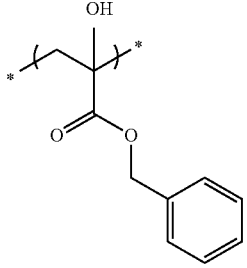
R-29
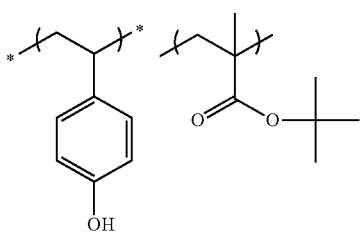

-continued

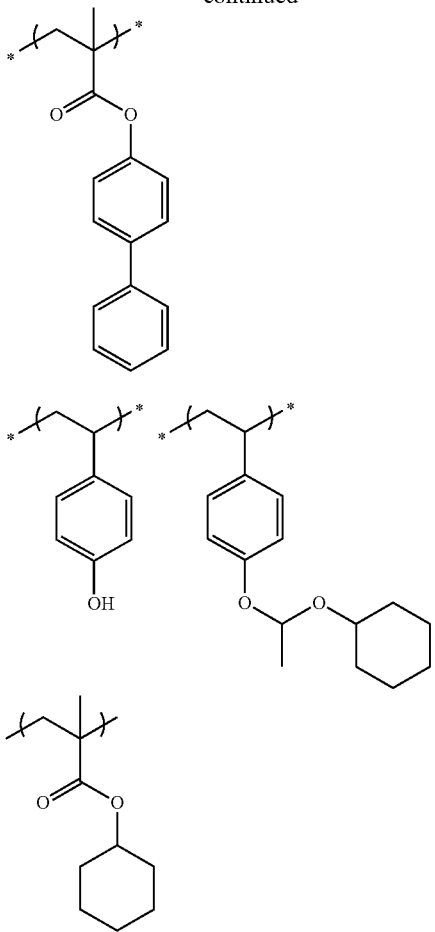

R-30

In the above specific examples, tBu represents a t-butyl group.

The content of acid-decomposable group is expressed by the formula B/(B+S) wherein B refers to the number of acid-decomposable groups contained in the resin and S refers to the number of alkali-soluble groups not protected by any acid-eliminable group. The content is preferably in the range of 0.01 to 0.7, more preferably 0.05 to 0.50 and further preferably 0.05 to 0.40.

When the composition of the present invention is exposed to ArF excimer laser beams, it is preferred for the resin to be a resin that has an alicyclic hydrocarbon structure of a single ring or multiple rings. Hereinafter, this resin may be referred to as "alicyclic hydrocarbon based acid-decomposable resin."

The alicyclic hydrocarbon based acid-decomposable resin is preferably a resin having at least one member selected from the group consisting of the repeating units having partial structures containing the alicyclic hydrocarbons of general formulae (pI) to (pV) below and the repeating units of general formula (II-AB) below.

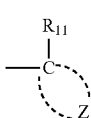
(pI)

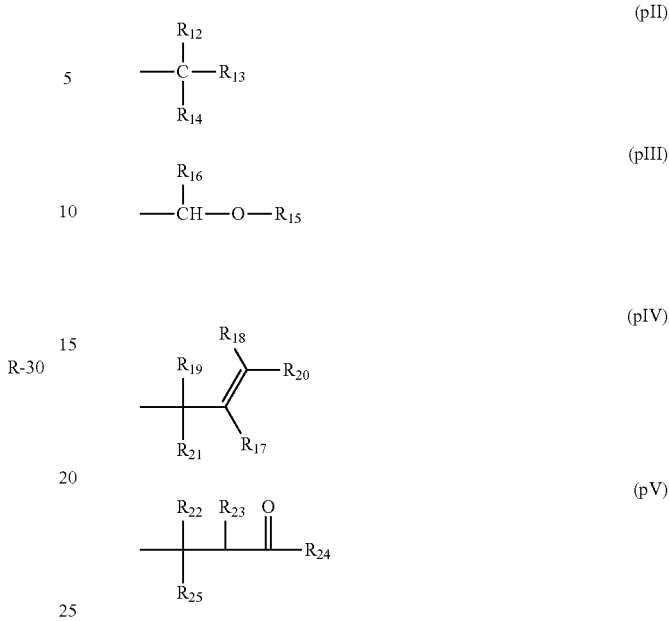

In general formulae (pI) to (pV), $R_{11}$ represents a methyl group, an ethyl group, an n-propyl group, an isopropyl group, an n-butyl group, an isobutyl group or a sec-butyl group, and Z represents an atomic group required for formation of a cycloalkyl group in cooperation with a carbon atom.

Each of $R_{12}$ to $R_{16}$ independently represents a cycloalkyl group or a linear or branched alkyl group having 1 to 4 carbon atoms, provided that at least one of $R_{12}$ to $R_{14}$ or either $R_{15}$ or $R_{16}$ represents a cycloalkyl group.

Each of $R_{17}$ to $R_{21}$ independently represents a hydrogen atom or a cycloalkyl group or a linear or branched alkyl group having 1 to 4 carbon atoms, provided that at least one of $R_{17}$ to $R_{21}$ represents a cycloalkyl group. Either $R_{19}$ or $R_{21}$ represents a cycloalkyl group or a linear or branched alkyl group having 1 to 4 carbon atoms.

Each of $R_{22}$ to $R_{25}$ independently represents a hydrogen atom or a cycloalkyl group or a linear or branched alkyl group having 1 to 4 carbon atoms, provided that at least one of $R_{22}$ to $R_{25}$ represents a cycloalkyl group. $R_{23}$ and $R_{24}$ may be bonded to each other to thereby form a ring.

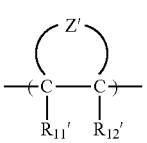
(II-AB)

In general formula (II-AB), each of $R_{11}'$ and $R_{12}'$ independently represents a hydrogen atom, a cyano group, a halogen atom or an alkyl group.

Z' represents an atomic group for formation of an alicyclic structure wherein two bonded carbon atoms (C—C) are contained.

Further preferably, the general formula (II-AB) is either general formula (II-AB1) or general formula (II-AB2) below.

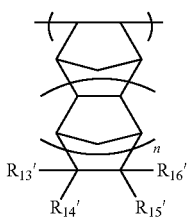

(II-AB1)

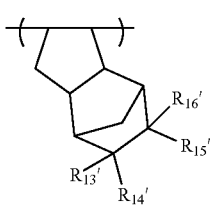

(II-AB2)

In general formulae (II-AB1) and (II-AB2), each of $R_{13}'$ to $R_{16}'$ independently represents a hydrogen atom, a halogen atom, a cyano group, a hydroxyl group, —COOH, —COOR$_5$, a group that is decomposed by the action of an acid, —C(=O)—X-A'—R$_{17}'$, an alkyl group or a cycloalkyl group. In the formula, $R_5$ represents an alkyl group, a cycloalkyl group or a group with a lactone structure. X represents an oxygen atom, a sulfur atom, —NH—, —NHSO$_2$— or —NHSO$_2$NH—. A' represents a single bond or a bivalent connecting group. $R_{17}'$ represents —COOH, —COOR$_5$, —CN, a hydroxyl group, an alkoxy group, —CO—NH—R$_6$, —CO—NH—SO$_2$—R$_6$ or a group with a lactone structure. $R_6$ represents an alkyl group or a cycloalkyl group. At least two of $R_{13}'$ to $R_{16}'$ may be bonded to each other to thereby form a ring.

n is 0 or 1.

In general formulae (pI) to (pV), each of the alkyl groups represented by $R_{12}$ to $R_{25}$ is a linear or branched alkyl group having 1 to 4 carbon atoms. As such, there can be mentioned, for example, a methyl group, an ethyl group, a propyl group, an n-butyl group, a sec-butyl group, a t-butyl group or the like.

The cycloalkyl groups represented by $R_{11}$ to $R_{25}$ and the cycloalkyl group formed by Z and a carbon atom may be monocyclic or polycyclic. In particular, there can be mentioned groups of a monocyclo, bicyclo, tricyclo or tetracyclo structure or the like having 5 or more carbon atoms. The number of carbon atoms thereof is preferably in the range of 6 to 30, especially preferably 7 to 25.

As preferred cycloalkyl groups, there can be mentioned, for example, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. As more preferred cycloalkyl groups, there can be mentioned an adamantyl group, a norbornyl group, a cyclohexyl group, a cyclopentyl group, a tetracyclododecanyl group and a tricyclodecanyl group.

These alkyl groups and cycloalkyl groups may have substituents. As substituents, there can be mentioned an alkyl group (1 to 4 carbon atoms), a halogen atom, a hydroxyl group, an alkoxy group (1 to 4 carbon atoms), a carboxyl group and an alkoxycarbonyl group (2 to 6 carbon atoms). These substituents. may further have substituents. As substituents that can be further introduced in the above-mentioned substituents, there can be mentioned a hydroxyl group, a halogen atom and an alkoxy group.

The structures of general formulae (pI) to (pV) can be used for the protection of the alkali-soluble groups. As the alkali-soluble groups, there can be mentioned various groups generally known in this technical field.

In particular, there can be mentioned, for example, structures resulting from replacement of a hydrogen atom of a carboxylic acid group, sulfonic acid group, phenol group or thiol group with any of the structures of general formulae (pI) to (pV). Structures resulting from replacement of a hydrogen atom of a carboxylic acid group or sulfonic acid group with any of the structures of general formulae (pI) to (pV) are preferred.

As preferred repeating units having any of the alkali-soluble groups protected by the structures of general formulae (pI) to (pV), there can be mentioned those of general formula (pA) below.

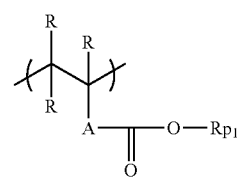

(pA)

In the general formula (pA), R represents a hydrogen atom, a halogen atom or a linear or branched alkyl group having 1 to 4 carbon atoms. Two or more R's may be identical to or different from each other.

A represents any one or a combination of two or more groups selected from the group consisting of a single bond, an alkylene group, an ether group, a thioether group, a carbonyl group, an ester group, an amido group, a sulfonamido group, a urethane group and a urea group. A single bond is preferred.

Pp1 represents any of the groups of the above general formulae (pI) to (pV).

The repeating units of the general formula (pA) are most preferably those derived from a 2-alkyl-2-adamantyl(meth)acrylate and a dialkyl(1-adamantyl)methyl(meth)acrylate.

Specific examples of the repeating units of the general formula (pA) will be shown below.

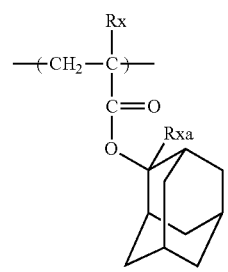

1

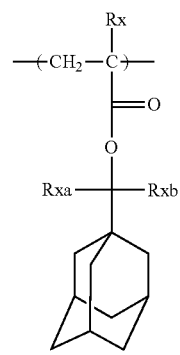

2

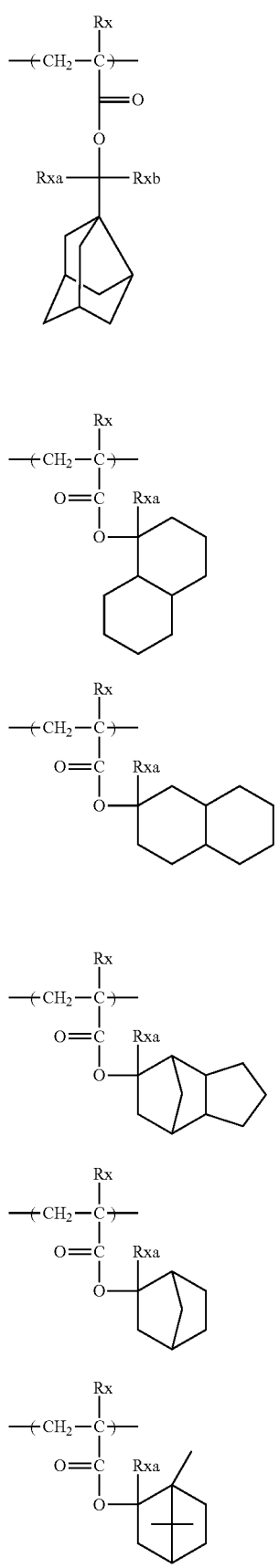
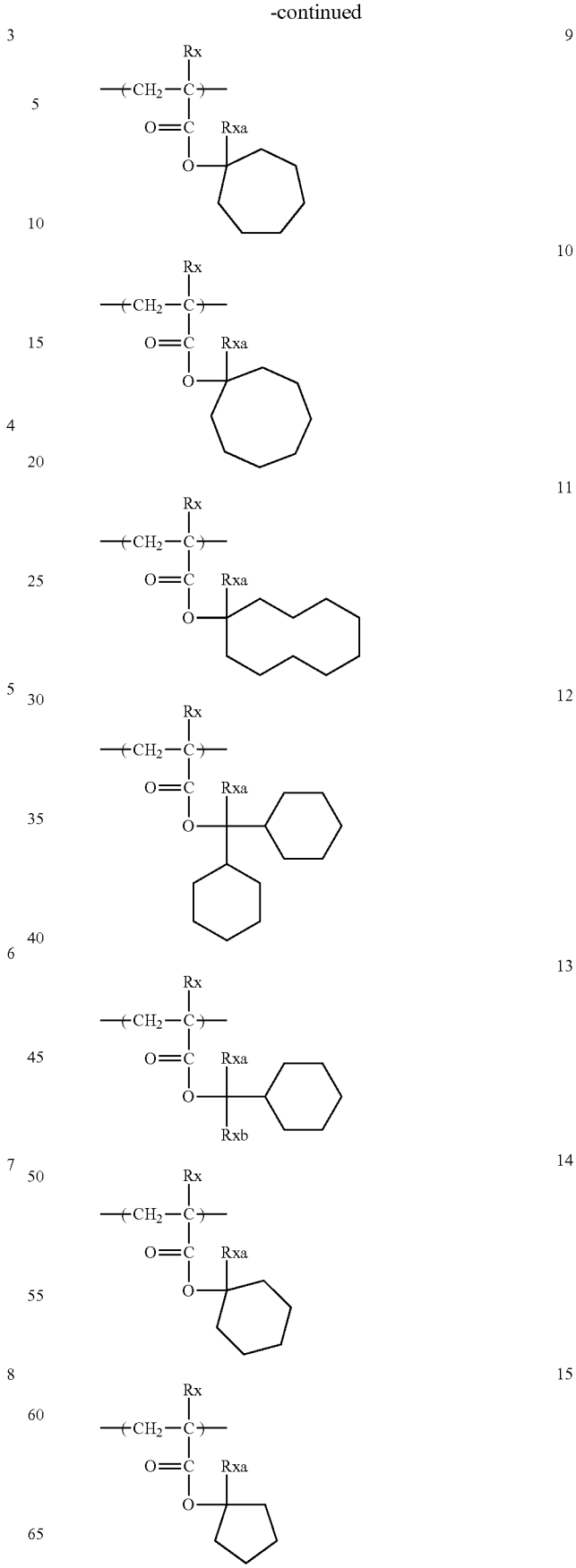

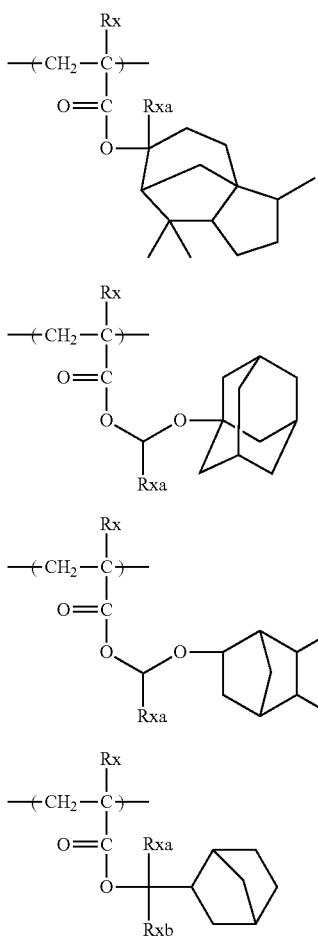

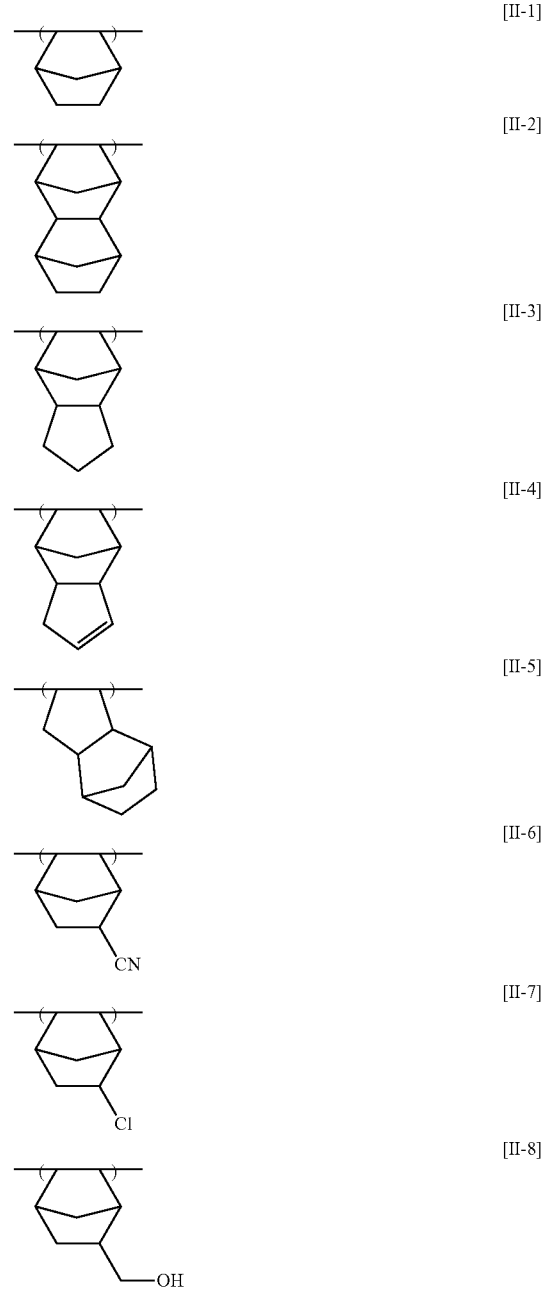

repeating units having partial structures containing the alicyclic hydrocarbons of the general formulae (pI) to (pV), the repeating units of general formula (II-AB) and the repeating units of copolymer components to be described below.

Any of the various substituents that can be introduced in $R_{13}'$ to $R_{16}'$ in the general formulae (II-AB1) and (II-AB2) can be a substituent for the atomic groups for formation of the alicyclic structures of the general formula (II-AB) or the atomic groups Z' for formation of the bridged alicyclic structures.

Specific examples of the repeating units of general formulae (II-AB1) and (II-AB2), above, will be shown below, which however in no way limit the scope of the present invention.

In the above structural formulae, Rx represents H, $CH_3$, $CF_3$ or $CH_2OH$. Each of Rxa and Rxb independently represents an alkyl group having 1 to 4 carbon atoms.

In general formula (II-AB), the halogen atoms represented by $R_{11}'$ and $R_{12}'$ include a chlorine atom, a bromine atom, a fluorine atom, an iodine atom, etc.

The alkyl groups represented by $R_{11}'$ and $R_{12}'$ are preferably linear or branched alkyl groups each having 1 to 10 carbon atoms. For example, there can be mentioned a methyl group, an ethyl group, an n-propyl group, an isopropyl group, a linear or branched butyl, pentyl, hexyl or heptyl group, and the like.

The atomic group for formation of the alicyclic structure represented by Z' is an atomic group capable of providing the resin with a repeating unit of optionally substituted alicyclic hydrocarbon. The atomic group is especially preferably one capable of providing a bridged alicyclic structure for formation of a bridged alicyclic hydrocarbon repeating unit.

The provided alicyclic hydrocarbon skeleton can be the same as that of the cycloalkyl groups represented by $R_{12}$ to $R_{25}$ in the general formulae (pII) to (pV).

The alicyclic hydrocarbon skeleton may have a substituent. As the substituent, there can be mentioned any of the atoms or groups represented by $R_{13}'$ to $R_{16}'$ in the general formulae (II-AB1) and (II-AB2).

In the alicyclic hydrocarbon based acid-decomposable resin, the group that is decomposed by the action of an acid can have at least one repeating unit selected from among the

[II-9] 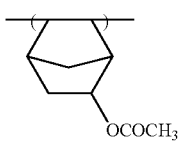
[II-10] 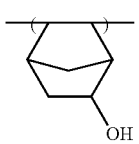
[II-11] 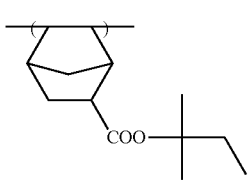
[II-12] 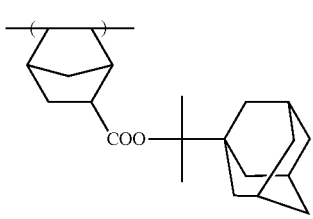
[II-13] 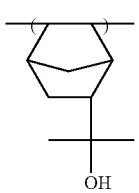
[II-14] 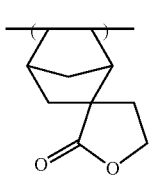
[II-15] 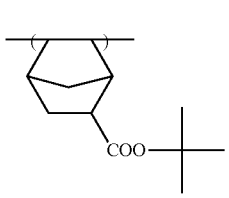
[II-16] 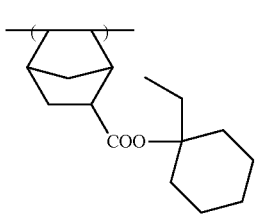
[II-17] 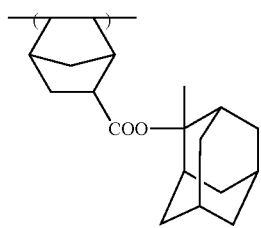
[II-18] 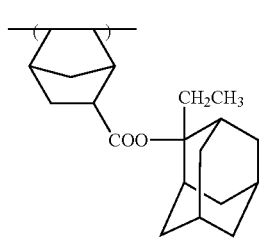
[II-19] 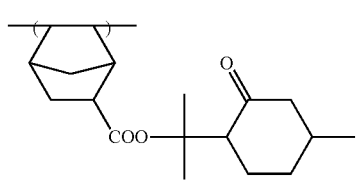
[II-20] 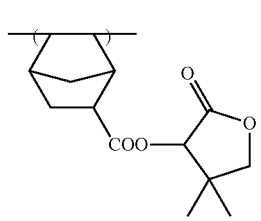
[II-21] 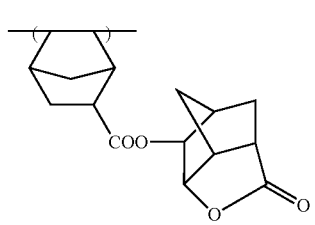
[II-22] 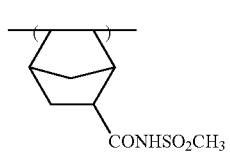
[II-23] 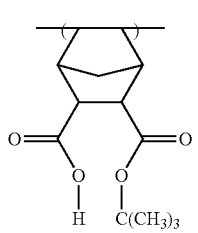

[II-24] 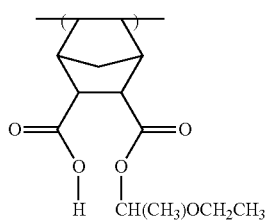

[II-25] 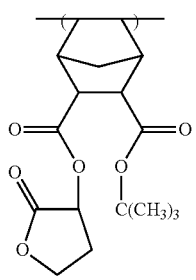

[II-26] 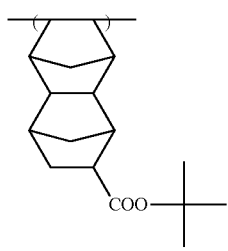

[II-27] 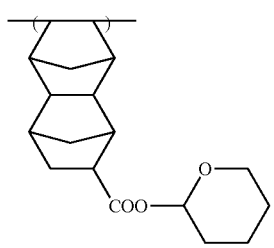

[II-28] 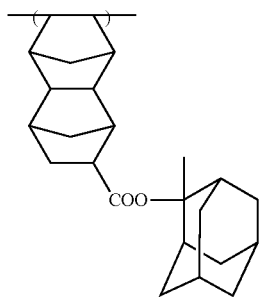

[II-29] 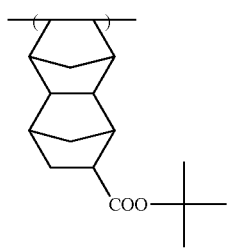

[II-30] 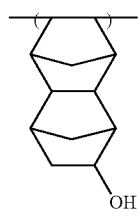

[II-31] 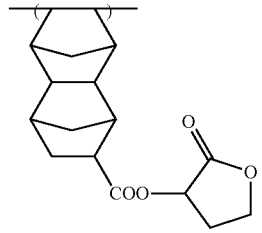

[II-32] 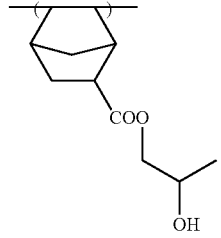

It is preferred for the alicyclic hydrocarbon based acid-decomposable resin to have a repeating unit containing a lactone group. As the lactone groups, the groups with a 5 to 7-membered ring lactone structure are preferred, and those resulting from condensation of lactone structures of a 5 to 7-membered ring with other cyclic structures effected in a fashion to form a bicyclo structure or spiro structure are especially preferred.

More preferably, the alicyclic hydrocarbon based acid-decomposable resin contain a repeating unit having a lactone structure represented by any of general formulae (LC1-1) to (LC1-16) below. The groups with lactone structures may be directly bonded to the principal chain of the resin. Preferred lactone structures are those of the formulae (LC1-1), (LC1-4), (LC1-5), (LC1-6), (LC1-13), (LC1-14) and (LC1-17). The use of these specified lactone structures would realize improvement in the line edge roughness and development defect.

LC1-1 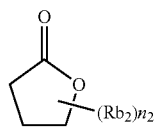

LC1-2 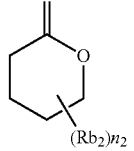

-continued

LC1-3 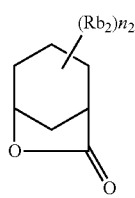

LC1-4 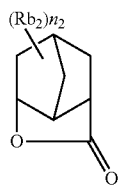

LC1-5 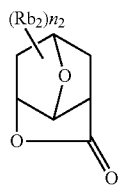

LC1-6 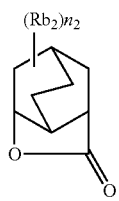

LC1-7 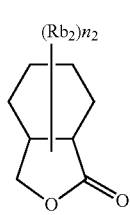

LC1-8 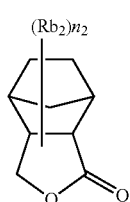

LC1-9 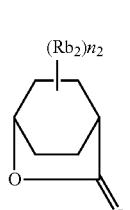

LC1-10 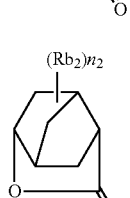

-continued

LC1-11 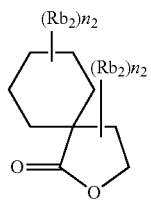

LC1-12 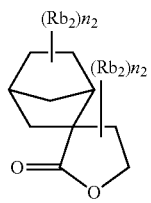

LC1-13 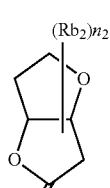

LC1-14 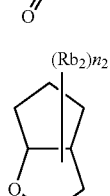

LC1-15 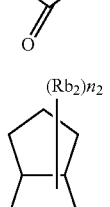

LC1-16 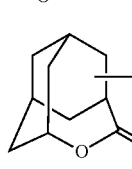

LC1-17 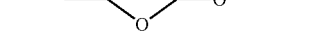

The presence of a substituent ($Rb_2$) on the portion of the lactone structure is optional. As preferred substituents ($Rb_2$), there can be mentioned an alkyl group having 1 to 8 carbon atoms, a cycloalkyl group having 3 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like.

In the formulae, $n_2$ is an integer of 0 to 4. When $n_2$ is an integer of 2 or greater, the plurality of present substituents ($Rb_2$) may be identical to or different from each other. Further, the plurality of present substituents ($Rb_2$) may be bonded to each other to thereby form a ring.

As the repeating units having the groups with lactone structures of any of general formulae (LC1-1) to (LC1-17), there can be mentioned the repeating units of general formulae (II-AB1) and (II-AB2) wherein at least one of R13' to R16' has any of the groups of the general formulae (LC1-1) to (LC1-17) (for example, the $R_5$ of —$COOR_5$ represents any of the groups of general formulae (LC1-1) to (LC1-17)) as well as the repeating units of general formula (AI) below.

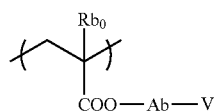

(AI)

In general formula (AI), $Rb_0$ represents a hydrogen atom, a halogen atom or an alkyl group having 1 to 4 carbon atoms.

As the alkyl group represented by $Rb_0$, there can be mentioned, for example, a methyl group, an ethyl group, a propyl group, an n-butyl group, a sec-butyl group, a t-butyl group or the like. The alkyl group represented by $Rb_0$ may have a substituent. As preferred substituents, there can be mentioned, for example, a hydroxyl group and a halogen atom.

As the halogen atom represented by $Rb_0$, there can be mentioned a fluorine atom, a chlorine atom, a bromine atom or an iodine atom. The $Rb_0$ is preferably a hydrogen atom or a methyl group.

Ab represents an alkylene group, a bivalent connecting group with an alicyclic hydrocarbon structure of a single ring or multiple rings, a single bond, an ether group, an ester group, a carbonyl group, a carboxyl group or a bivalent connecting group resulting from combination of these. A single bond and a connecting group of the formula -$Ab_1$-$CO_2$— are preferred.

$Ab_1$ is a linear or branched alkylene group or a cycloalkylene group of a single ring or multiple rings, being preferably a methylene group, an ethylene group, a cyclohexyl residue, an adamantyl residue or a norbornyl residue.

V represents any of the groups of the general formulae (LC1-1) to (LC1-17).

The repeating unit having a lactone structure is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90% ee or higher, more preferably 95% ee or higher.

Especially preferred examples of the repeating units having groups with lactone structures will be shown below, which however in no way limit the scope of the present invention. The pattern profile and iso/dense bias can be enhanced by selecting the most appropriate lactone groups. In the formulae, each of Rx and R represents H, $CH_3$, $CH_2OH$ or $CF_3$.

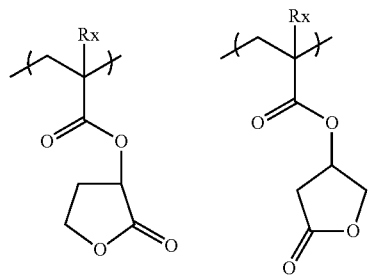

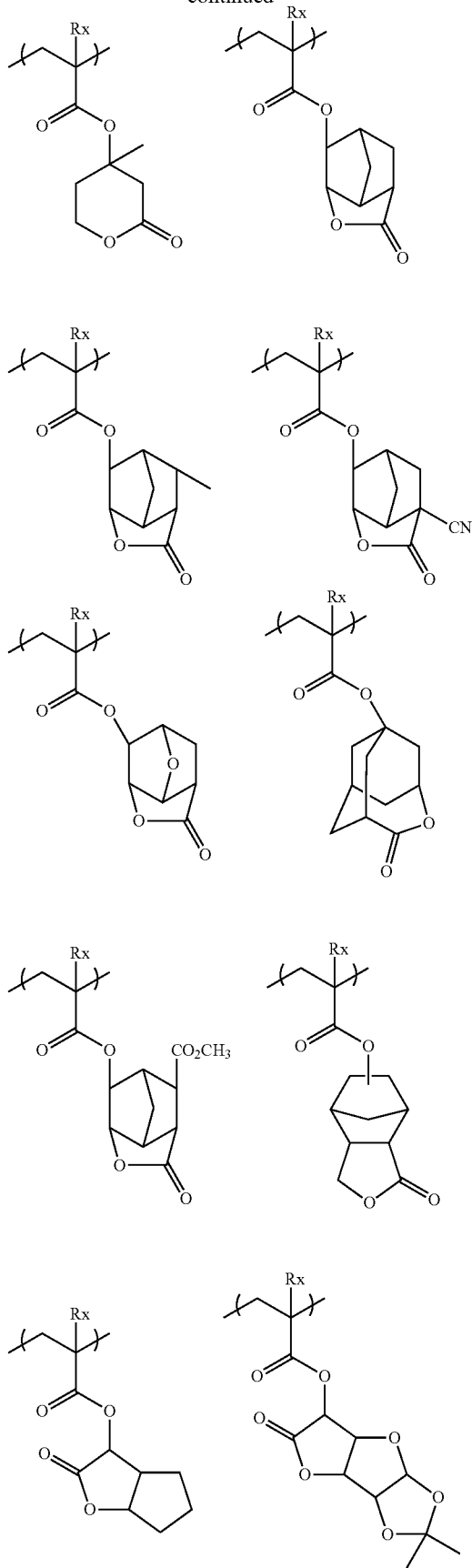

105
-continued
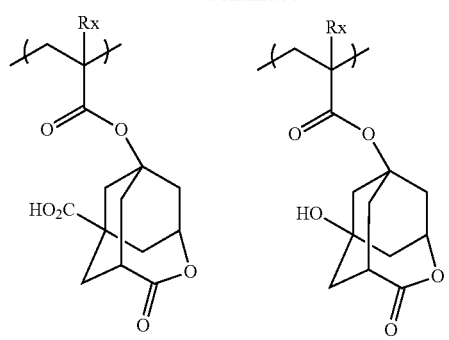
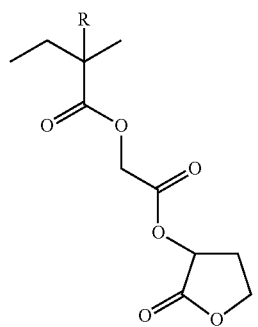
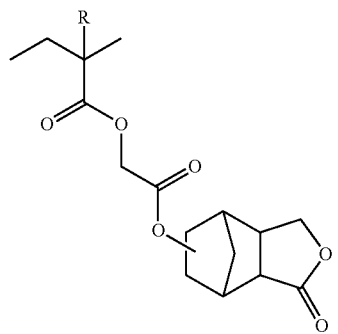
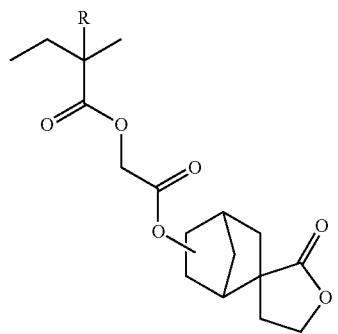
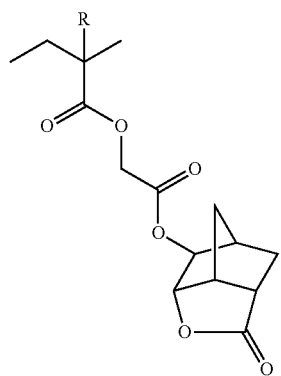
106
-continued
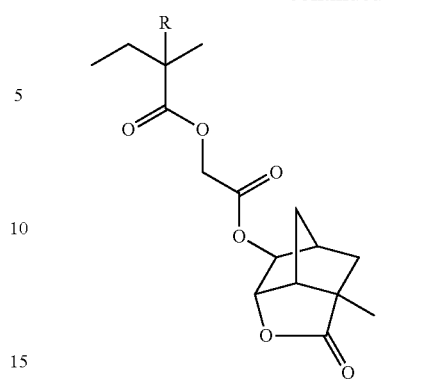
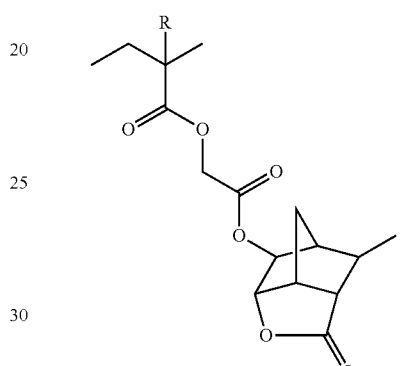
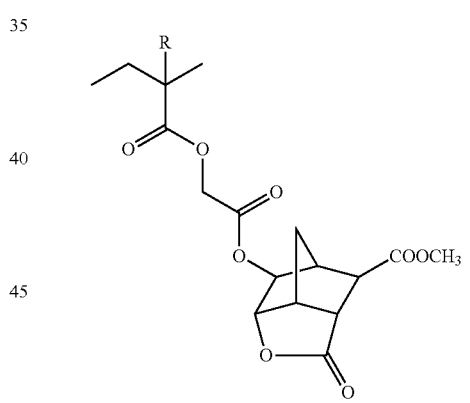
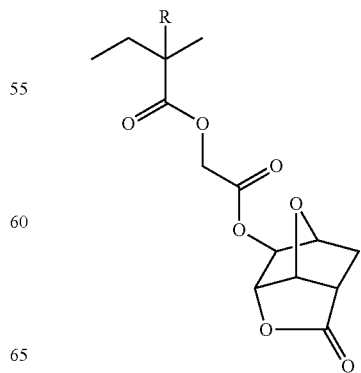

107
-continued
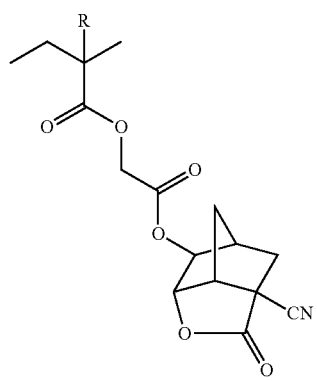
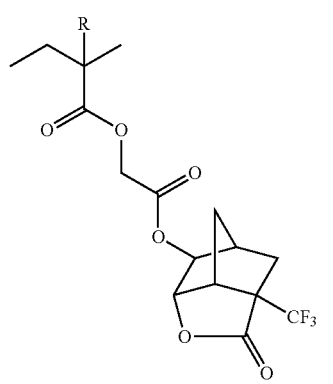
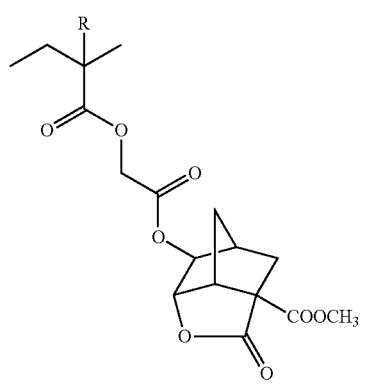
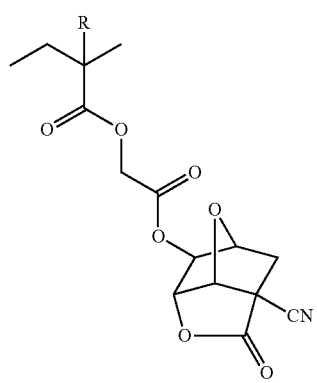
108
-continued
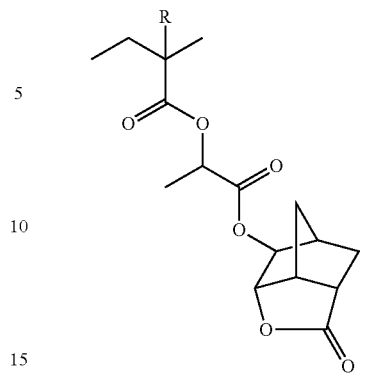
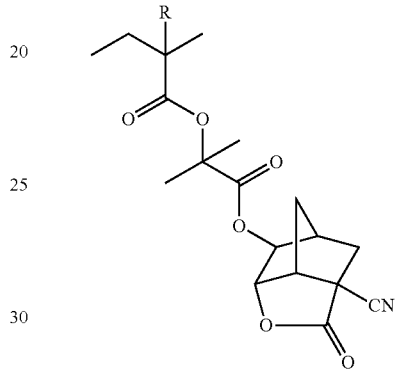
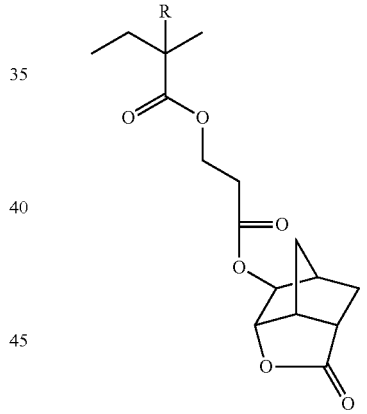
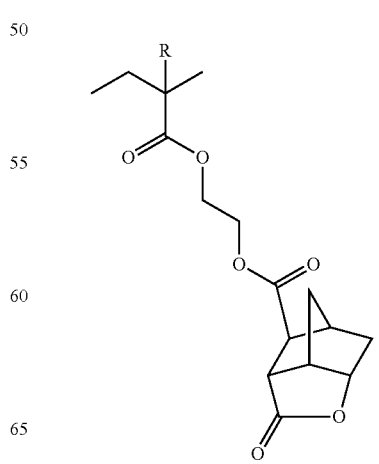

-continued

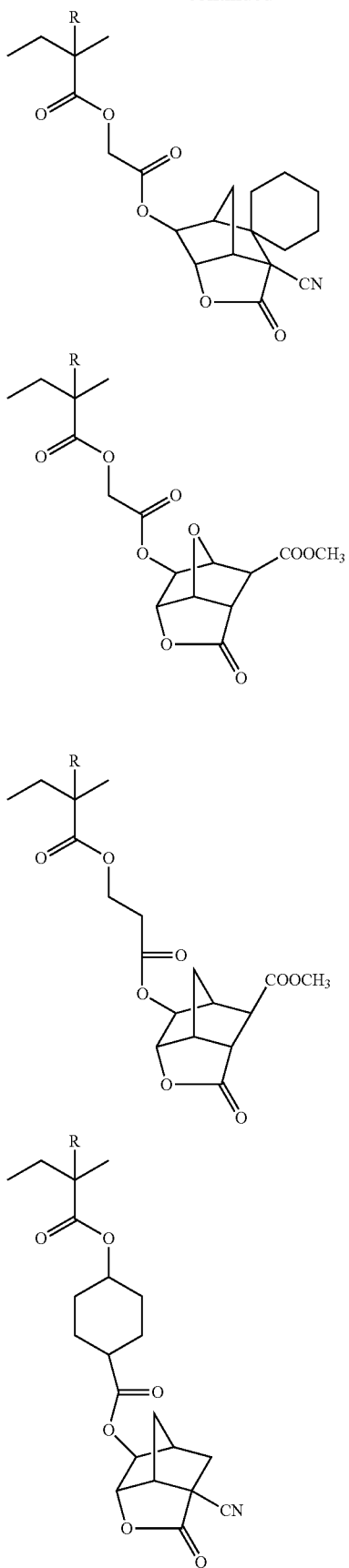

-continued

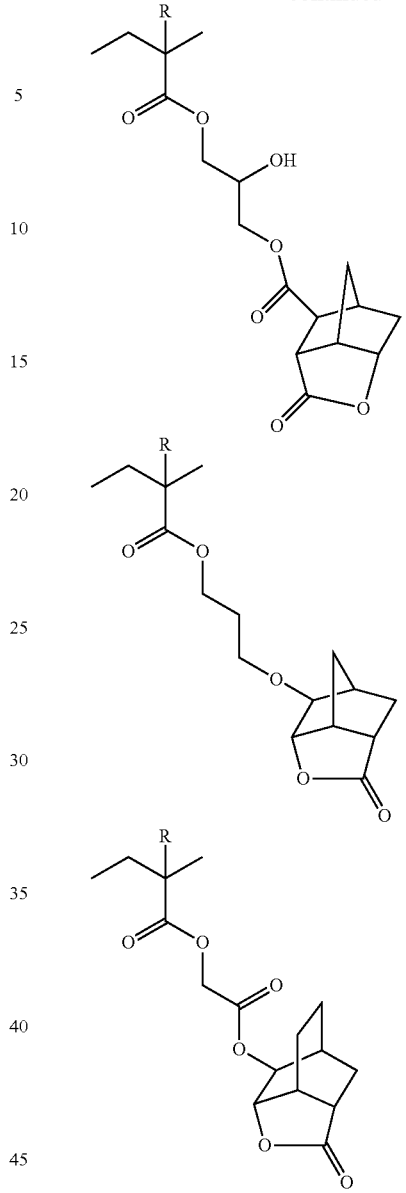

The alicyclic hydrocarbon acid-decomposable resin may contain a plurality of repeating units each containing a lactone group. In this case, it is preferred for the acid-decomposable resin to contain (1) any one of those of general formula (AI) in which Ab is a single bond together with any one of those of general formula (AI) in which Ab is $-Ab_1-CO_2-$, or (2) a mixture of two of those of general formula (AI) in which Ab is $-Ab_1-CO_2-$.

The content of the repeating units containing a lactone group, the sum thereof when a plurality of repeating units are contained, is preferably in the range of 10 to 70 mol %, more preferably 20 to 60 mol %, based on all the repeating units contained in the resin.

It is preferred for the alicyclic hydrocarbon based acid-decomposable resin to have a repeating unit having an alicyclic hydrocarbon structure substituted with a polar group. The containment of this repeating unit would realize enhancements of adhesion to substrate and developer affinity. The polar group is preferably a hydroxyl group or a cyano group. The hydroxyl group as the polar group constitutes an alcoholic hydroxyl group.

As the alicyclic hydrocarbon structure substituted with a polar group, there can be mentioned, for example, any of the structures of general formulae (VIIa) and (VIIb), below.

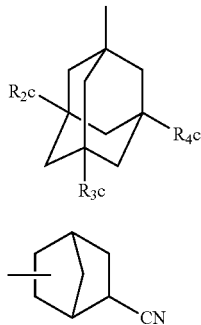
(VIIa)

(VIIb)

In general formula (VIIa), each of $R_2c$ to $R_4c$ independently represents a hydrogen atom, a hydroxyl group or a cyano group, provided that at least one of the $R_2c$ to $R_4c$ represents a hydroxyl group or a cyano group. Preferably, one or two of the $R_2c$ to $R_4c$ are hydroxyl groups and the remainder is a hydrogen atom. More preferably, two of the $R_2c$ to $R_4c$ are hydroxyl groups and the remainder is a hydrogen atom.

The groups of the general formula (VIIa) preferably have a dihydroxy form or monohydroxy form, more preferably a dihydroxy form.

As the repeating units having the groups of general formula (VIIa) or (VIIb), there can be mentioned the repeating units of general formulae (II-AB1) and (II-AB2) wherein at least one of R13' to R16' has any of the groups of general formula (VIIa) or (VIIb) (for example, the $R_5$ of —COOR$_5$ represents any of the groups of the general formula (VIIa) or (VIIb)) as well as the repeating units of general formula (AIIa) or (AIIb), below.

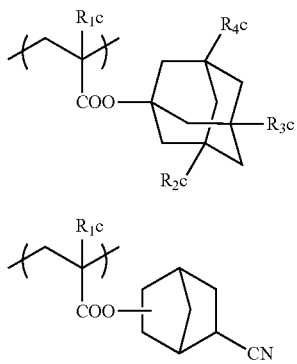
(AIIa)

(AIIb)

In the general formulae (AIIa) and (AIIb), $R_1c$ represents a hydrogen atom, a methyl group, a trifluoromethyl group or a hydroxymethyl group.

$R_2c$ to $R_4c$ have the same meaning as those of the general formula (VIIa).

Specific examples of the repeating units having an alicyclic hydrocarbon structure substituted with a polar group, expressed by the general formula (AIIa) or (AIIb) will be shown below, which however in no way limit the scope of the present invention.

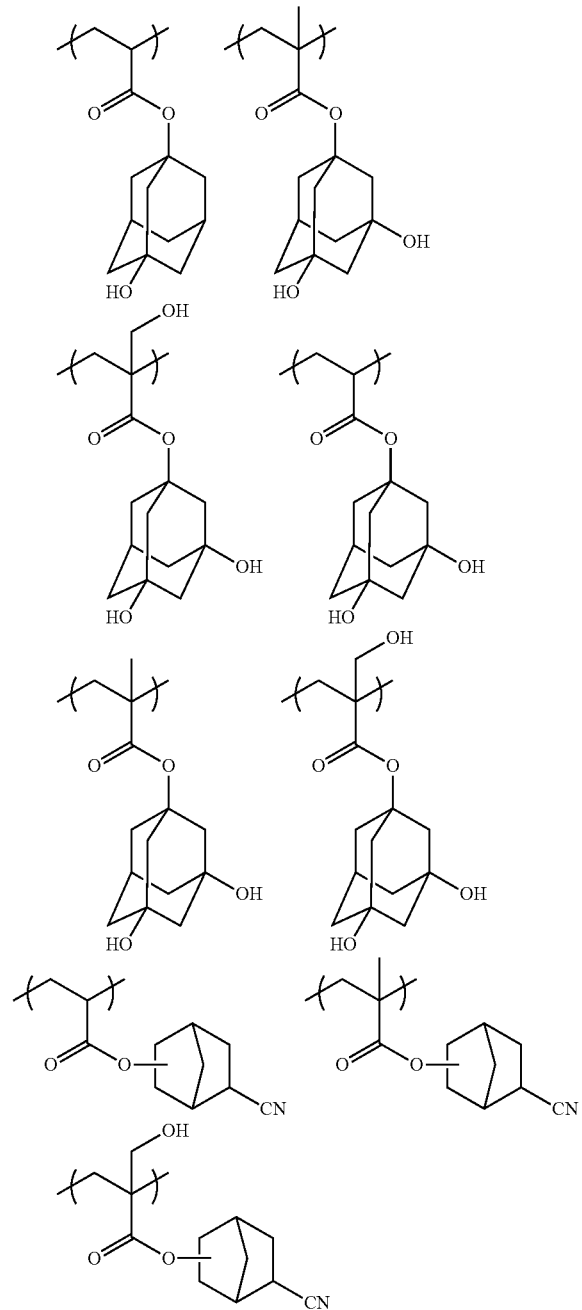

The content of these repeating units (when there are a plurality of appropriate repeating units, the sum thereof), based on all the repeating units of the resin, is preferably in the range of 3 to 30 mol %, more preferably 5 to 25 mol %.

The resins of the present invention may further contain a repeating unit containing neither a hydroxyl group nor a cyano group that is stable against the action of an acid, in addition to the foregoing repeating units.

As the stable repeating unit, in particular, there can be mentioned the repeating units of general formula below in which a non-acid-decomposable aryl structure or cycloalkyl structure is introduced in a side chain of acrylic structure. The introduction of this structure promises the attainment of contrast regulation, enhancement of etching resistance, etc.

The stable repeating unit may be introduced in the above-mentioned resin containing a hydroxystyrene repeating unit, or alicyclic hydrocarbon acid-decomposable resin. When the stable repeating unit is introduced in the alicyclic hydrocarbon acid-decomposable resin, it is preferred for stable repeating unit not to contain any aromatic ring structure from the viewpoint of the absorption of 193 nm light.

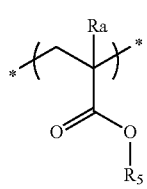

(III)

In general formula (III), $R_5$ represents a hydrocarbon group.

Ra represents a hydrogen atom, an alkyl group (preferably a methyl group), a hydroxyalkyl group (preferably a hydroxymethyl group) or a trifluoromethyl group.

The hydrocarbon group represented by $R_5$ preferably includes a cyclic structure. When the hydrocarbon group includes a cyclic structure, there can be mentioned, for example, a cycloalkyl group of a single ring or multiple rings (preferably having 3 to 12 carbon atoms, more preferably 3 to 7), a cycloalkenyl group of a single ring or multiple rings (preferably having 3 to 12 carbon atoms), an aryl group (preferably having 6 to 20 carbon atoms, more preferably 6 to 12) or an aralkyl group (preferably having 7 to 20 carbon atoms, more preferably 7 to 12).

The cycloalkyl groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings.

As preferred crosslinked-ring hydrocarbon rings, there can be mentioned, for example, a norbornyl group, an adamantyl group, a bicyclooctanyl group and a tricyclo[5,2,1,0$^{2,6}$]decanyl group. As more preferred crosslinked-ring hydrocarbon rings, there can be mentioned a norbornyl group and an adamantyl group.

As preferred aryl groups, there can be mentioned, for example, a phenyl group, a naphthyl group, a biphenyl group and the like. As preferred aralkyl groups, there can be mentioned, for example, a phenylmethyl group, a phenylethyl group, a naphthylmethyl group and the like.

These hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content of any of the repeating units of general formula (III), based on all the repeating units of resin (B), is preferably in the range of 0 to 40 mol %, more preferably 0 to 20 mol %.

Specific examples of the repeating units of general formula (III) will be shown below, which however in no way limit the scope of the present invention. In the formulae, Ra represents H, $CH_3$, $CH_2OH$ or $CF_3$.

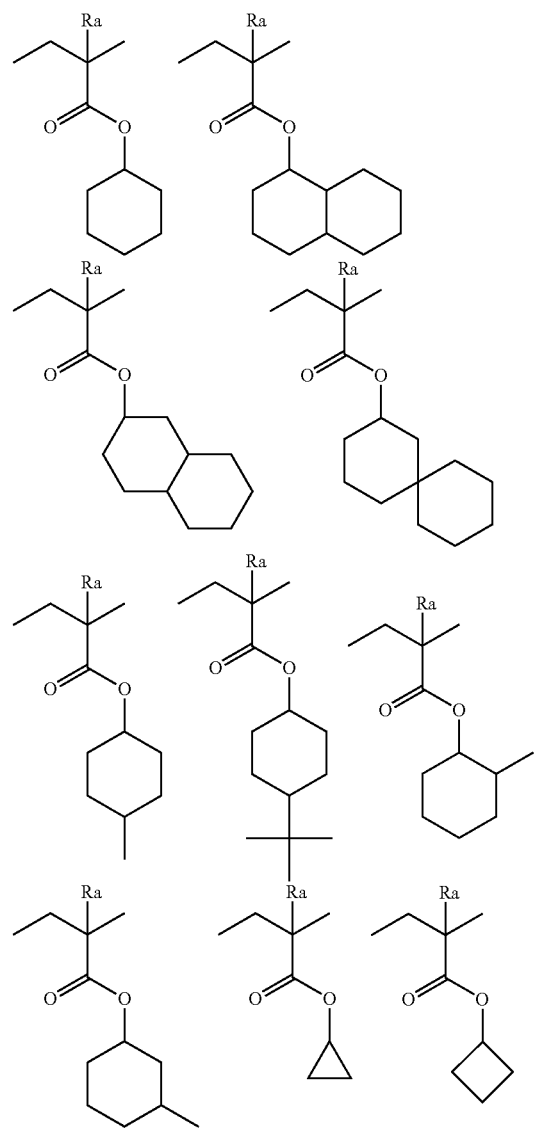

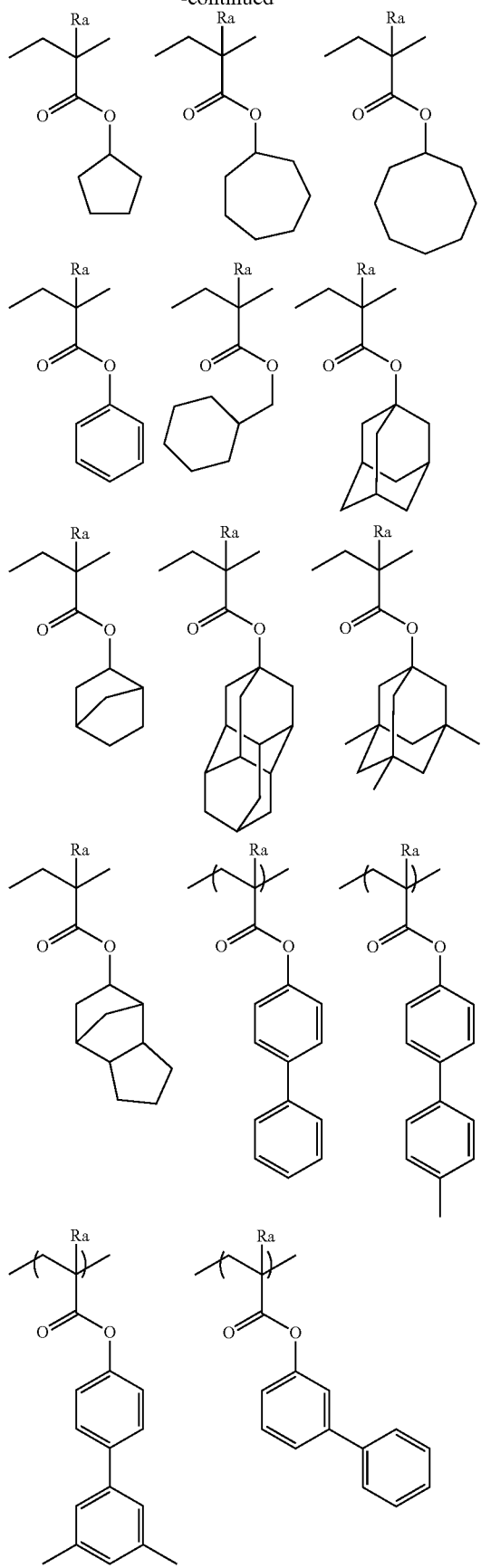
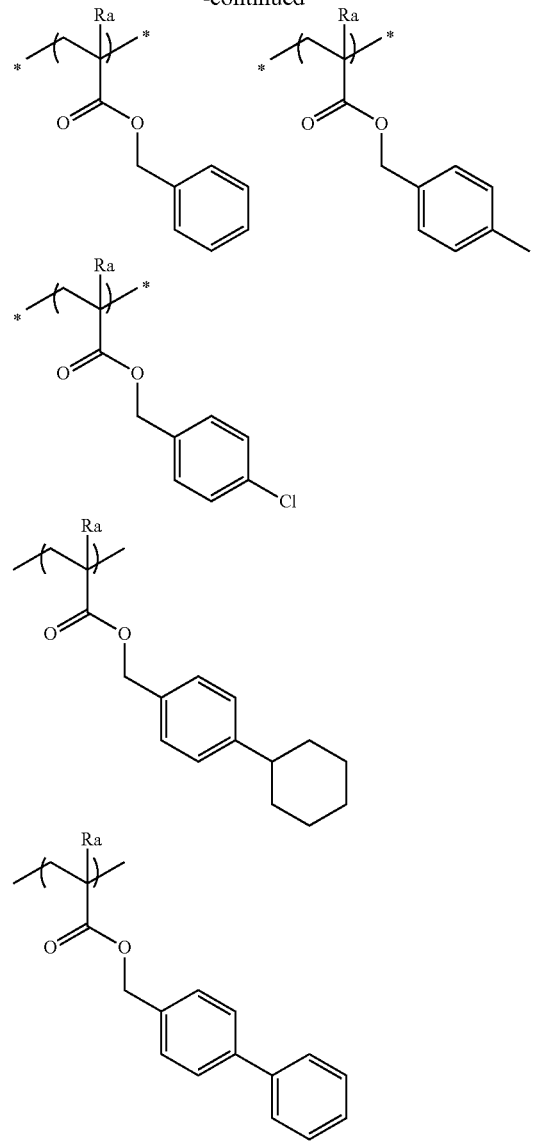

The content of these repeating units (when there are a plurality of appropriate repeating units, the sum thereof), based on all the repeating units of the resin, is preferably in the range of 1 to 30 mol %, more preferably 1 to 20 mol %.

It is preferred for the alicyclic hydrocarbon acid-decomposable resin to contain a repeating unit containing an alkali-soluble group, especially a repeating unit containing a carboxyl group. The resolution in contact hole usage can be enhanced by containing this repeating unit.

Both a repeating unit wherein a carboxyl group is directly bonded to the principal chain of a resin and a repeating unit wherein a carboxyl group is bonded via a connecting group to the principal chain of a resin can be mentioned as preferred repeating units containing a carboxyl group.

As examples of the former repeating units, there can be mentioned the repeating units from acrylic acid and methacrylic acid. The connecting group of the latter repeating units may have a mono- or polycycloalkyl structure.

The repeating units from acrylic acid and methacrylic acid are most preferred as the repeating unit containing a carboxyl group.

With respect to the resin that when acted on by an acid, is decomposed to thereby increase its solubility in an alkali developer, the weight average molecular weight thereof in terms of polystyrene molecular weight as measured by GPC is preferably in the range of 2000 to 200,000. In particular, the heat resistance and dry etching resistance can be enhanced by regulating the weight average molecular weight to 2000 or greater. Not only can the developability be particularly enhanced but also through lowering of the viscosity of the composition, the film forming property can be enhanced by regulating the weight average molecular weight to 200,000 or less.

More preferred molecular weight is in the range of 2500 to 50,000. Further more preferred molecular weight is in the range of 3000 to 20,000. In the formation of a nanopattern using electron beams, X-rays or high-energy rays of wavelength 50 nm or shorter (for example, EUV), it is most preferred for the weight average molecular weight to fall within the range of 3000 to 10,000. The enhancement of heat resistance and resolving power, reduction of development defects, etc. of the composition can be simultaneously attained by regulating the molecular weight.

With respect to the resin that when acted on by an acid, is decomposed to thereby increase its solubility in an alkali developer, the dispersity (Mw/Mn) thereof is preferably in the range of 1.0 to 3.0, more preferably 1.2 to 2.5 and further more preferably 1.2 to 1.6. For example, the line edge roughness performance can be enhanced by regulating this dispersity.

The content of the resin (B) is preferably in the range of 5 to 99.9 mass %, more preferably 50 to 95 mass % and further more preferably 60 to 93 mass %, based on the total solids of the composition.

[3] Resin Soluble in Alkali Developer (Hereinafter also Referred to as "Alkali-Soluble Resin")

The negative actinic-ray- or radiation-sensitive resin composition of the present invention may include (C) alkali-soluble resin. The alkali dissolution rate of the alkali-soluble resin as measured in a 0.261 N tetramethylammonium hydroxide (TMAH) (23° C.) is preferably 2 nm/sec or higher, especially preferably 20 nm/sec or higher.

As the alkali-soluble resin, there can be mentioned, for example, a novolak resin, a hydrogenated novolak resin, an acetone-pyrogallol resin, an o-polyhydroxystyrene, a m-polyhydroxystyrene, a p-polyhydroxystyrene, a hydrogenated polyhydroxystyrene, a halogenated or alkylated polyhydroxystyrene, a hydroxystyrene-N-substituted maleimide copolymer, an o/p- and m/p-hydroxystyrene copolymer, a partial O-alkylation product of hydroxyl of polyhydroxystyrene (for example, a 5 to 30 mol % O-methylation product, O-(1-methoxy)ethylation product, O-(1-ethoxy)ethylation product, O-2-tetrahydropyranylation product, O-(t-butoxycarbonyl)methylation product, etc.), an O-acylation product thereof (for example, a 5 to 30 mol % O-acetylation product, O-(t-butoxy)carbonylation product, etc.), a styrene-maleic anhydride copolymer, a styrene-hydroxystyrene copolymer, an α-methylstyrene-hydroxystyrene copolymer, a carboxylated methacrylic resin or its derivative, or a polyvinyl alcohol derivative. However, the alkali-soluble resins are not limited to these.

Preferred alkali-soluble resins are a novolak resin, an o-polyhydroxystyrene, a m-polyhydroxystyrene, a p-polyhydroxystyrene, a copolymer of these polyhydroxystyrenes, an alkylated polyhydroxystyrene, a partial O-alkylation product or O-acylation product of polyhydroxystyrene, a styrene-hydroxystyrene copolymer and an α-methylstyrene-hydroxystyrene copolymer.

Especially preferred alkali-soluble resins are any of the resins having a hydroxystyrene structure. Of these, the resin having a m-hydroxystyrene structure is especially preferred.

The above novolak resin can be obtained by addition condensation of a given monomer as a main component with an aldehyde conducted in the presence of an acid catalyst.

The weight average molecular weight of the alkali-soluble resin is 2000 or greater, preferably from 5000 to 200,000 and more preferably 5000 to 100,000. Herein, the weight average molecular weight is in terms of polystyrene molecular weight measured by gel permeation chromatography.

In the present invention, two or more types of alkali-soluble resins (C) may be used in combination.

The content of alkali-soluble resin, based on the total solids of the composition, is usually in the range of 40 to 97 mass %, preferably 60 to 90 mass %.

[4] Acid Crosslinking Agent Capable of Crosslinking with Alkali-Soluble Resin (C) by the Action of an Acid The negative actinic-ray- or radiation-sensitive resin composition of the present invention may further include an acid crosslinking agent (D).

Any acid crosslinking agent (D) can be used as long as it is a compound capable of crosslinking with alkali-soluble resin (C) by the action of an acid. However, compounds (1) to (3) below are preferred.

(1) A hydroxymethylated form, alkoxymethylated or acyloxymethylated form of phenol derivative.

(2) A compound having an N-hydroxymethyl group, an N-alkoxymethyl group or an N-acyloxymethyl group.

(3) A compound having an epoxy group.

The alkoxymethyl group preferably has 6 or less carbon atoms, and the acyloxymethyl group preferably has 6 or less carbon atoms.

Those especially preferred among these crosslinking agents will be shown below.

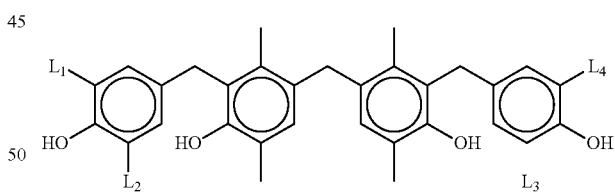

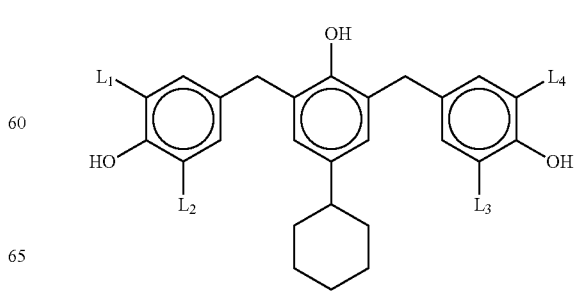

-continued

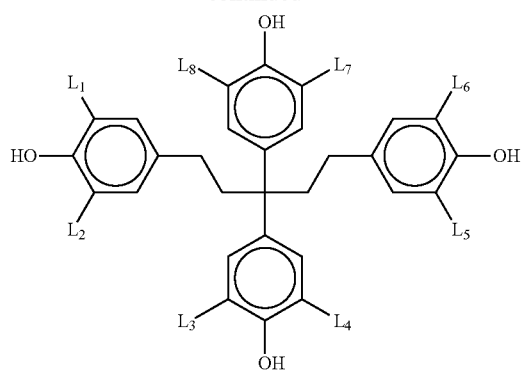

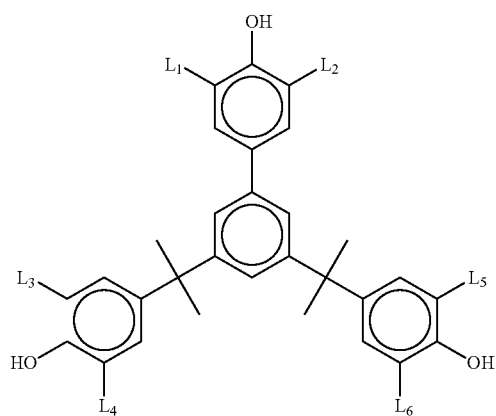

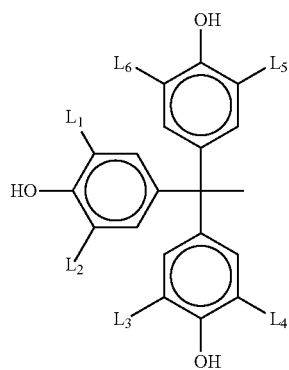

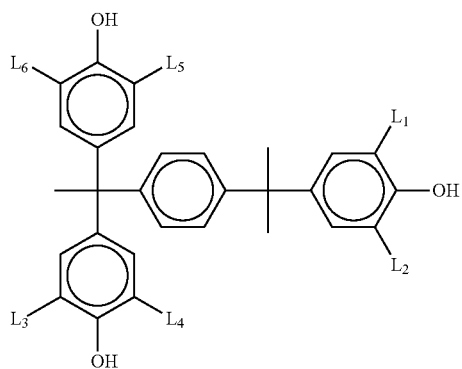

-continued

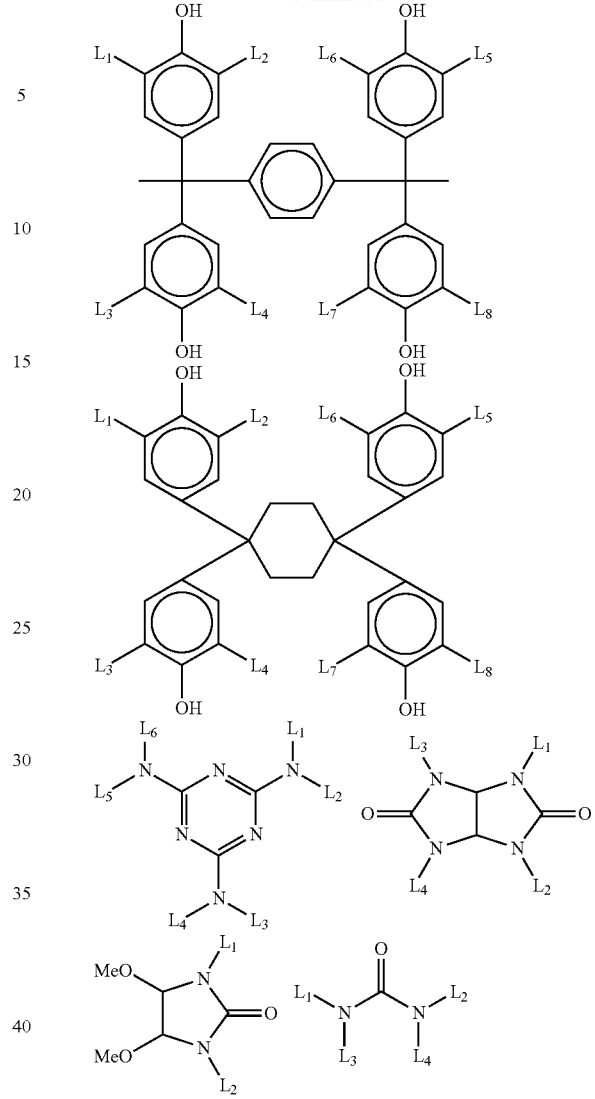

In the formulae, $L_1$ to $L_8$ may be identical to or different from each other, and each thereof represents a hydrogen atom, a hydroxymethyl group, a methoxymethyl group, an ethoxymethyl group or an alkyl group having 1 to 6 carbon atoms.

The crosslinking agent is generally added in an amount of 3 to 70 mass %, preferably 5 to 50 mass %, based on the solid content of the actinic-ray- or radiation-sensitive resin composition.

[5] Dissolution Inhibiting Compound

The composition of the present invention may contain a dissolution inhibiting compound of 3000 or less molecular weight that is decomposed by the action of an acid to thereby increase the solubility in an alkali developer (hereinafter referred to as "dissolution inhibiting compound").

From the viewpoint of preventing any lowering of 220 nm or shorter transmission, the dissolution inhibiting compound is preferably an alicyclic or aliphatic compound having an acid-decomposable group, such as any of cholic acid derivatives having an acid-decomposable group described in Proceeding of SPIE, 2724, 355 (1996). The acid-decomposable group is, for example, the same as described above with respect to the repeating unit having the acid-decomposable group.

When the composition of the present invention is exposed to a KrF excimer laser or irradiated with electron beams, preferred use is made of one having a structure resulting from substitution of the phenolic hydroxyl group of a phenol compound with an acid-decomposable group. The phenol compound preferably contains 1 to 9 phenol skeletons, more preferably 2 to 6 phenol skeletons.

The amount of dissolution inhibiting compound added is preferably in the range of 3 to 50 mass %, more preferably 5 to 40 mass % based on the total solids of the composition of the present invention.

Specific examples of the dissolution inhibiting compounds will be shown below, which however in no way limit the scope of the present invention.

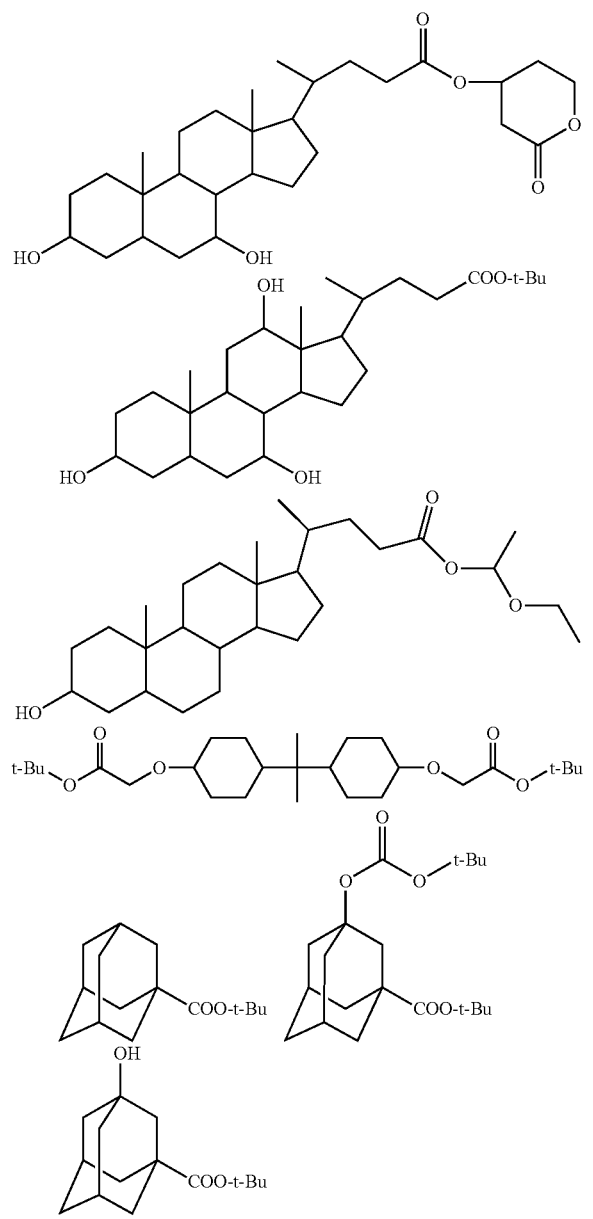

<Other Component>

The composition of the present invention may further contain a basic compound, an organic solvent, a surfactant, a dye, a plasticizer, a photosensitizer, a compound capable of increasing the solubility in a developer, a compound having a functional group as a proton acceptor, etc.

(Basic Compound)

The composition of the present invention may further contain a basic compound. Any change over time of performance during the period between exposure and baking (postbake) can be reduced by further containing a basic compound. Moreover, the in-film diffusion of an acid generated upon exposure can be controlled by further containing a basic compound.

It is preferred for the basic compound to be a nitrogenous organic compound. Useful compounds are not particularly limited. For example, the compounds of the following categories (1) to (4) can be used.

(1) Compounds of general formula (BS-1) below

(BS-1)

In general formula (BS-1), each of Rs independently represents a hydrogen atom or an organic group. The organic group is preferably any of a linear or branched alkyl group, a cycloalkyl group (monocyclic or polycyclic), an aryl group and an aralkyl group.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

In the compounds of general formula (BS-1), preferably, at least the two of the three Rs are organic groups.

Specific examples of the compounds of general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline and the like.

In the general formula (BS-1), any of the compounds in which at least one of the Rs is a hydroxylated alkyl group can be mentioned as a preferred form of the basic compounds. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —CH$_2$CH$_2$O—. As particular examples thereof, there can be mentioned tris(methoxyethoxyethyl)amine, compounds shown by way of example in column 3 line 60 et seq. of U.S. Pat. No. 6,040,112 and the like.

(2) Compound with Nitrogenous Heterocyclic Structure

The heterocyclic structure may optionally have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]-undec-7-ene and the like.

(3) Amine Compound with Phenoxy Group

The amine compounds with a phenoxy group are those having a phenoxy group at the end of the alkyl group of each of the amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —CH$_2$CH$_2$O— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown by way of example in section [0066] of US 2007/0224539 A1 and the like.

(4) Ammonium Salt

Ammonium salts can also be appropriately used. Hydroxides and carboxylates are preferred. Preferred particular examples thereof are tetraalkylammonium hydroxides, a typical example of which is tetrabutylammonium hydroxide.

As other compounds usable in the composition of the present invention, there can be mentioned compounds synthesized in Examples of JP-A-2002-363146, compounds described in section [0108] of JP-A-2007-298569 and the like.

Further, photosensitive basic compounds may be used as the basic compound. As photosensitive basic compounds, use can be made of, for example, the compounds described in Jpn. PCT National Publication No. 2003-524799, J. Photopolym. Sci&Tech. Vol. 8, p. 543-553 (1995), etc.

The molecular weight of each of these basic compounds is preferably in the range of 250 to 2000, more preferably 400 to 1000.

These basic compounds are used individually or in combination.

The content of basic compounds based on the total solids of the composition is preferably in the range of 0.01 to 8.0 mass %, more preferably 0.1 to 5.0 mass % and most preferably 0.2 to 4.0 mass %.

(F) Surfactant

The composition of the present invention further contains a surfactant. The surfactant is preferably a fluorinated and/or siliconized surfactant.

As such a surfactant, there can be mentioned Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., polysiloxane polymer KP-341 produced by Shin-Etsu Chemical Co., Ltd., or the like.

Surfactants other than these fluorinated and/or siliconized surfactants can also be used. In particular, the other surfactants include polyoxyethylene alkyl ethers, polyoxyethylene alkyl aryl ethers and the like.

Moreover, generally known surfactants can also be appropriately used. As useful surfactants, there can be mentioned, for example, those described in section [0273] et seq of US 2008/0248425 A1.

These surfactants may be used alone or in combination.

The amount of surfactant added is preferably in the range of 0.0001 to 2 mass %, more preferably 0.001 to 1 mass %, based on the total solids of the composition.

[Solvent]

The solvent that is usable in the preparation of the composition is not particularly limited as long as it can dissolve the components of the composition. For example, preferred use is made of a solvent containing either one or two or more members selected from among an alkylene glycol monoalkyl ether carboxylate (propylene glycol monomethyl ether acetate or the like), an alkylene glycol monoalkyl ether (propylene glycol monomethyl ether or the like), an alkyl lactate (ethyl lactate, methyl lactate or the like), a cyclolactone (γ-butyrolactone or the like, preferably having 4 to 10 carbon atoms), a linear or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxyacetate (preferably ethyl ethoxypropionate) and the like. As other useful solvents, there can be mentioned, for example, those described in section [0244] et seq. of US 2008/0248425 A1 and the like.

Among the above solvents, an alkylene glycol monoalkyl ether carboxylate, an alkylene glycol monoalkyl ether and an ethyl lactate are preferred.

These solvents may be used alone or in combination. When a plurality of solvents are mixed together, it is preferred to mix a hydroxylated solvent with a non-hydroxylated solvent. The mass ratio of hydroxylated solvent to non-hydroxylated solvent is in the range of 1/99 to 99/1, preferably 10/90 to 90/10 and more preferably 20/80 to 60/40.

The hydroxylated solvent is preferably an alkylene glycol monoalkyl ether or an alkyl lactate. The non-hydroxylated solvent is preferably an alkylene glycol monoalkyl ether carboxylate.

The ratio of solvents used to the total mass of the composition of the present invention may be regulated so that the concentration of the total solids of the composition falls within the range of 0.5 to 30 mass %, preferably 1.0 to 10 mass %. When the actinic-ray- or radiation-sensitive resin composition of the present invention is irradiated with electron beams or EUV light, the ratio of solvents may be regulated so that the concentration of the total solids of the composition falls within the range of 2.0 to 6.0 mass %, preferably 2.0 to 4.5 mass %.

[Other Additives]

The composition of the present invention may further according to necessity contain a dye, a plasticizer, a photosensitizer, a light absorber, a compound capable of increasing the solubility in a developer (for example, a phenolic compound of 1000 or less molecular weight or a carboxylated alicyclic or aliphatic compound), etc. Moreover, the compounds having a functional group as a proton acceptor described in, for example, JP-A's 2006-208781 and 2007-286574 can also be appropriately used in the composition of the present invention.

<Method of Forming Pattern>

According to one embodiment, the actinic-ray- or radiation-sensitive resin composition of the present invention is applied to a support, such as a substrate, thereby forming a film. The thickness of thus obtained resist film is preferably in the range of 0.02 to 0.1 μm. The application to the substrate is preferably carried out by a spin coating method. The rotating speed of spin coating is preferably in the range of 1000 to 3000 rpm.

For example, this composition is applied to any of substrates (e.g., silicon/silicon dioxide coating, silicon nitride and chromium-vapor-deposited quartz substrate, etc.) for use in the production of precision integrated circuit devices, etc. by appropriate application means, such as a spinner or a coater. The thus applied composition is dried, thereby forming an actinic-ray- or radiation-sensitive film (hereinafter also referred to as a photosensitive film). The application of the composition can be preceded by the application of a heretofore known antireflection film.

The resultant photosensitive film is exposed to actinic rays or radiation, preferably baked (heated), and developed. Thus, a pattern of enhanced quality can be obtained. From the viewpoint of sensitivity and stability, it is preferred for the baking temperature to be in the range of 80 to 150° C., especially 90 to 130° C.

As the actinic rays or radiation, there can be mentioned, for example, infrared light, visible light, ultraviolet light, far-ultraviolet light, extreme ultraviolet light, X-rays or electron beams. It is preferred for the actinic rays or radiation to have, for example, a wavelength of 250 nm or shorter, especially 220 nm or shorter. As such actinic rays or radiation, there can be mentioned, for example, a KrF excimer laser (248 nm), an ArF excimer laser (193 nm), an $F_2$ excimer laser (157 nm), X-rays or electron beams. As especially preferred actinic rays or radiation, there can be mentioned an ArF excimer laser, an $F_2$ excimer laser, EUV (13 nm) or electron beams.

The exposure performed in the condition that the interstice between the photosensitive film and a lens is filled with a liquid (for example, pure water) whose refractive index is higher than that of air, namely, liquid-immersion exposure may be carried out in the stage of the exposure to actinic rays or radiation. This liquid-immersion exposure can enhance the resolution. At the liquid-immersion exposure, for the prevention of contact of the film with the immersion liquid, a film that is highly insoluble in the immersion liquid (also referred to as a "top coat") may be disposed on the film and between the film and the immersion liquid. As another means for the prevention of contact of the film with the immersion liquid, a hydrophobic resin (HR) may be added to the composition in advance.

The hydrophobic resin (HR) will be described in detail below.

As the hydrophobic resin is localized in a surface portion of the resist film, it is preferred for the hydrophobic resin to contain a fluorine atom or a silicon atom. The fluorine atom or silicon atom may be introduced in the principal chain of a resin, or may be contained in a side chain thereof as a substituent.

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

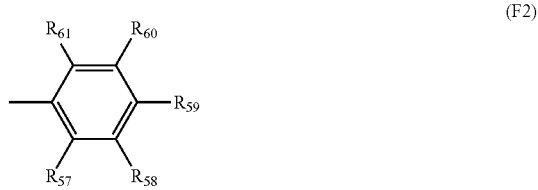

(F2)

(F3)

(F4)

In general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —$C(CF_3)_2OH$, —$C(C_2F_5)_2OH$, —$C(CF_3)(CF_3)OH$, —$CH(CF_3)OH$ and the like. —$C(CF_3)_2OH$ is preferred.

The hydrophobic resin (HR) may contain a silicon atom. It is preferred for the resin to have an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

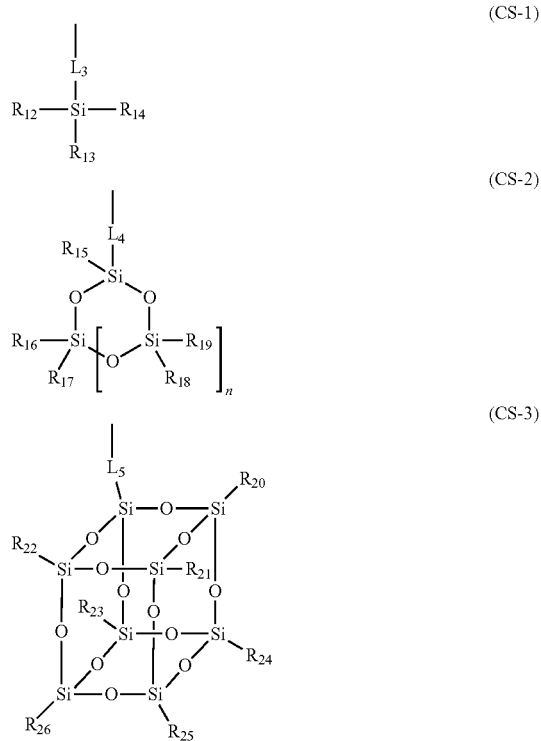

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5. n is preferably an integer of 2 to 4.

Moreover, the hydrophobic resin (HR) may have at least one group selected from among the following groups (x) to (z):

(x) an alkali soluble group, (y) a group that is decomposed by the action of an alkali developer, resulting in an increase of solubility in the alkali developer, and (z) a group that is decomposed by the action of an acid.

As the alkali soluble group (x), generally known compounds can be used. As preferred alkali soluble groups, there can be mentioned a fluoroalcohol group (preferably hexafluoroisopropanol), a sulfonimido group and a bis(carbonyl) methylene group. The content of repeating units having an alkali soluble group (x) is preferably in the range of 1 to 50 mol %, more preferably 3 to 35 mol % and still more preferably 5 to 20 mol % based on all the repeating units of the polymer.

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content of repeating units having a group (y) resulting in an increase of solubility in an alkali developer is preferably in the range of 1 to 40 mol %, more preferably 3 to 30 mol % and still more preferably 5 to 15 mol % based on all the repeating units of the polymer.

As specific examples of the repeating units having a group (y) resulting in an increase of solubility in an alkali developer, there can be mentioned those similar to the repeating units having a lactone structure set forth with respect to the resins as the component (B).

As the repeating unit having a group (z) that is decomposed by the action of an acid in the hydrophobic resin (HR), there can be mentioned those similar to the repeating units having an acid decomposable group set forth with respect to the resin (A). The content of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the polymer.

The hydrophobic resin (HR) may further have any of the repeating units of general formula (III), below.

In general formula (III), $R_{c31}$ represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group and a cycloalkenyl group. These groups may optionally be substituted with a fluorine atom or a silicon atom.

$L_{c3}$ represents a single bond or a bivalent connecting group.

In general formula (III), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (group of the formula —COO—).

Specific examples of the hydrophobic resins (HR) will be shown below, which however in no way limit the scope of the present invention.

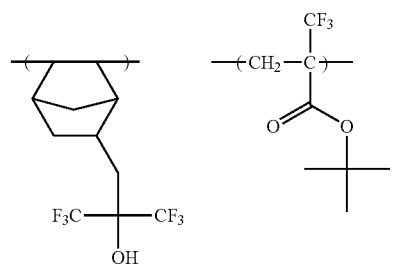
(HR-5)

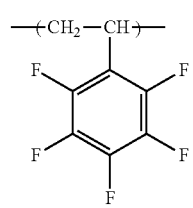
(HR-6)

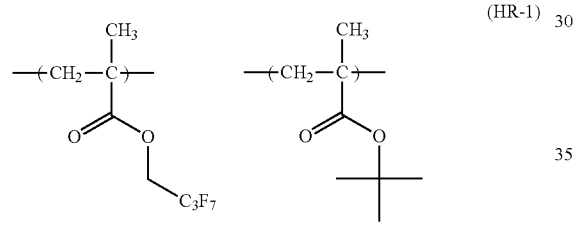
(HR-1)

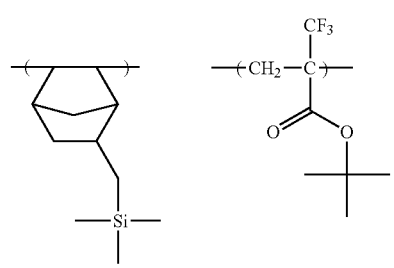
(HR-7)

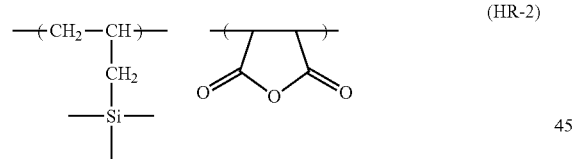
(HR-2)

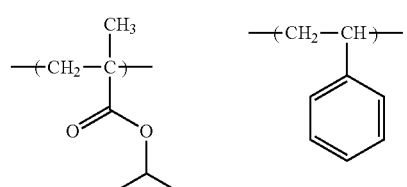
(HR-8)

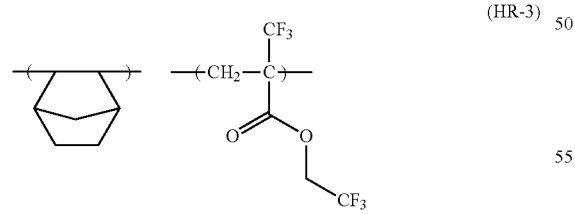
(HR-3)

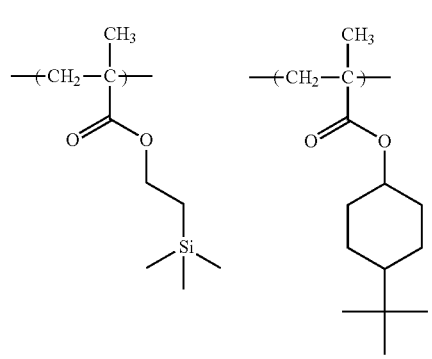
(HR-9)

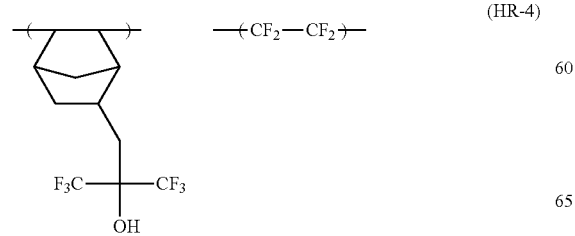
(HR-4)

(HR-10) 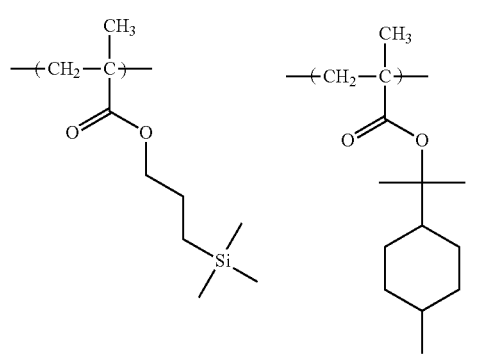
(HR-11) 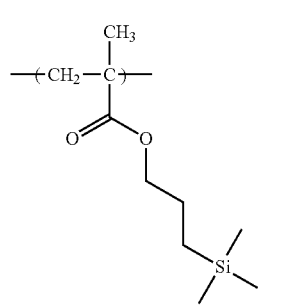
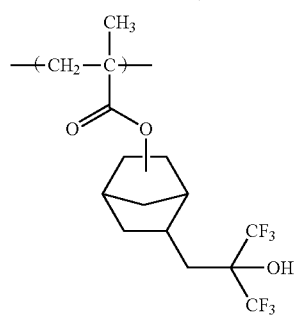
(HR-12) 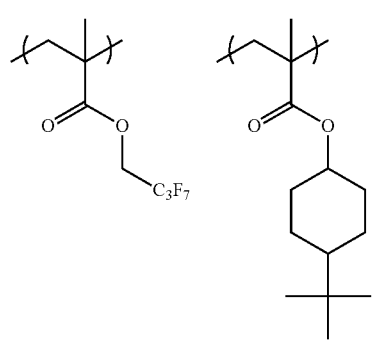
(HR-13) 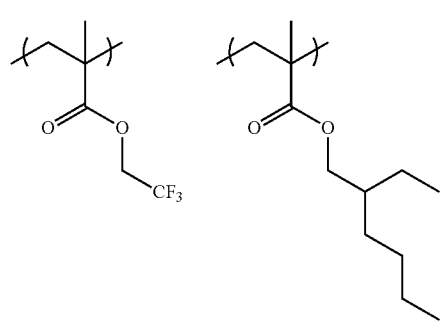
(HR-14) 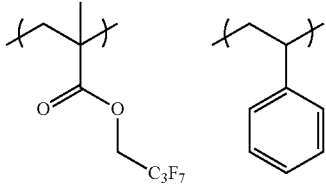
(HR-15) 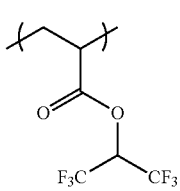
(HR-16) 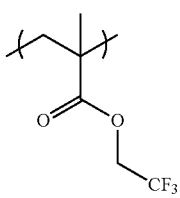
(HR-17) 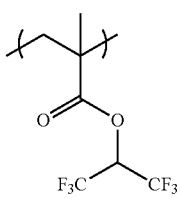
(HR-18) 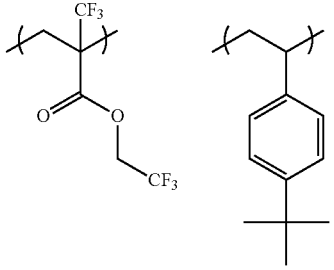
(HR-19) 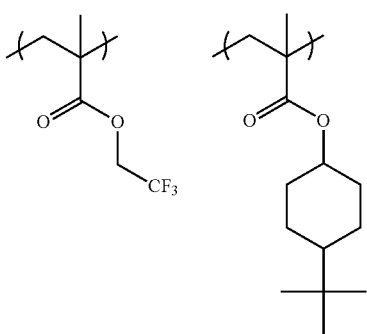

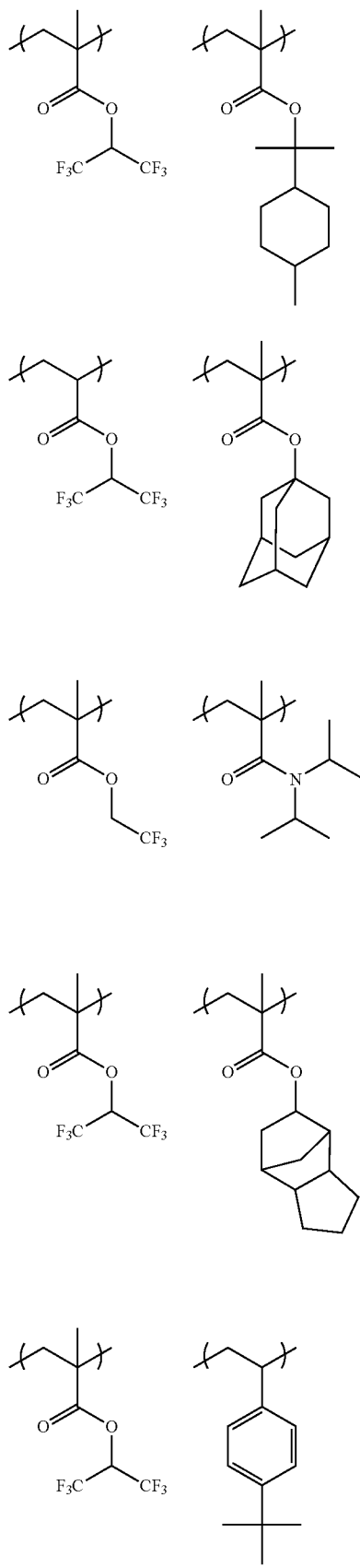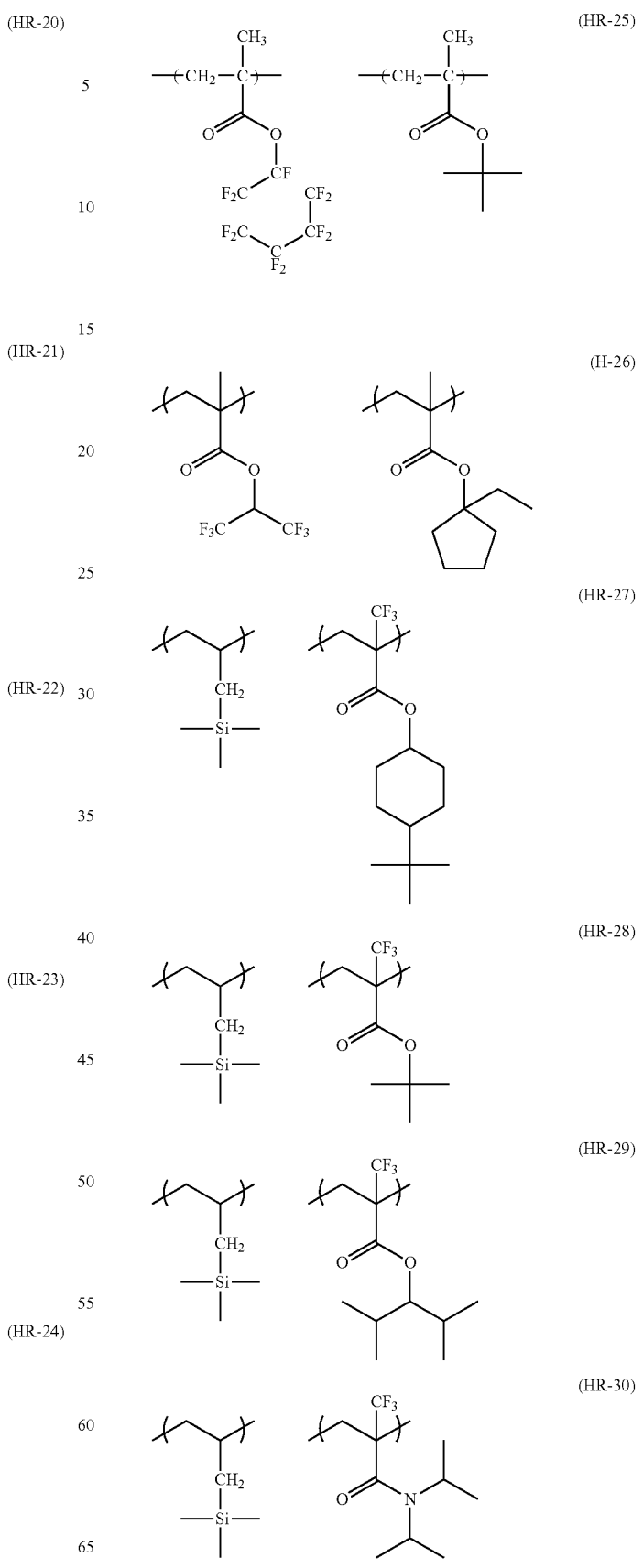

-continued
(HR-31)
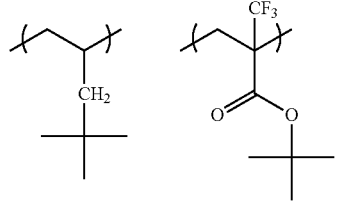
(HR-32)
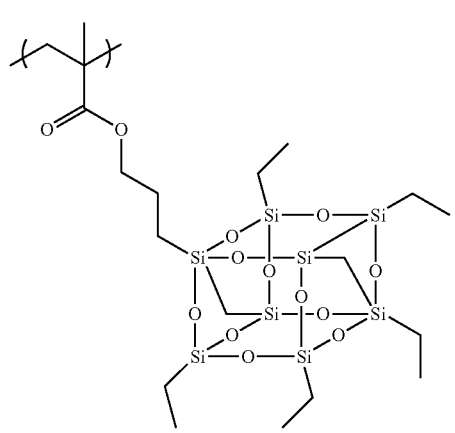
(HR-33)
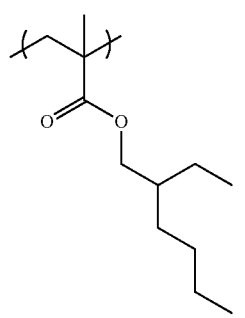
(HR-34)
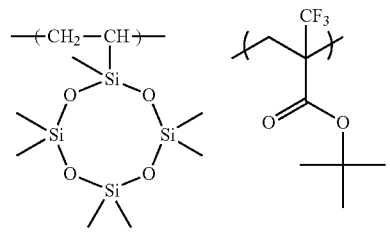
(HR-35)
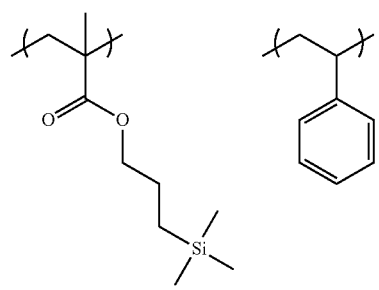
(HR-36)
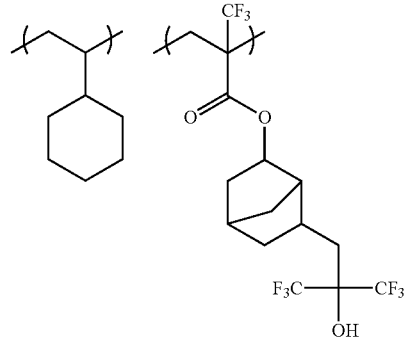
(HR-37)
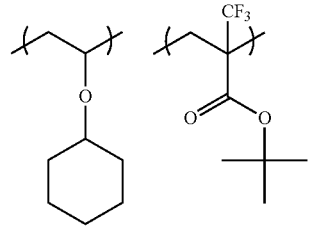
(HR-38)
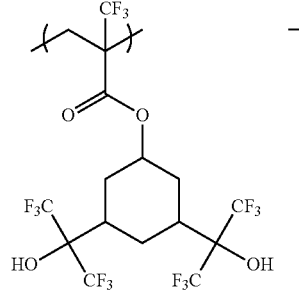
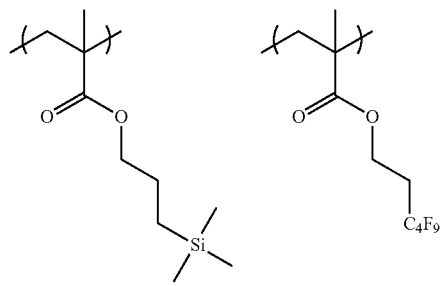
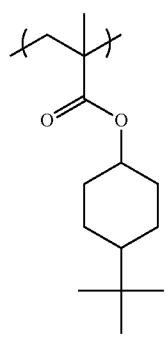

(HR-39) 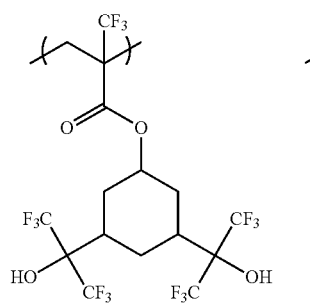 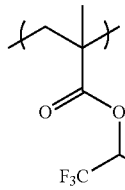
(HR-40) 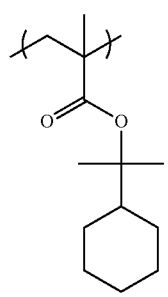 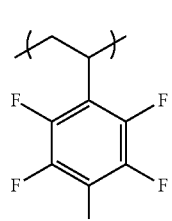
(HR-41) 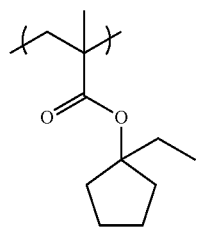 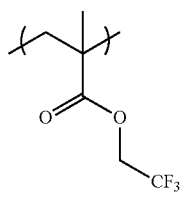
(HR-42) 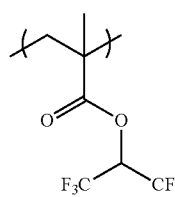 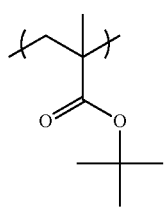
(HR-43) 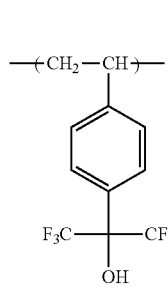 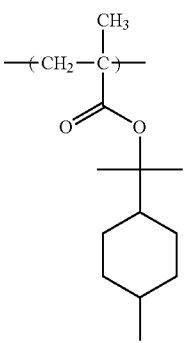
(HR-44) 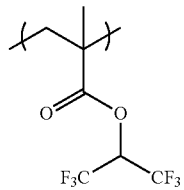 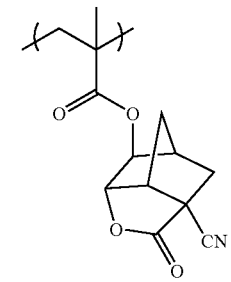
(HR-45) 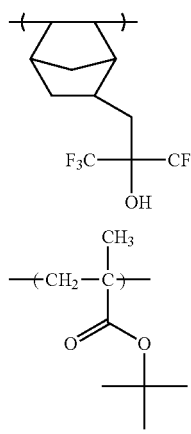 
(HR-46) 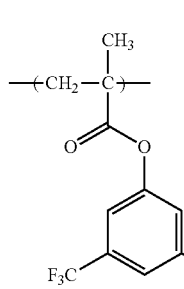 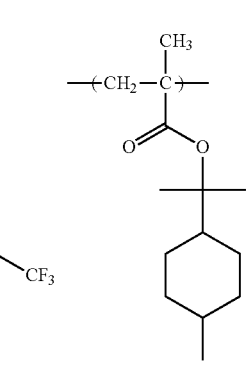
(HR-47) 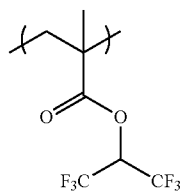 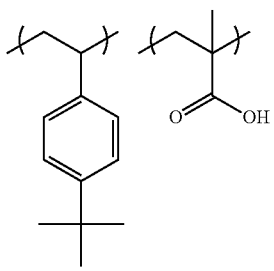
(HR-48) 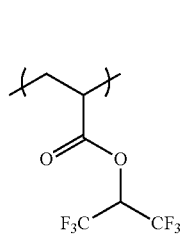 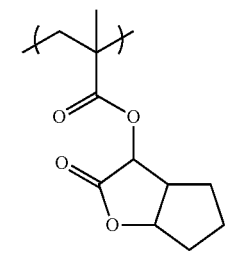

(HR-49)
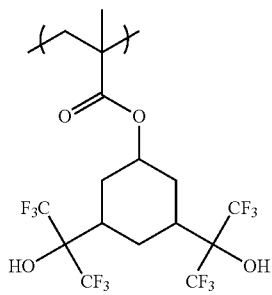
(HR-50)
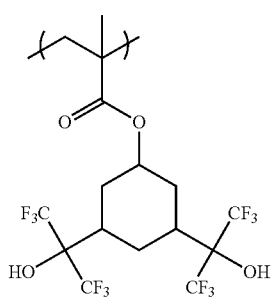 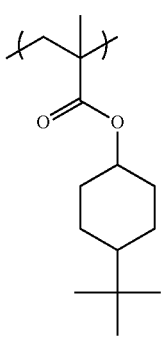
(HR-51)
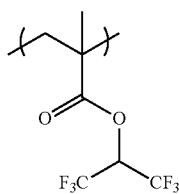 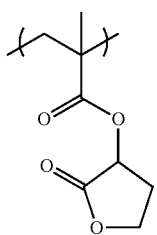 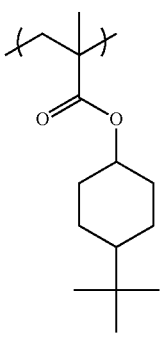
(HR-52)
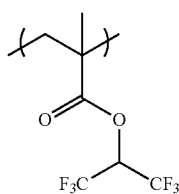 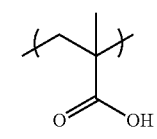
(HR-53)
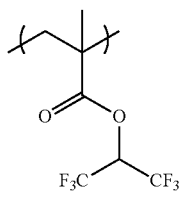 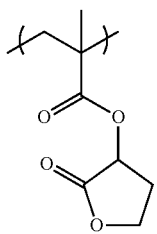
(HR-54)
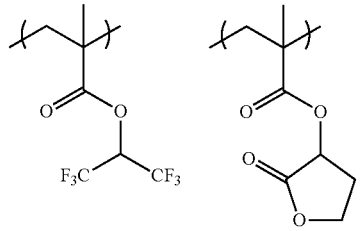
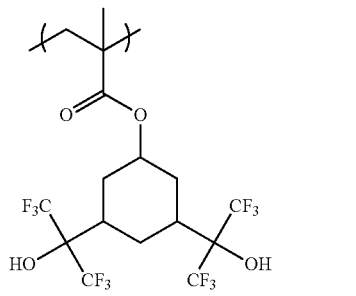
(HR-55)
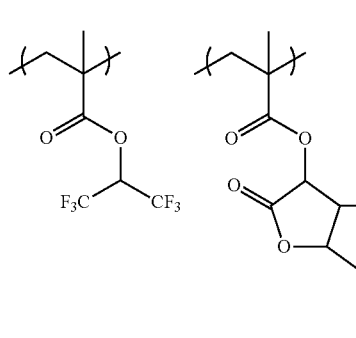
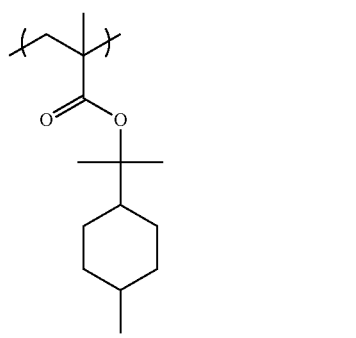
(HR-56)
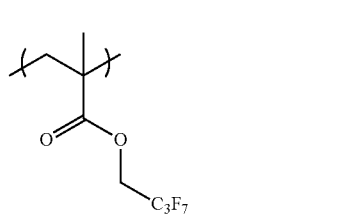
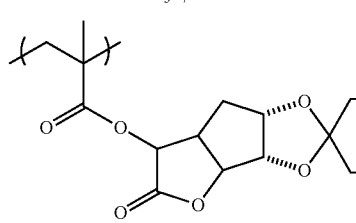

(HR-57)
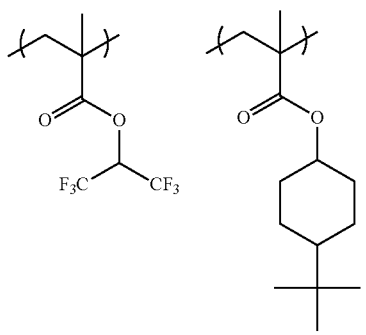
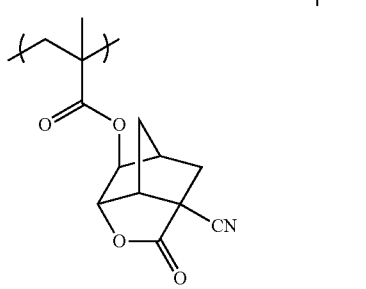
(HR-58)
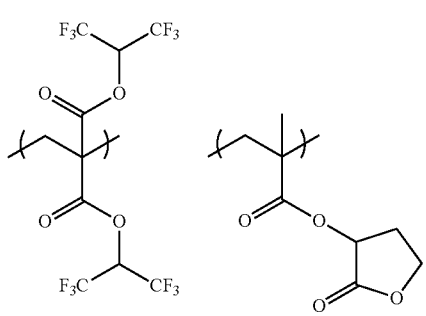
(HR-59)
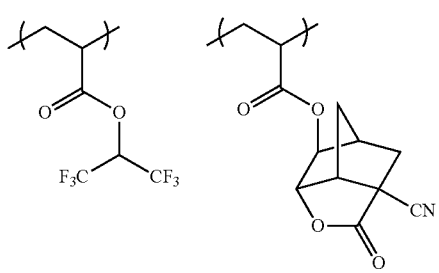
(HR-60)
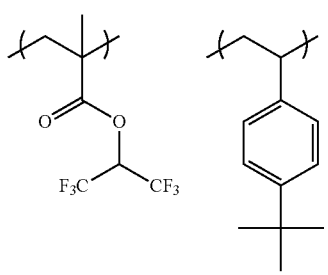
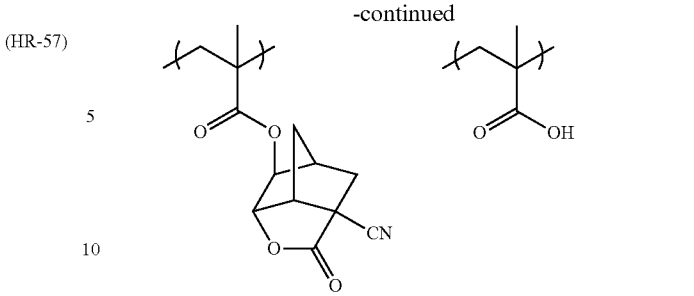
(HR-61)
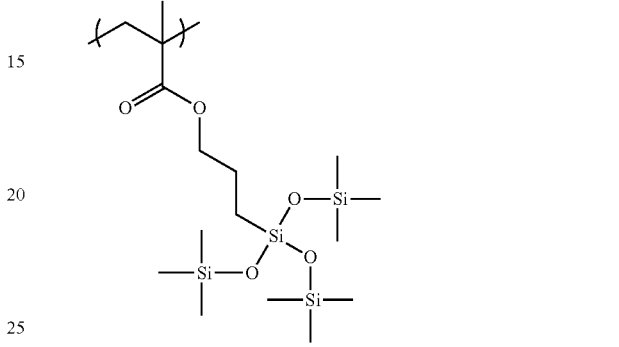
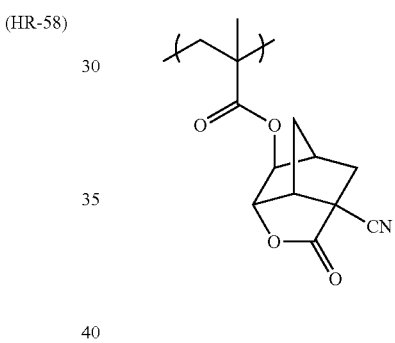
(HR-62)
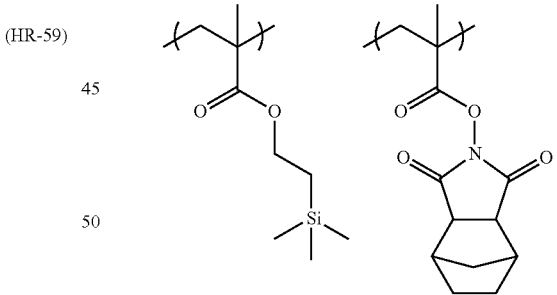
(HR-63)
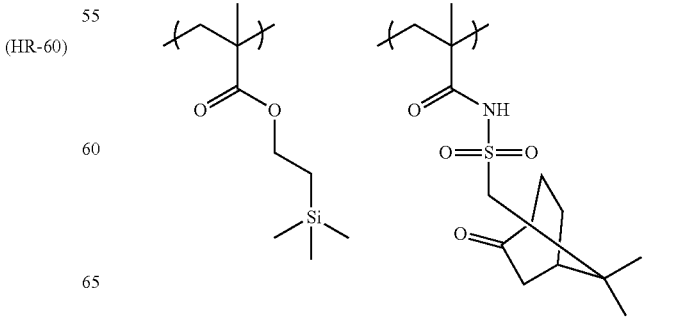

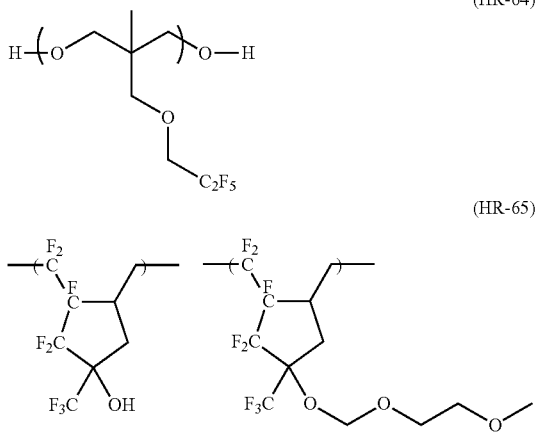

When the hydrophobic resin (HR) is added, the amount of the hydrophobic resin (HR) added is generally in the range of 0.01 to 10 mass %, preferably 0.05 to 8 mass % and more preferably 0.1 to 5 mass %, based on the total solid of the composition.

In the development step, an alkali developer is usually employed. As the alkali developer, use can be made of any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, or the like.

Appropriate amounts of an alcohol and/or a surfactant may be added to the above alkali developer.

The alkali concentration of the alkali developer is generally in the range of 0.1 to 20 mass %. The pH value of the alkali developer is generally in the range of 10.0 to 15.0.

With respect to the particulars of the process for fabricating an imprint mold using the composition of the present invention, reference can be made to, for example, Japanese Patent No. 4109085, JP-A-2008-162101, "Fundamentals of nanoimprint and its technology development/application deployment—technology of nanoimprint substrate and its latest technology deployment" edited by Yoshihiko Hirai, published by Frontier Publishing, etc.

Example

The present invention will be described in greater detail below by way of its examples. However, the gist of the present invention is in no way limited to these examples.

<Synthesis of Acid Generator A1>

(1) Synthesis of Compound A1-1

First, 20.0 g of 2,4,6-tricyclohexylbromobenzene was dissolved in 800 ml of diethyl ether. In a nitrogen atmosphere, 6.0 g of tetramethylethylenediamine and 31.9 ml of n-butyllithium (1.63M hexane solution) were added to the solution at 0° C., and agitated at 0° C. for an hour. The resultant reaction liquid was dropped into a solution obtained by dissolving 15.7 g of 1,1,2,2,3,3-hexafluoropropane-1,3-disulfonyl difluoride in 200 ml of diethyl ether at 0° C. over a period of 30 minutes.

After the completion of dropping, the mixture was further agitated for 30 minutes, and 200 ml of distilled water was added thereto. The thus obtained organic phase was washed with saturated saline twice. The solvent was removed, and 100 ml of methanol and 100 ml of 1N aqueous sodium hydroxide solution were added to the residue and agitated for an hour. Methanol was distilled off, and ethyl acetate was added to the residue. The thus obtained organic phase was washed with saturated saline twice. The solvent was distilled off, and the thus obtained solid was washed with hexane. The resultant solid was dissolved in 100 ml of methanol, and 10 g of triphenylsulfonium bromide A was added to the solution and agitated for two hours. The solvent was distilled off, and ethyl acetate was added to the residue. The thus obtained organic phase was sequentially washed with a saturated aqueous sodium hydrogen carbonate solution and water. The solvent was distilled off, thereby obtaining 23.5 g of desired white solid compound (A1-1).

$^1$H-NMR (300 MHz, CDCl$_3$) δ=7.76-7.70 (m, 15H), 7.19 (s, 2H), 3.65 (m, 2H), 2.52 (m, 1H), 1.18-1.92 (m, 30H).

$^{19}$F-NMR (300 MHz, CDCl$_3$) δ=−140.90 (t, 2F), −144.5 (t, 2F), −149.4 (s, 2F).

(2) Synthesis of Compound A1-2

Compound A1-2 amounting to 5.1 g was obtained in the same manner as in the synthesis of compound A1-1 except that 20.0 g of 2,4,6-tricyclohexylbromobenzene was changed to 5.0 g of 2,4,6-triisopropylbromobenzene.

(3) Synthesis of Compound A1-3

Compound A1-3 amounting to 5.1 g was obtained in the same manner as in the synthesis of compound A1-1 except that 10.0 g of triphenylsulfonium bromide A was changed to 4.5 g of sulfonium salt (B), below.

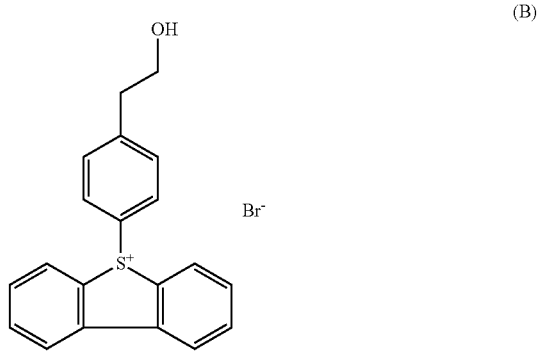

(4) Synthesis of Compound A1-4

Compound A1-4 amounting to 2.5 g was obtained in the same manner as in the synthesis of compound A1-1 except that 10.0 g of triphenylsulfonium bromide A was changed to 4.5 g of iodonium salt (C), below, and except that 20.0 g of 2,4,6-tricyclohexylbromobenzene was changed to 2.0 g of 2,4,6-tri-tert-buthylbromobenzene.

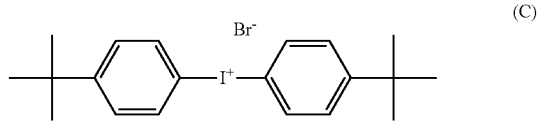

(5) Synthesis of Compound A1-5

Compound A1-5 amounting to 3.5 g was obtained in the same manner as in the synthesis of compound A1-1 except that 10.0 g of triphenylsulfonium bromide A was changed to 2.5 g of sulfonium salt (D), below.

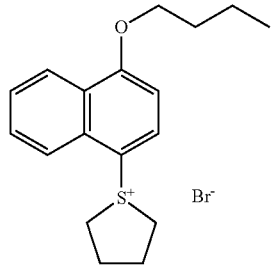

(D)

(6) Synthesis of Compound A1-6

Compound A1-6 amounting to 1.3 g was obtained in the same manner as in the synthesis of compound A1-1 except that 10.0 g of triphenylsulfonium bromide A was changed to 1.2 g of sulfonium salt (E), below.

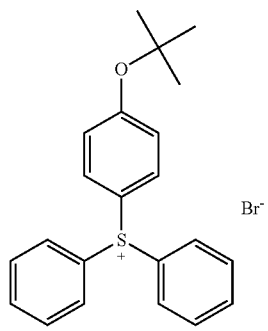

(E)

(7) Synthesis of Compound A1-7

Compound A1-7 amounting to 1.4 g was obtained in the same manner as in the synthesis of compound A1-1 except that 10.0 g of triphenylsulfonium bromide A was changed to 1.4 g of sulfonium salt (F), below.

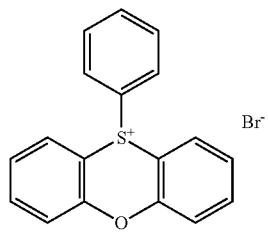

(F)

(8) Synthesis of Compound A1-8

Compound A1-8 amounting to 1.9 g was obtained in the same manner as in the synthesis of compound A1-1 except that 10.0 g of triphenylsulfonium bromide A was changed to 1.5 g of sulfonium salt (G), below.

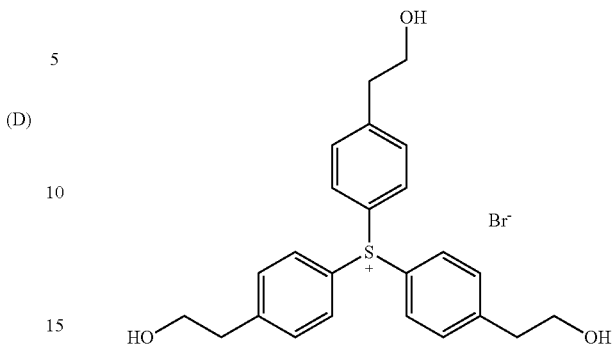

(G)

(9) Synthesis of Compound A1-9

Compound A1-9 amounting to 1.6 g was obtained in the same manner as in the synthesis of compound A1-1 except that 10.0 g of triphenylsulfonium bromide A was changed to 1.2 g of sulfonium salt (H), below.

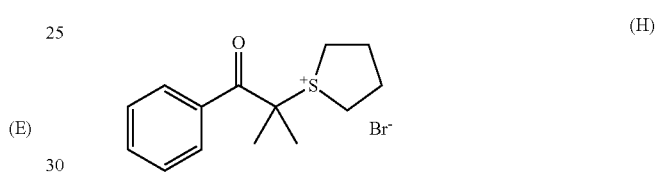

(H)

(10) Synthesis of Compound A1-10

First, 20.0 g of 2,4,6-tricyclohexylbromobenzene was dissolved in 800 ml of diethyl ether. In a nitrogen atmosphere, 6.0 g of tetramethylethylenediamine and 31.9 ml of n-butyllithium (1.63M hexane solution) were added to the solution at 0° C., and agitated at 0° C. for an hour. The resultant reaction liquid was dropped into a solution obtained by dissolving 15.7 g of 1,1,2,2,3,3-hexafluoropropane-1,3-disulfonyl difluoride in 200 ml of diethyl ether at 0° C. over a period of 30 minutes. After the completion of dropping, the mixture was further agitated for 30 minutes, and 1.43 g of sodium hydroxide and 8.87 g of trifluorosulfonamide were added thereto. The mixture was agitated at 0° C. for an hour, and 200 ml of distilled water was added thereto. The thus obtained organic phase was washed with saturated saline twice. The solvent was removed, and the thus obtained solid was washed with hexane. The resultant solid was dissolved in 100 ml of methanol, and 10 g of triphenylsulfonium bromide A was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, thereby obtaining 10.5 g of compound A1-10.

(11) Synthesis of Compound A1-11

First, 17.0 g of 2,4,6-tricyclohexylphenol was dissolved in 800 ml of diethyl ether. In a nitrogen atmosphere, 31.0 ml of n-butyllithium (1.63M hexane solution) was added to the solution at 0° C., and agitated at 0° C. for an hour. The solvent was distilled off in vacuum, and 32.8 g of triphenylsulfonium 1,1,2,2,3,3-hexafluoro-4-[(trifluoromethane)sulfonyloxy]butane-1-sulfonate and 300 ml of N,N-dimethylformamide were added to the residue and agitated at 100° C. for two hours. The obtained reaction liquid was poured in 500 ml of ethyl acetate and 500 ml of dilute hydrochloric acid, and liquid separation was carried out. The thus obtained organic phase was sequentially washed with a saturated aqueous sodium hydrogen carbonate solution and water, and the solvent was removed. The residue was dissolved in 200 ml of methanol, and 10 g of triphenylsulfonium bromide was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, and the residue was purified through a silica gel column, thereby obtaining 15.6 g of compound A1-11.

(12) Synthesis of Compound A1-12

Compound A1-12 amounting to 12.5 g was obtained in the same manner as in the synthesis of compound A1-11 except that 32.8 g of triphenylsulfonium 1,1,2,2,3,3-hexafluoro-4-[(trifluoromethane)sulfonyloxy]butane-1-sulfonate was changed to 27.8 g of triphenylsulfonium 1,1-difluoro-2-[(trifluoromethane)sulfonyloxy]ethane-1-sulfonate.

(13) Synthesis of Compound A1-13

First, 20.0 g of 2,4,6-tricyclohexylbromobenzene was dissolved in 800 ml of diethyl ether. In a nitrogen atmosphere, 6.0 g of tetramethylethylenediamine and 31.9 ml of n-butyllithium (1.63M hexane solution) were added to the solution at 0° C., and agitated at 0° C. for an hour. The resultant reaction liquid was dropped into a solution obtained by dissolving 11.5 g of 2,2,3,3-tetrafluoro-3-(fluorosulfonyl)propanoyl fluoride in 200 ml of diethyl ether at −20° C. over a period of 30 minutes. After the completion of dropping, the mixture was agitated at −20° C. for 30 minutes and further at room temperature for 30 minutes, and 200 ml of distilled water was added thereto. The thus obtained organic phase was washed with saturated saline twice. The solvent was removed, and 100 ml of methanol and 100 ml of 1N aqueous sodium hydroxide solution were added to the residue and agitated for an hour. Methanol was distilled off, and ethyl acetate was added to the residue. The thus obtained organic phase was washed with saturated saline twice. The solvent was distilled off, and the thus obtained solid was washed with hexane. The resultant solid was dissolved in 100 ml of methanol, and 10 g of triphenylsulfonium bromide was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, and the residue was purified through a silica gel column, thereby obtaining 10.7 g of compound A1-13.

(14) Synthesis of Compound A1-14

First, 23.8 g of triphenylsulfonium 1,1,2,2-tetrafluoro-3-hydroxypropane-1-sulfonate was dissolved in 300 ml of methanol, and 10 ml of sodium methoxide (5M methanol solution) was added to the solution at 0° C. The resultant reaction liquid was agitated at room temperature for an hour, and the solvent was distilled off. Thereafter, 18.7 g of 2-(chloromethyl)-1,3,5-tricyclohexylbenzene and 300 ml of N,N-dimethylformamide were added to the residue, and agitated at 100° C. for three hours. The obtained reaction liquid was poured in 500 ml of ethyl acetate and 500 ml of dilute hydrochloric acid, and liquid separation was carried out. The thus obtained organic phase was sequentially washed with a saturated aqueous sodium hydrogen carbonate solution and water, and the solvent was removed. The residue was dissolved in 200 ml of methanol, and 10 g of triphenylsulfonium bromide was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, and the residue was purified through a silica gel column, thereby obtaining 17.4 g of compound A1-14.

(15) Synthesis of Compound A1-15

Compound A1-15 amounting to 16.3 g was obtained in the same manner as in the synthesis of compound A1-14 except that 23.8 g of triphenylsulfonium 1,1,2,2-tetrafluoro-3-hydroxypropane-1-sulfonate was changed to 23.5 g of triphenylsulfonium 1,1,2-trifluoro-4-hydroxybutanesulfonate.

(16) Synthesis of Compound A1-16

First, 17.0 g of 2,4,6-tricyclohexylphenol was dissolved in 800 ml of diethyl ether. In a nitrogen atmosphere, 31.0 ml of n-butyllithium (1.63M hexane solution) was added to the solution at 0° C., and agitated at 0° C. for an hour. The solvent was distilled off in vacuum, and the residue was dissolved in 300 ml of N,N-dimethylformamide. At −20° C., 9.0 g of 2,2-difluoro-2-(fluorosulfonyl)acetyl fluoride was dropped into the solution. After the completion of dropping, the mixture was agitated at −20° C. for an hour and further at room temperature for 30 minutes, and 500 ml of dilute hydrochloric acid and 500 ml of ethyl acetate were added thereto. The thus obtained organic phase was sequentially washed with a saturated aqueous sodium hydrogen carbonate solution and water. The solvent was removed, and 100 ml of methanol and 100 ml of 1N aqueous sodium hydroxide solution were added to the residue and agitated for an hour. Methanol was distilled off, and ethyl acetate was added to the residue. The thus obtained organic phase was washed with saturated saline twice. The solvent was distilled off, and the thus obtained solid was washed with hexane. The resultant solid was dissolved in 100 ml of methanol, and 10 g of triphenylsulfonium bromide was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, and the residue was purified through a silica gel column, thereby obtaining 9.9 g of compound A1-16.

(17) Synthesis of Compound A1-17

At −20° C., 9.0 g of 2,2-difluoro-2-(fluorosulfonyl)acetyl fluoride was dropped into a solution obtained by dissolving 17.0 g of 2,4,6-tricyclohexylaniline and 10.0 g of triethylamine in 200 ml of dimethylacetamide. After the completion of dropping, the mixture was agitated at −20° C. for an hour and further at room temperature for 30 minutes, and 500 ml of dilute hydrochloric acid and 500 ml of ethyl acetate were added thereto. The thus obtained organic phase was sequentially washed with a saturated aqueous sodium hydrogen carbonate solution and water. The solvent was removed, and 100 ml of methanol and 100 ml of 1N aqueous sodium hydroxide solution were added to the residue and agitated for an hour. Methanol was distilled off, and ethyl acetate was added to the residue. The thus obtained organic phase was washed with saturated saline twice. The solvent was distilled off, and the thus obtained solid was washed with hexane. The resultant solid was dissolved in 100 ml of methanol, and 10 g of triphenylsulfonium bromide was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, and the residue was purified through a silica gel column, thereby obtaining 11.8 g of compound A1-17.

(18) Synthesis of Compound A1-18

Compound A1-18 amounting to 5.6 g was obtained in the same manner as in the synthesis of compound A1-12 except that 10 g of triphenylsulfonium bromide A was changed to 1.2 g of sulfonium salt E mentioned above.

(19) Synthesis of Compound A1-19

At −20° C., 15.7 g of 1,1,2,2,3,3-hexafluoropropane-1,3-disulfonyl difluoride was dropped into a solution obtained by dissolving 17.8 g of 2,4,5-tricyclohexylbenzylamine and 10.0 g of triethylamine in 200 ml of dimethylacetamide. The reaction liquid was slowly heated up to room temperature, and agitated for an hour. Subsequently, 500 ml of distilled water and 500 ml of ethyl acetate were added thereto. The thus obtained organic phase was sequentially washed with a saturated aqueous sodium hydrogen carbonate solution and water. The solvent was removed, and 100 ml of methanol and 100 ml of 1N aqueous sodium hydroxide solution were added to the residue and agitated for an hour. Methanol was distilled off, and ethyl acetate was added to the residue. The thus obtained organic phase was washed with saturated saline twice. The solvent was distilled off, and the thus obtained solid was washed with hexane. The resultant solid was dissolved in 100 ml of methanol, and 10 g of triphenylsulfonium bromide was added to the solution and agitated for two hours. The solvent was distilled off, and ethyl acetate was added to the residue. The thus obtained organic phase was sequentially washed with a saturated aqueous sodium hydrogen carbonate solution and water. The solvent was removed, and the residue was purified through a silica gel column, thereby obtaining 10.5 g of compound A1-19.

(20) Synthesis of Compound A1-20

Compound A1-20 amounting to 18.5 g was obtained in the same manner as in the synthesis of compound A1-1 except that 20.0 g of 2,4,6-tricyclohexylbromobenzene was changed to 16.0 g of 2,6-dicyclohexylbromobenzene, and except that 10 g of triphenylsulfonium bromide was changed to 12.4 g of sulfonium salt I shown below.

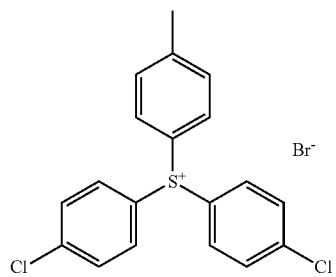

(I)

(21) Synthesis of Compound A1-97

First, 10.0 g of 2,4,6-tricyclohexylphenol was dissolved in 400 ml of THF. In a nitrogen atmosphere, 18.7 ml of n-butyllithium (1.65M hexane solution) was added to the solution at 0° C., and agitated at 0° C. for an hour. The resultant reaction solution was dropped into a solution obtained by dissolving 9.28 g of 1,1,2,2,3,3-hexafluoropropane-1,3-disulfonyl difluoride in 100 ml of THF at 0° C. over a period of 30 minutes. After the completion of dropping, the mixture was agitated for 30 minutes, and 100 ml of distilled water and 200 ml of ethyl acetate were added thereto. The thus obtained organic phase was washed with saturated saline twice. The solvent was distilled off, and 100 ml of methanol and 200 ml of 1N aqueous sodium hydroxide solution were added to the residue and agitated for an hour. Methanol was distilled off, and 200 ml of ethyl acetate was added to the residue. The thus obtained organic phase was washed with saturated saline twice. The solvent was distilled off, and the thus obtained solid was dissolved in 100 ml of methanol. Thereafter, 10.0 g of triphenylsulfonium bromide A was added to the solution and agitated for an hour. The solvent was distilled off, and ethyl acetate was added to the residue. The thus obtained organic phase was sequentially washed with a saturated aqueous sodium hydrogen carbonate solution and water. The solvent was distilled off, thereby obtaining 19.5 g of compound A1-97.

$^1$H-NMR (300 MHz, CDCl$_3$) δ=7.78-7.65 (m, 15H), 6.97 (s, 2H), 2.98 (m, 2H), 2.46 (m, 1H), 1.93-1.15 (m, 30H).

$^{19}$F-NMR (300 MHz, CDCl$_3$) δ=−138.6 (t, 2F), −144.5 (t, 2F), −149.0 (s, 2F).

(22) Synthesis of Compound A1-98

Compound A1-98 amounting to 17.5 g was obtained in the same manner as in the synthesis of compound A1-97 except that 10 g of triphenylsulfonium bromide A was changed to 10.0 g of sulfonium salt J, below.

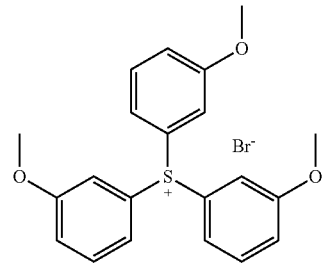

(J)

$^1$H-NMR (300 MHz, CDCl$_3$) δ=7.57 (t, J=7.8 Hz, 3H), 7.42 (t, J=2.1 Hz, 3H), 7.24 (m, 3H), 7.10 (m, 3H), 6.97 (m, 3H), 3.87 (s, 9H), 2.98 (m, 2H), 2.44 (m, 1H), 1.93-1.19 (m, 30H).

$^{19}$F-NMR (300 MHz, CDCl$_3$) δ=−138.3 (t, 2F), −144.4 (t, 2F), −148.5 (s, 2F).

(23) Synthesis of Compound A1-99

Compound A1-99 amounting to 18.2 g was obtained in the same manner as in the synthesis of compound A1-97 except that 10 g of triphenylsulfonium bromide A was changed to 10.0 g of sulfonium salt K, below.

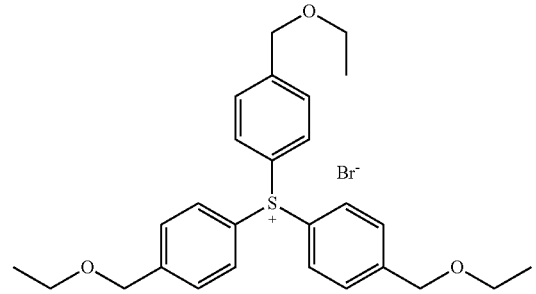

(K)

$^1$H-NMR (300 MHz, CDCl$_3$) δ=7.72-7.61 (m, 12H), 6.97 (s, 2H), 4.58 (s, 6H), 3.58 (q, J=7.2 Hz, 6H), 2.99 (m, 2H), 2.44 (m, 1H), 1.90-1.19 (m, 30H), 1.25 (t, J=7.2 Hz, 9H).

(24) Synthesis of Compound A1-100

Compound A1-100 amounting to 14.9 g was obtained in the same manner as in the synthesis of compound A1-97 except that 10 g of triphenylsulfonium bromide A was changed to 10.0 g of sulfonium salt L, below.

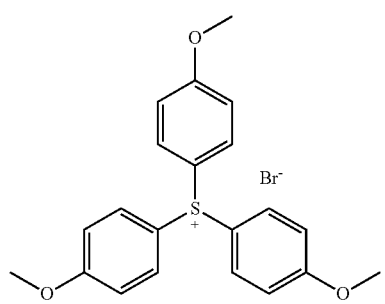

(25) Synthesis of Compound A1-115

First, 10.0 g of 2,4,6-tricyclohexylphenol was dissolved in 400 ml of THF. In a nitrogen atmosphere, 18.7 ml of n-butyllithium (1.65M hexane solution) was added to the solution at 0° C., and agitated at 0° C. for an hour. The resultant reaction solution was dropped into a solution obtained by dissolving 9.28 g of 1,1,2,2,3,3-hexafluoropropane-1,3-disulfonyl difluoride in 100 ml of THF at 0° C. over a period of 30 minutes. After the completion of dropping, the mixture was agitated for 30 minutes, and 10 ml of triethylamine and 4.50 g of trifluorosulfonamide were added thereto. The mixture was agitated at 0° C. for an hour, and 200 ml of distilled water was added thereto. The thus obtained organic phase was washed with saturated saline twice. The solvent was distilled off, and the thus obtained solid was dissolved in 100 ml of methanol. Thereafter, 10 g of triphenylsulfonium bromide A was added to the solution and agitated for two hours. The solvent was distilled off, and the thus obtained solid was dissolved in 100 ml of methanol. Thereafter, 10.0 g of triphenylsulfonium bromide A was added to the solution and agitated for an hour. The solvent was distilled off, and ethyl acetate was added to the residue. The thus obtained organic phase was sequentially washed with a saturated aqueous sodium hydrogen carbonate solution and water. The solvent was distilled off, thereby obtaining 12.5 g of desired compound (A1-115).

Other acid generators can also be synthesized in the same manner as mentioned above.

Example A

Examples 1A to 20A and Comparative Examples 1A to 7A

<Preparation of Resist>

Referring to Table 1 below, with respect to each of the resists, the individual components were dissolved in the solvent, thereby obtaining a solution of 4.0 mass % solid content. This solution was passed through a polytetrafluoroethylene filter of 0.03 μm pore size, thereby obtaining a positive resist solution. The thus obtained positive resist solutions were evaluated by the following methods, and the results are given in Table 1.

<Evaluation of Resist>

An organic antireflection film ARC29A (produced by Nissan Chemical Industries, Ltd.) was applied onto a silicon wafer and baked at 205° C. for 60 seconds, thereby forming a 78 nm-thick antireflection film. Each of the prepared positive resist compositions was applied thereonto and baked at 130° C. for 60 seconds, thereby forming a 120 nm-thick resist film. The resultant wafer was exposed through a 6% half-tone mask of 75 nm 1:1 line and space pattern by means of an ArF excimer laser scanner (manufactured by ASML, PAS5500/1100, NA0.75). Thereafter, the exposed wafer was baked at 130° C. for 60 seconds, developed with an aqueous solution of tetramethylammonium hydroxide (2.38 mass %) for 30 seconds, rinsed with pure water and spin dried, thereby obtaining a resist pattern.

[Sensitivity, Resolution (γ)]

Surface exposure was carried out while changing the exposure amount by 0.5 mJ at a time within the range of 10 to 40 mJ/cm$^2$, and the exposed film was baked at 110° C. for 90 seconds. Thereafter, using a 2.38 mass % aqueous tetramethylammonium hydroxide (TMAH) solution, the dissolution rate at each of the exposure amounts was measured, thereby obtaining a sensitivity curve.

The sensitivity was defined as the exposure amount in which the dissolution rate of the resist was saturated on the sensitivity curve. Further, the dissolution contrast (γ value) was calculated from the gradient of the straight line portion of the sensitivity curve. The larger the γ value, the more favorable the dissolution contrast and the greater the advantage in resolution.

[Line Edge Roughness (LER)]

In the measurement of line edge roughness (nm), a 75 nm line and space (1/1) pattern was observed by means of a critical dimension scanning electron microscope (SEM, model S-8840 manufactured by Hitachi, Ltd.). In a 2 μm region along the longitudinal direction of the line pattern, the distances of actual edges from a reference line on which edges were to be present were measured on 50 points by the scanning electron microscope. The standard deviation of measurements was determined, and 3σ was computed therefrom. The smaller the value thereof, the more favorable the performance exhibited.

[Pattern Profile]

The optimum exposure amount was defined as the exposure amount that reproduced a line-and-space (L/S=1/1) mask pattern of 75 nm line width. The profile realized in the optimum exposure amount was observed by means of a scanning electron microscope (SEM).

[Aging Stability]

Each of the resist compositions was stored at room temperature for a month. The degree of sensitivity change by the storage was evaluated on the following judgment criteria.

(Judgment Criteria)

○: when the observed sensitivity change was less than 1 mJ/cm$^2$,

Δ: when the observed sensitivity change was in the range of 1 to 3 mJ/cm$^2$, and x: when the observed sensitivity change was greater than 3 mJ/cm$^2$.

The obtained measurement results are given in Table 1 below.

TABLE 1

| | | | | | | | | | | |
|---|---|---|---|---|---|---|---|---|---|---|
| | (ArF: positive) | | | | | | | | | |
| | Acid generator (A1) (0.72 mmol) | Resin (B) (9.6 g) | Basic compound (0.02 g) | Surfactant (0.1 mass %) | Solvent [mass ratio] | Sensitivity (mJ/cm$^2$) | Resolution γ | LER (nm) | Configuration of pattern | Aging stability |
| Ex. 1A | A1-1 | RA-2 | C-1 | W-1 | A1/B1 [6/4] | 21.0 | 6.2 | 4.0 | Rectangle | ◯ |
| Ex. 2A | A1-2 | RA-2 | C-1 | W-1 | A2/B2 [6/4] | 22.0 | 6.2 | 4.5 | Rectangle | ◯ |
| Ex. 3A | A1-3 | RA-2 | C-1 | W-1 | A3/B1 [6/4] | 21.0 | 6.2 | 4.5 | Rectangle | ◯ |
| Ex. 4A | A1-4 | RA-2 | C-1 | W-1 | A1/B1 [6/4] | 24.0 | 6.1 | 4.2 | Rectangle | ◯ |
| Ex. 5A | A1-5 | RA-3 | C-1 | W-2 | A1/B1 [6/4] | 20.0 | 5.5 | 4.0 | Rectangle | ◯ |
| Ex. 6A | A1-6 | RA-1 | C-1 | W-4 | A1/B1 [6/4] | 22.0 | 6.5 | 4.2 | Rectangle | ◯ |
| Ex. 7A | A1-7 | RA-1 | C-1 | W-4 | A1/B1 [6/4] | 22.0 | 6.5 | 4.2 | Rectangle | ◯ |
| Ex. 8A | A1-8 | RA-1 | C-1 | W-4 | A1/B1 [6/4] | 22.0 | 6.5 | 4.2 | Rectangle | ◯ |
| Ex. 9A | A1-9 | RA-1 | C-1 | W-4 | A1/B1 [6/4] | 23.0 | 6.5 | 4.2 | Rectangle | ◯ |
| Ex. 10A | A1-19 | RA-2 | C-1 | W-4 | A1/B1 [6/4] | 25.5 | 6.1 | 4.3 | Rectangle | ◯ |
| Ex. 11A | A1-11 | RA-1 | C-1 | W-4 | A1/B1 [6/4] | 23.0 | 6.4 | 4.1 | Rectangle | ◯ |
| Ex. 12A | A1-12 | RA-1 | C-1 | W-4 | A1/B1 [6/4] | 24.0 | 6.3 | 4.3 | Rectangle | ◯ |
| Ex. 13A | A1-13 | RA-1 | C-1 | W-4 | A1/B1 [6/4] | 22.5 | 6.2 | 4.1 | Rectangle | ◯ |
| Ex. 14A | A1-14 | RA-1 | C-1 | W-4 | A1/B1 [6/4] | 24.5 | 6.5 | 4.3 | Rectangle | ◯ |
| Ex. 15A | A1-15 | RA-1 | C-1 | W-4 | A1/B1 [6/4] | 22.5 | 6.4 | 4.4 | Rectangle | ◯ |
| Ex. 16A | A1-16 | RA-1 | C-1 | W-4 | A1/B1 [6/4] | 23.5 | 6.1 | 4.3 | Rectangle | ◯ |
| Ex. 17A | A1-17 | RA-1 | C-1 | W-4 | A1/B1 [6/4] | 24.5 | 6.2 | 4.2 | Rectangle | ◯ |
| Ex. 18A | A1-18 | RA-1 | C-1 | W-4 | A1/B1 [6/4] | 22.5 | 6.1 | 4.1 | Rectangle | ◯ |
| Ex. 19A | A1-97 | RA-1 | C-1 | W-4 | A1/B1 [6/4] | 20.5 | 6.4 | 4.0 | Rectangle | ◯ |
| Ex. 20A | A1-115 | RA-1 | C-1 | W-4 | A1/B1 [6/4] | 20.0 | 6.5 | 4.0 | Rectangle | ◯ |
| Comp. 1A | Comparative compound 1 | RA-2 | C-1 | W-1 | A1/B1 [6/4] | 28.0 | 4.3 | 6.0 | Taper | Δ |
| Comp. 2A | Comparative compound 2 | RA-2 | C-1 | W-1 | A1/B1 [6/4] | 28.0 | 5.2 | 5.5 | Taper | Δ |
| Comp. 3A | Comparative compound 3 | RA-2 | C-1 | W-1 | A1/B1 [6/4] | 27.0 | 5.2 | 5.5 | Taper | Δ |
| Comp. 4A | Comparative compound 4 | RA-2 | C-1 | W-1 | A1/B1 [6/4] | 30.0 | 5.2 | 5.5 | Taper | Δ |
| Comp. 5A | Comparative compound 5 | RA-2 | C-1 | W-1 | A1/B1 [6/4] | 26.5 | 6.2 | 5.6 | Taper | Δ |
| Comp. 6A | Comparative compound 6 | RA-2 | C-1 | W-1 | A1/B1 [6/4] | 28.5 | 5.2 | 5.8 | Taper | Δ |

The employed components are as follows.

[Acid Generator]

The acid generators (A1) are those mentioned hereinbefore by way of example. The structures of comparative compounds 1 to 6 are shown below.

Comparative compound 1

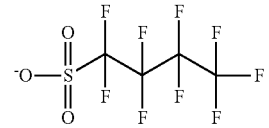

-continued

Comparative compound 2

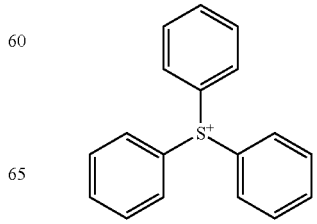

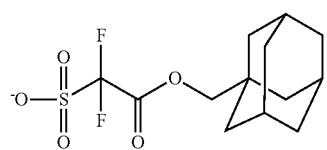

Comparative compound 3

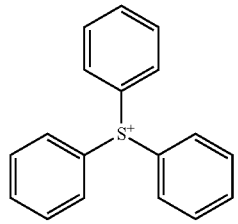

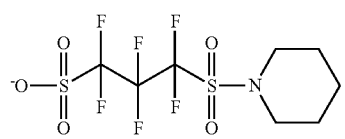

Comparative compound 4

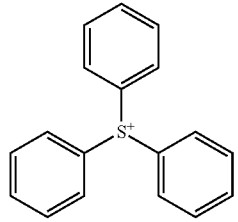

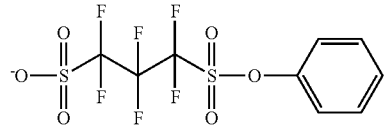

Comparative compound 5

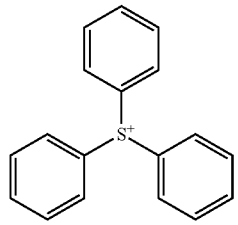

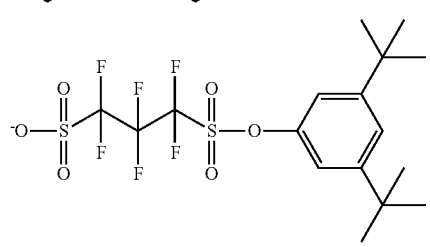

Comparative compound 6

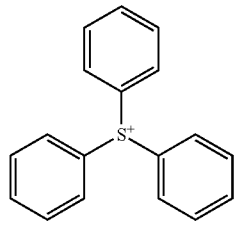

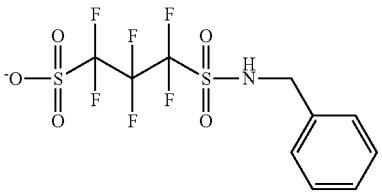

[Resin (B)]

Any of resins (RA-1) to (RA-4) shown below was used as resin (B). In the following formulae, the numerics appearing on the right side of individual repeating units indicate a molar ratio of repeating units. Mw means the weight average molecular weight, and Mw/Mn means the molecular weight dispersity.

(RA-1)

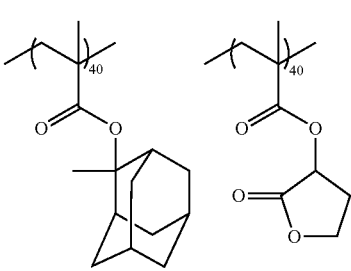

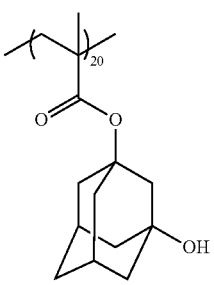

Mw = 10700
Mw/Mn = 1.81

(RA-2)

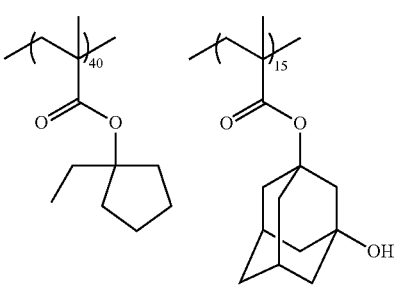

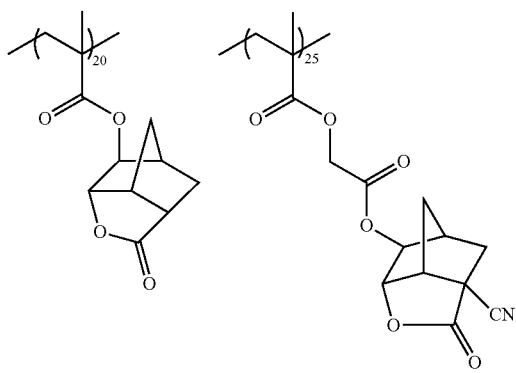

Mw = 8500
Mw/Mn = 1.60

(RA-3)

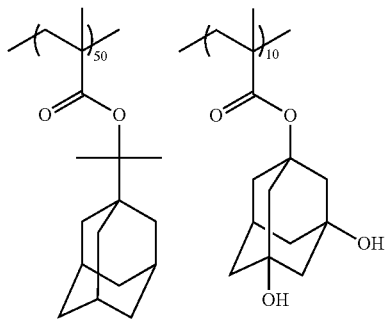

Mw = 8800
Mw/Mn = 1.90

(RA-4)

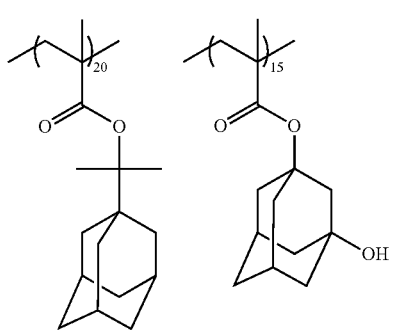

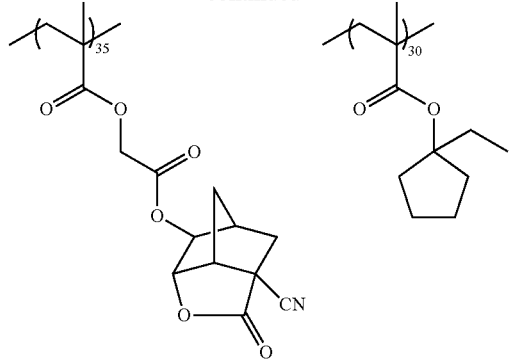

Mw = 10000
Mw/Mn = 1.70

[Basic Compound]

The following compounds C-1 to C-3 were used as the basic compound.

C-1: 2,4,5-triphenylimidazole,
C-2: tetrabutylammonium hydroxide, and
C-3: 1,5-diazabicyclo[4.3.0]non-5-ene.

[Surfactant]

The following surfactants W-1 to W-4 were used.

W-1: Megafac F176 (produced by Dainippon Ink & Chemicals, Inc.; fluorinated),

W-2: Megafac R08 (produced by Dainippon Ink & Chemicals, Inc.; fluorinated and siliconized), W-3: polysiloxane polymer KP-341 (produced by Shin-Etsu Chemical Co., Ltd.; siliconized), and W-4: Troy Sol S-366 (produced by Troy Chemical Co., Ltd.; fluorinated).

[Solvent]

The following solvents A1 to A4 and B1 and B2 were used. These solvents were used in appropriate combination.

A1: propylene glycol monomethyl ether acetate,
A2: 2-heptanone,
A3: cyclohexanone,
A4: γ-butyrolactone,
B1: propylene glycol monomethyl ether, and
B2: ethyl acetate.

It is apparent from the results of Table 1 that in the employment of ArF exposure, the actinic-ray- or radiation-sensitive resin composition of the present invention excels in all of the sensitivity, resolution, pattern profile, LER and aging stability.

Example B

A resist solution was prepared in the same manner as in Example A except that 0.06 g of polymer shown below was added to the composition of Example 1A. The resist solution was applied in the same manner, thereby obtaining a resist film. The obtained resist film was patternwise exposed through an immersion liquid (pure water) by means of an ArF excimer laser liquid immersion scanner (manufactured by ASML, XT1700i, NA1.20), and pattern formation was carried out in the same manner as in Example A. It was ascertained that with respect to the obtained patterns, similar evaluation results were obtained in all of the sensitivity, resolution (γ), LER, pattern configuration and aging stability.

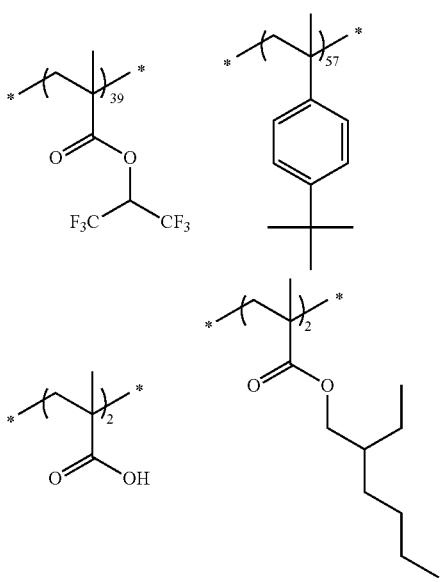

Weight average molecular weight 4500; dispersity 1.4

Example C

Examples 1C to 20C and Comparative Examples 1C to 4C

<Preparation of Resist>

Referring to Table 2 below, with respect to each of the resists, the individual components were dissolved in the solvent and passed through a polytetrafluoroethylene filter of 0.1 μm pore size, thereby obtaining a positive resist solution of 8 mass % solid content.

<Evaluation of Resist>

Each of the obtained positive resist solutions was uniformly applied onto a silicon substrate having undergone a hexamethyldisilazane treatment by means of a spin coater, and heated and dried on a hot plate at 120° C. for 90 seconds, thereby obtaining a 0.4 μm-thick resist film.

Each of the obtained resist films was patternwise exposed through a line-and-space mask by means of a KrF excimer laser stepper (NA=0.63). Immediately after the exposure, the resist film was baked on a hot plate at 110° C. for 90 seconds. Thereafter, the resist film was developed with a 2.38 mass % aqueous tetramethylammonium hydroxide solution at 23° C. for 60 seconds, rinsed with pure water for 30 seconds and dried. Thus, an intended line pattern was obtained.

[Sensitivity, Resolution (γ)]

Surface exposure was carried out while changing the exposure amount by 0.5 mJ at a time within the range of 10 to 40 mJ/cm$^2$, and the exposed film was baked at 110° C. for 90 seconds. Thereafter, using a 2.38 mass % aqueous tetramethylammonium hydroxide (TMAH) solution, the dissolution rate at each of the exposure amounts was measured, thereby obtaining a sensitivity curve.

The sensitivity was defined as the exposure amount in which the dissolution rate of the resist was saturated on the sensitivity curve. Further, the dissolution contrast (γ value) was calculated from the gradient of the straight line portion of the sensitivity curve. The larger the γ value, the more favorable the dissolution contrast and the greater the advantage in resolution.

[Line Edge Roughness (LER)]

In the measurement of line edge roughness (nm), a 200 nm line and space (1/1) pattern was observed by means of a critical dimension scanning electron microscope (SEM, model S-8840 manufactured by Hitachi, Ltd.). In a 5 μm region along the longitudinal direction of the line pattern, the distances of actual edges from a reference line on which edges were to be present were measured on 50 points by the scanning electron microscope. The standard deviation of measurements was determined, and 3σ was computed therefrom. The smaller the value thereof, the more favorable the performance exhibited.

[Pattern Profile]

The optimum exposure amount was defined as the exposure amount that reproduced a line-and-space (L/S=1/1) mask pattern of 0.20 μm line width. The profile realized in the optimum exposure amount was observed by means of a scanning electron microscope (SEM).

[Aging Stability]

Each of the resist compositions was stored at room temperature for a month. The degree of sensitivity change by the storage was evaluated on the following judgment criteria.

(Judgment Criteria)

○: when the observed sensitivity change was less than 1 mJ/cm$^2$,

Δ: when the observed sensitivity change was in the range of 1 to 3 mJ/cm$^2$, and x: when the observed sensitivity change was greater than 3 mJ/cm$^2$.

The obtained measurement results are given in Table 2 below.

TABLE 2

(KrF: positive)

| | Acid generator (A1) (0.60 mmol) | Acid generator (A2) (0.15 mmol) | Resin (B) (10 g) | Basic compound (0.02 g) | Surfactant (0.1 mass %) | Solvent [mass ratio] | Sensitivity (mJ/cm$^2$) | Resolution γ | LER (nm) | Configuration of pattern | Aging stability |
|---|---|---|---|---|---|---|---|---|---|---|---|
| Ex. 1C | A1-1 | — | R-18 | C-1 | W-1 | A1/B1 [6/4] | 17.0 | 8.3 | 3.1 | Rectangle | ○ |
| Ex. 2C | A1-2 | — | R-18 | C-1 | W-1 | A2/B2 [6/4] | 18.0 | 6.2 | 4.1 | Rectangle | ○ |
| Ex. 3C | A1-3 | — | R-18 | C-1 | W-1 | A3/B1 [6/4] | 20.0 | 6.8 | 4.3 | Rectangle | ○ |
| Ex. 4C | A1-4 | — | R-18 | C-1 | W-1 | A1/B1 [6/4] | 19.5 | 6.6 | 4.1 | Rectangle | ○ |
| Ex. 5C | A1-5 | — | R-18 | C-1 | W-2 | A1/B1 [6/4] | 21.0 | 7.1 | 3.3 | Rectangle | ○ |

TABLE 2-continued (KrF: positive)

| | Acid generator (A1) (0.60 mmol) | Acid generator (A2) (0.15 mmol) | Resin (B) (10 g) | Basic compound (0.02 g) | Surfactant (0.1 mass %) | Solvent [mass ratio] | Sensitivity (mJ/cm²) | Resolution γ | LER (nm) | Configuration of pattern | Aging stability |
|---|---|---|---|---|---|---|---|---|---|---|---|
| Ex. 6C | A1-6 | — | R-18 | C-1 | W-4 | A1/B1 [6/4] | 18.0 | 7.2 | 3.6 | Rectangle | ○ |
| Ex. 7C | A1-20 | — | R-18 | C-1 | W-4 | A1/B1 [6/4] | 17.5 | 7.4 | 3.9 | Rectangle | ○ |
| Ex. 8C | A1-77 | — | R-18 | C-1 | W-4 | A1/B1 [6/4] | 19.0 | 7.3 | 3.5 | Rectangle | ○ |
| Ex. 9C | A1-83 | — | R-18 | C-1 | W-4 | A1/B1 [6/4] | 20.5 | 7.0 | 3.7 | Rectangle | ○ |
| Ex. 10C | A1-10 | — | R-18 | C-1 | W-4 | A1/B1 [6/4] | 20.0 | 7.0 | 3.6 | Rectangle | ○ |
| Ex. 11C | A1-11 | — | R-18 | C-1 | W-4 | A1/B1 [6/4] | 21.5 | 6.8 | 3.9 | Rectangle | ○ |
| Ex. 12C | A1-12 | — | R-18 | C-2 | W-4 | A1/B1 [6/4] | 21.5 | 6.4 | 3.9 | Rectangle | ○ |
| Ex. 13C | A1-13 | — | R-18 | C-1 | W-4 | A1/B1 [6/4] | 19.0 | 7.0 | 3.7 | Rectangle | ○ |
| Ex. 14C | A1-14 | — | R-18 | C-1 | W-4 | A1/B1 [6/4] | 18.5 | 7.4 | 3.6 | Rectangle | ○ |
| Ex. 15C | A1-15 | — | R-18 | C-1 | W-4 | A1/B1 [6/4] | 18.5 | 7.2 | 3.5 | Rectangle | ○ |
| Ex. 16C | A1-16 | Z | R-18 | C-1 | W-4 | A1/B1 [6/4] | 17.5 | 7.3 | 3.6 | Rectangle | ○ |
| Ex. 17C | A1-97 | — | R-8 | C-2 | W-1 | A1/B1 [6/4] | 16.0 | 8.0 | 3.2 | Rectangle | ○ |
| Ex. 18C | A1-98 | — | R-14 | C-1 | W-1 | A1/B1 [6/4] | 18.5 | 8.1 | 3.0 | Rectangle | ○ |
| Ex. 19C | A1-99 | — | R-17 | C-1 | W-1 | A1/B1 [6/4] | 19.0 | 8.1 | 3.1 | Rectangle | ○ |
| Ex. 20C | A1-100 | — | R-19 | C-1 | W-1 | A1/B1 [6/4] | 19.5 | 8.0 | 3.1 | Rectangle | ○ |
| Comp. 1C | Comparative compound 1 | — | R-18 | C-1 | W-1 | A1/B1 [6/4] | 21.0 | 4.5 | 6.5 | Taper | Δ |
| Comp. 2C | Comparative compound 2 | — | R-18 | C-1 | W-1 | A1/B1 [6/4] | 22.0 | 4.0 | 7.0 | Taper | Δ |
| Comp. 3C | Comparative compound 3 | — | R-18 | C-1 | W-1 | A1/B1 [6/4] | 24.0 | 4.2 | 7.2 | Taper | Δ |
| Comp. 4C | Comparative compound 4 | — | R-18 | C-1 | W-1 | A1/B1 [6/4] | 23.0 | 4.5 | 7.1 | Taper | Δ |

The employed acid generators (A1), basic compounds, surfactants and solvents had been appropriately selected from among those mentioned hereinbefore.

The jointly used acid generator (A2) was compound Z shown below.

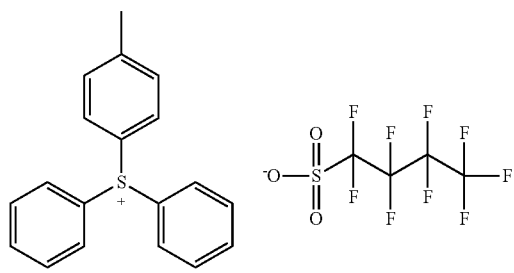

Z

The employed resins (B) had been appropriately selected from among the resins (R-1) to (R-30) mentioned hereinbefore by way of example. The molar ratio of individual repeating units and weight average molecular weight of each of the resins (R-8), (R-14), (R-17), (R-18) and (R-19) appearing in Table 2 and the following tables are as indicated in Table 3 below.

TABLE 3

| Resin | Molar ratio of repeating units (corresponding to individual repeating units in order from the left in each structural formula) | Weight average molecular weight (Mw) |
|---|---|---|
| R-8 | 20/60/20 | 12000 |
| R-14 | 15/60/25 | 12000 |
| R-17 | 80/20 | 15000 |
| R-18 | 75/25 | 10000 |
| R-19 | 60/20/20 | 12000 |

It is apparent from the results of Table 2 that in the employment of KrF exposure, the composition of the present invention excels in the sensitivity, resolution, LER, pattern configuration and aging stability. Namely, it is apparent that the actinic-ray- or radiation-sensitive resin composition of the present invention exhibits excellent performance as a positive resist composition for use in KrF excimer laser exposure.

Example D

Examples 1D to 27D and Comparative Examples 1D to 4D

<Preparation of Resist>

Referring to Table 4 below, with respect to each of the resists, the individual components were dissolved in the solvent and passed through a polytetrafluoroethylene filter of 0.1 µm pore size, thereby obtaining a positive resist solution of 4 mass % solid content.

(Evaluation of Resist)

Each of the prepared positive resist solutions was uniformly applied onto a silicon substrate having undergone a hexamethyldisilazane treatment by means of a spin coater, and heated and dried on a hot plate at 120° C. for 60 seconds, thereby obtaining a 0.12 µm-thick resist film.

Each of the resist films was irradiated with electron beams by means of an electron beam projection lithography system (acceleration voltage 100 KeV) manufactured by Nikon Corporation. Immediately after the irradiation, the film was baked on a hot plate at 120° C. for 90 seconds. Thereafter, the baked film was developed with a 2.38 mass % aqueous tetramethylammonium hydroxide solution at 23° C. for 60 seconds. After the development, the film was rinsed with pure water for 30 seconds and dried. Thus, a line-and-space pattern was formed.

[Sensitivity]

Each of the obtained patterns was observed by means of a scanning electron microscope (model S-9220 manufactured by Hitachi, Ltd.). The sensitivity (Eo) was defined as the electron beam irradiation amount in which 0.10 µm (line:space=1:1) was resolved.

[Resolution]

The resolution (dense) was defined as the limiting resolving power of 1:1 line space (minimum line width at which the line and space were separated and resolved from each other) in the exposure amount exhibiting the above sensitivity.

[Line Edge Roughness (LER)]

LER was evaluated by the same method as in Example A.

[Outgas Performance: Ratio of Change in Film Thickness by Exposure]

Exposure to electron beams was carried out in the exposure amount equal to 2.0 times the exposure amount realizing the above sensitivity. The film thickness after the exposure but before postbake was measured, and the ratio of change from the film thickness before the exposure was calculated by the following formula.

Ratio of change in film thickness (%)=[(film thickness before exposure−film thickness after exposure)/(film thickness before exposure)]×100.

[Aging Stability]

The aging stability was evaluated by the same method as in Example A.

These evaluation results are given in Table 4 below.

TABLE 4

(EB: positive)

| | Acid generator (A1) (0.60 mmol) | Acid generator (A2) (0.15 mmol) | Resin (B) (10 g) | Basic compound (0.02 g) | Surfactant (0.1 mass %) | Solvent [mass ratio] | Sensitivity (µC/cm$^2$) | Resolution γ (nm) | LER (nm) | Out gas (%) | Aging stability |
|---|---|---|---|---|---|---|---|---|---|---|---|
| Ex. 1D | A1-1 | — | R-18 | C-1 | W-1 | A1/B1 [6/4] | 13.3 | 55 | 3.0 | 5.8 | ○ |
| Ex. 2D | A1-2 | — | R-18 | C-1 | W-1 | A2/B2 [6/4] | 13.5 | 60 | 4.0 | 5.6 | ○ |
| Ex. 3D | A1-3 | — | R-18 | C-1 | W-1 | A3/B1 [6/4] | 14.0 | 55 | 4.2 | 1.5 | ○ |
| Ex. 4D | A1-4 | — | R-18 | C-1 | W-1 | A1/B1 [6/4] | 13.9 | 60 | 4.0 | 5.8 | ○ |
| Ex. 5D | A1-5 | — | R-18 | C-1 | W-2 | A1/B1 [6/4] | 14.2 | 65 | 3.2 | 2.5 | ○ |
| Ex. 6D | A1-6 | — | R-18 | C-1 | W-4 | A1/B1 [6/4] | 13.1 | 55 | 3.5 | 3.5 | ○ |
| Ex. 7D | A1-7 | — | R-18 | C-1 | W-4 | A1/B1 [6/4] | 13.2 | 55 | 3.4 | 2.9 | ○ |
| Ex. 8D | A1-8 | — | R-18 | C-1 | W-4 | A1/B1 [6/4] | 13.1 | 55 | 3.0 | 1.8 | ○ |
| Ex. 9D | A1-9 | — | R-18 | C-1 | W-4 | A1/B1 [6/4] | 13.9 | 55 | 3.2 | 4.5 | ○ |
| Ex. 10D | A1-10 | — | R-18 | C-1 | W-4 | A1/B1 [6/4] | 14.2 | 65 | 3.0 | 5.9 | ○ |
| Ex. 11D | A1-11 | — | R-18 | C-1 | W-4 | A1/B1 [6/4] | 14.5 | 60 | 3.7 | 4.0 | ○ |
| Ex. 12D | A1-12 | — | R-18 | C-2 | W-4 | A1/B1 [6/4] | 15.4 | 65 | 4.1 | 4.5 | ○ |
| Ex. 13D | A1-13 | — | R-18 | C-1 | W-4 | A1/B1 [6/4] | 14.5 | 55 | 3.8 | 3.9 | ○ |
| Ex. 14D | A1-14 | — | R-18 | C-1 | W-4 | A1/B1 [6/4] | 13.8 | 60 | 3.4 | 3.3 | ○ |
| Ex. 15D | A1-15 | — | R-18 | C-1 | W-4 | A1/B1 [6/4] | 13.6 | 60 | 3.5 | 2.2 | ○ |
| Ex. 16D | A1-16 | — | R-18 | C-1 | W-4 | A1/B1 [6/4] | 14.5 | 60 | 3.8 | 3.5 | ○ |
| Ex. 17D | A1-1 | Z | R-8 | C-2 | W-1 | A1/B1 [6/4] | 13.1 | 60 | 3.1 | 5.9 | ○ |
| Ex. 18D | A1-3 | — | R-14 | C-1 | W-1 | A1/B1 [6/4] | 13.4 | 60 | 3.2 | 1.6 | ○ |
| Ex. 19D | A1-3 | — | R-17 | C-1 | W-1 | A1/B1 [6/4] | 12.8 | 55 | 2.9 | 1.5 | ○ |
| Ex. 20D | A1-3 | — | R-19 | C-1 | W-1 | A1/B1 [6/4] | 12.7 | 55 | 2.8 | 1.4 | ○ |
| Ex. 21D | A1-17 | — | R-18 | C-1 | W-4 | A1/B1 [6/4] | 15.1 | 65 | 3.3 | 4.5 | ○ |

TABLE 4-continued (EB: positive)

| | Acid generator (A1) (0.60 mmol) | Acid generator (A2) (0.15 mmol) | Resin (B) (10 g) | Basic compound (0.02 g) | Surfactant (0.1 mass %) | Solvent [mass ratio] | Sensitivity ($\mu C/cm^2$) | Resolution γ (nm) | LER (nm) | Out gas (%) | Aging stability |
|---|---|---|---|---|---|---|---|---|---|---|---|
| Ex. 22D | A1-18 | — | R-18 | C-1 | W-4 | A1/B1 [6/4] | 15.5 | 65 | 3.5 | 4.5 | ○ |
| Ex. 23D | A1-97 | — | R-14 | C-1 | W-4 | A1/B1 [6/4] | 13.5 | 60 | 3.2 | 4.4 | ○ |
| Ex. 24D | A1-98 | — | R-14 | C-1 | W-4 | A1/B1 [6/4] | 16.5 | 55 | 3.1 | 4.3 | ○ |
| Ex. 25D | A1-99 | — | R-14 | C-1 | W-4 | A1/B1 [6/4] | 15.5 | 55 | 3.2 | 4.2 | ○ |
| Ex. 26D | A1-100 | — | R-14 | C-1 | W-4 | A1/B1 [6/4] | 17.5 | 60 | 3.3 | 4.3 | ○ |
| Ex. 27D | A1-115 | — | R-14 | C-1 | W-4 | A1/B1 [6/4] | 13.5 | 60 | 3.1 | 4.4 | ○ |
| Comp. 1D | Comparative compound 1 | — | R-18 | C-1 | W-1 | A1/B1 [6/4] | 18.5 | 70 | 6.8 | 7.8 | Δ |
| Comp. 2D | Comparative compound 2 | — | R-18 | C-1 | W-1 | A1/B1 [6/4] | 19.6 | 75 | 6.6 | 6.2 | Δ |
| Comp. 3D | Comparative compound 3 | — | R-18 | C-1 | W-1 | A1/B1 [6/4] | 20.4 | 80 | 6.8 | 7.5 | Δ |
| Comp. 4D | Comparative compound 4 | — | R-18 | C-1 | W-1 | A1/B1 [6/4] | 20.7 | 75 | 7.0 | 7.9 | Δ |

It is apparent from the results of Table 4 that in the employment of electron beam exposure, the composition of the present invention excels in the sensitivity, resolution, LER, out gas performance and aging stability. Namely, it is apparent that the actinic-ray- or radiation-sensitive resin composition of the present invention exhibits excellent performance as a positive resist composition for use in electron beam exposure.

Example E

Examples 1E to 22E and Comparative Examples 1E to 4E

<Preparation of Resist>
Referring to Table 5 below, with respect to each of the resists, the individual components were dissolved in the solvent and passed through a polytetrafluoroethylene filter of 0.1 μm pore size, thereby obtaining a negative resist solution of 4 mass % solid content.

(Evaluation of Resist)

Each of the prepared negative resist solutions was uniformly applied onto a silicon substrate having undergone a hexamethyldisilazane treatment by means of a spin coater, and heated and dried on a hot plate at 120° C. for 60 seconds, thereby obtaining a 0.12 μm-thick resist film.

Each of the resist films was irradiated with electron beams by means of an electron beam projection lithography system (acceleration voltage 100 KeV) manufactured by Nikon Corporation. Immediately after the irradiation, the film was baked on a hot plate at 120° C. for 90 seconds. Thereafter, the baked film was developed with a 2.38 mass % aqueous tetramethylammonium hydroxide solution at 23° C. for 60 seconds. After the development, the film was rinsed with pure water for 30 seconds and dried. Thus, a line-and-space pattern was formed.

The resists were evaluated in the same manner as described in Example D. The results are given in Table 5 below.

TABLE 5

(EB: negative)

| | Acid generator (A1) (0.60 mmol) | Acid generator (A2) (0.15 mmol) | Resin (C) (10 g) | Cross-linking agent (3.0 g) | Basic compound (0.02 g) | Surfactant (0.1 mass %) | Solvent [mass ratio] | Sensitivity ($\mu C/cm^2$) | Resolution γ (nm) | LER (nm) | Out gas (%) | Aging stability |
|---|---|---|---|---|---|---|---|---|---|---|---|---|
| Ex. 1E | A1-1 | — | P-3 | CL-1 | C-1 | W-1 | A1/B1 [6/4] | 13.1 | 55 | 4.5 | 5.5 | ○ |
| Ex. 2E | A1-2 | — | P-3 | CL-1 | C-1 | W-1 | A2/B2 [6/4] | 13.3 | 55 | 8.8 | 5.6 | ○ |
| Ex. 3E | A1-3 | — | P-3 | CL-1 | C-2 | W-1 | A3/B1 [6/4] | 14.2 | 55 | 4.2 | 1.5 | ○ |
| Ex. 4E | A1-4 | — | P-3 | CL-1 | C-1 | W-1 | A1/B1 [6/4] | 13.6 | 60 | 9.0 | 5.6 | ○ |
| Ex. 5E | A1-5 | — | P-3 | CL-1 | C-1 | W-2 | A1/B1 [6/4] | 14.3 | 65 | 5.5 | 2.5 | ○ |
| Ex. 6E | A1-6 | — | P-3 | CL-1 | C-1 | W-4 | A1/B1 [6/4] | 13.1 | 55 | 4.9 | 3.6 | ○ |
| Ex. 7E | A1-7 | — | P-3 | CL-1 | C-1 | W-4 | A1/B1 [6/4] | 13.5 | 55 | 5.1 | 2.5 | ○ |
| Ex. 8E | A1-8 | — | P-3 | CL-1 | C-1 | W-4 | A1/B1 [6/4] | 13.3 | 60 | 5.1 | 1.9 | ○ |

TABLE 5-continued (EB: negative)

| | Acid generator (A1) (0.60 mmol) | Acid generator (A2) (0.15 mmol) | Resin (C) (10 g) | Cross-linking agent (3.0 g) | Basic compound (0.02 g) | Surfactant (0.1 mass %) | Solvent [mass ratio] | Sensitivity (μC/cm²) | Resolution γ (nm) | LER (nm) | Out gas (%) | Aging stability |
|---|---|---|---|---|---|---|---|---|---|---|---|---|
| Ex. 9E | A1-9 | — | P-3 | CL-1 | C-1 | W-4 | A1/B1 [6/4] | 14.2 | 55 | 8.9 | 4.0 | ○ |
| Ex. 10E | A1-10 | — | P-3 | CL-1 | C-1 | W-4 | A1/B1 [6/4] | 14.5 | 65 | 8.9 | 4.0 | ○ |
| Ex. 11E | A1-11 | — | P-3 | CL-1 | C-1 | W-4 | A1/B1 [6/4] | 14.0 | 60 | 8.5 | 3.8 | ○ |
| Ex. 12E | A1-12 | — | P-3 | CL-1 | C-2 | W-4 | A1/B1 [6/4] | 15.2 | 60 | 8.3 | 4.1 | ○ |
| Ex. 13E | A1-13 | — | P-3 | CL-1 | C-1 | W-4 | A1/B1 [6/4] | 14.5 | 60 | 7.2 | 4.2 | ○ |
| Ex. 14E | A1-14 | — | P-3 | CL-1 | C-1 | W-4 | A1/B1 [6/4] | 13.4 | 60 | 5.6 | 3.5 | ○ |
| Ex. 15E | A1-15 | — | P-3 | CL-1 | C-1 | W-4 | A1/B1 [6/4] | 13.7 | 60 | 5.3 | 2.5 | ○ |
| Ex. 16E | A1-16 | — | P-3 | CL-1 | C-1 | W-4 | A1/B1 [6/4] | 15.0 | 60 | 7.5 | 4.3 | ○ |
| Ex. 17E | A1-1 | Z | P-2 | CL-3 | C-2 | W-1 | A1/B1 [6/4] | 13.5 | 60 | 6.6 | 6.1 | ○ |
| Ex. 18E | A1-3 | — | P-3 | CL-2 | C-1 | W-1 | A1/B1 [6/4] | 12.8 | 65 | 4.1 | 1.6 | ○ |
| Ex. 19E | A1-3 | — | P-1 | CL-1 | C-1 | W-1 | A1/B1 [6/4] | 12.8 | 55 | 4.2 | 1.2 | ○ |
| Ex. 20E | A1-3 | — | P-3 | CL-1 | C-1 | W-1 | A1/B1 [6/4] | 12.9 | 55 | 4.0 | 1.1 | ○ |
| Ex. 21E | A1-97 | — | P-2 | CL-1 | C-1 | W-4 | A1/B1 [6/4] | 12.8 | 60 | 4.5 | 3.4 | ○ |
| Ex. 22E | A1-98 | — | P-2 | CL-1 | C-1 | W-4 | A1/B1 [6/4] | 13.1 | 55 | 4.4 | 3.6 | ○ |
| Comp. 1E | Comparative compound 1 | — | P-3 | CL-1 | C-1 | W-1 | A1/B1 [6/4] | 18.3 | 65 | 11.4 | 7.5 | Δ |
| Comp. 2E | Comparative compound 2 | — | P-3 | CL-1 | C-1 | W-1 | A1/B1 [6/4] | 19.5 | 75 | 10.6 | 6.2 | Δ |
| Comp. 3E | Comparative compound 3 | — | P-3 | CL-1 | C-1 | W-1 | A1/B1 [6/4] | 20.4 | 75 | 15.7 | 7.1 | Δ |
| Comp. 4E | Comparative compound 4 | — | P-3 | CL-1 | C-1 | W-1 | A1/B1 [6/4] | 20.5 | 75 | 15.9 | 7.5 | Δ |

The structure, molecular weight and molecular weight distribution of each of alkali-soluble resins (C) and the structure of each of acid crosslinking agents are shown below.

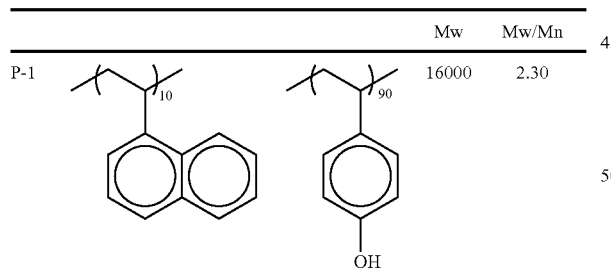

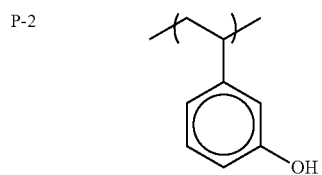

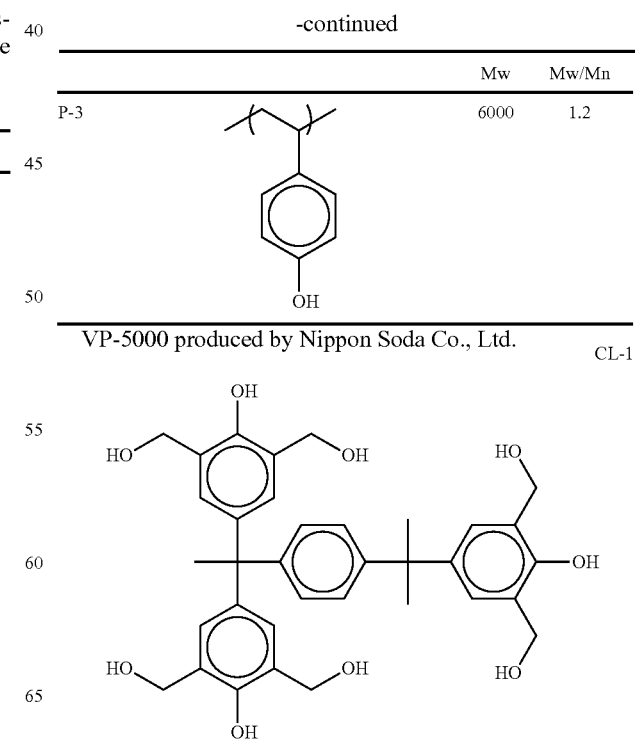

VP-5000 produced by Nippon Soda Co., Ltd.  CL-1

-continued

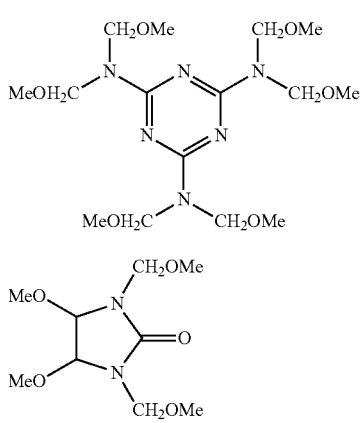

CL-2

CL-3

It is apparent from the results of Table 5 that in the employment of electron beam exposure, the composition of the present invention excels in the sensitivity, resolution, LER, out gas performance and aging stability. Namely, it is apparent that the actinic-ray- or radiation-sensitive resin composition of the present invention exhibits excellent performance as a negative resist composition for use in electron beam exposure.

Example F

Examples 1F to 3F and Comparative Examples 1F to 4F

<Preparation of Resist>

Referring to Table 6 below, with respect to each of the resists, the individual components were dissolved in the solvent and passed through a polytetrafluoroethylene filter of 0.1 μm pore size, thereby obtaining a positive resist solution of 4 mass % solid content.

(Evaluation of Resist)

Each of the prepared positive resist solutions was uniformly applied onto a silicon substrate having undergone a hexamethyldisilazane treatment by means of a spin coater, and heated and dried on a hot plate at 120° C. for 60 seconds, thereby obtaining a 0.12 μm-thick resist film.

Each of the resist films was irradiated with EUV by means of EUV exposure device (wavelength 13 nm). Immediately after the irradiation, the film was baked on a hot plate at 120° C. for 90 seconds. Thereafter, the baked film was developed with a 2.38 mass % aqueous tetramethylammonium hydroxide solution at 23° C. for 60 seconds. After the development, the film was rinsed with pure water for 30 seconds and dried. Thus, a line-and-space pattern (line:space=1:1) was formed.

[Sensitivity]

Each of the obtained patterns was observed by means of a scanning electron microscope (model S-9220 manufactured by Hitachi, Ltd.). The sensitivity (Eo) was defined as the irradiation amount in which 0.10 μm (line:space=1:1) was resolved.

[Line Edge Roughness (LER)]

A 50 nm line pattern (L/S=1/1) was formed in the exposure amount exhibiting the above sensitivity. By means of a scanning electron microscope (model S-9220, manufactured by Hitachi, Ltd.), the distance between actual edge and a reference line on which edges were to be present was measured on arbitrary 30 points within 50 μm in the longitudinal direction of the pattern. The standard deviation of measured distances was determined, and 3σ was computed therefrom.

[Outgas Performance: Ratio of Change in Film Thickness by Exposure]

The ratio of change in film thickness by EUV exposure was determined in the same manner as described above with respect to the method of evaluating outgas performance in Example D.

[Aging Stability]

The aging stability was evaluated by the same method as in Example A.

These evaluation results are given in Table 6 below.

TABLE 6

| | (EUV: positive) | | | | | | | | |
|---|---|---|---|---|---|---|---|---|---|
| | Acid generator (A1) (0.60 mmol) | Resin (B) (10 g) | Basic compound (0.02 g) | Surfactant (0.1 mass %) | Solvent [mass ratio] | Sensitivity (mJ/cm$^2$) | LER (nm) | Out gas (%) | Aging stability |
| Ex. 1F | A1-1 | R-18 | C-1 | W-1 | A1/B1 [6/4] | 11.6 | 4.6 | 5.8 | ○ |
| Ex. 2F | A1-12 | R-18 | C-1 | W-1 | A2/B2 [6/4] | 11.8 | 4.7 | 5.4 | ○ |
| Ex. 3F | A1-98 | R-18 | C-1 | W-1 | A2/B2 [6/4] | 11.6 | 4.5 | 5.5 | ○ |
| Comp. 1F | Comparative compound 1 | R-18 | C-1 | W-1 | A1/B1 [6/4] | 13.8 | 7.5 | 7.9 | Δ |
| Comp. 2F | Comparative compound 2 | R-18 | C-1 | W-1 | A1/B1 [6/4] | 15.2 | 6.8 | 6.0 | Δ |
| Comp. 3F | Comparative compound 3 | R-18 | C-1 | W-1 | A1/B1 [6/4] | 14.2 | 7.2 | 7.0 | Δ |
| Comp. 4F | Comparative compound 4 | R-18 | C-1 | W-1 | A1/B1 [6/4] | 13.9 | 7.5 | 7.8 | Δ |

It is apparent from the results of Table 6 that in the employment of EUV exposure, the composition of the present invention excels in the sensitivity, LER, out gas performance and aging stability. Namely, it is apparent that the actinic-ray- or radiation-sensitive resin composition of the present invention exhibits excellent performance as a positive resist composition for use in EUV exposure.

What is claimed is:

1. An actinic-ray- or radiation-sensitive resin composition comprising:

a compound (AI) having a feature (1) below; and
a resin (B) having a feature (2) below; or a resin (C) and an acid crosslinking agent (D) having a feature (3) below, wherein (1) the compound (AI) is represented by general formula (II-1) or (II'-1), and when exposed to actinic rays or radiation, generates any of acids of general formula (I) below,
(2) the resin (B), when acted on by an acid, is decomposed to thereby increase its solubility in an alkali developer,
(3) the resin (C) is soluble in an alkali developer and the acid crosslinking agent (D) is capable of crosslinking with the resin (C),

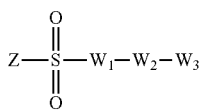
(I)

in which
$W_1$ represents an optionally substituted alkylene group,
$W_2$ represents a bivalent connecting group,
$W_3$ represents an optionally substituted organic group having 15 or more carbon atoms, and
Z represents a hydroxyl group or a fluoroalkylsulfonamido group having at least one fluorine atom introduced therein as a substituent,

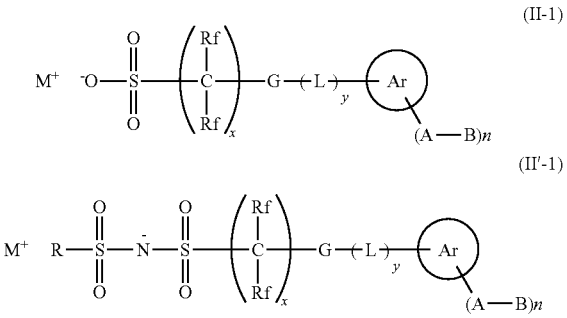

in which
R represents an alkyl group substituted with at least one fluorine atom,
each of Rf's independently represents a fluorine atom or an alkyl group substituted with at least one fluorine atom, and x is an integer of 1 or greater,
G represents a single bond, an alkylene group optionally containing an ether oxygen, a cycloalkylene group optionally containing an ether oxygen, an arylene group or a group composed of a combination of these, provided that combined groups may be linked to each other through an oxygen atom,
Ar represents an aromatic ring containing no heteroatom, in which a substituent other than -(A-B) groups may further be introduced,
A represents a single bond or a bivalent connecting group,
B represents a cycloaliphatic hydrocarbon group having 3 to 30 carbon atoms, and n is an integer of 1 or greater,
L represents —S(=O)$_2$—, and y is 1,
provided that when x is 2 or greater, two or more Rf—C—Rf's may be identical to or different from each other, and that when n is 2 or greater, two or more A-B's may each be identical to or different from each other, and
M+ represents an organic onium ion of general formulae (ZI) or (ZII) below,

(ZI)

(ZII)

in which,
each of $R_{201}$, $R_{202}$ and $R_{203}$ independently represents an organic group, and
each of $R_{204}$ and $R_{205}$ independently represents an aryl group, an alkyl group or a cycloalkyl group.

2. The actinic-ray- or radiation-sensitive resin composition according to claim 1, wherein in general formula (I), $W_3$ represents an optionally substituted organic group having 20 or more carbon atoms.

3. The actinic-ray- or radiation-sensitive resin composition according to claim 1, wherein in general formula (I), $W_1$ represents an alkylene group containing at least one fluorine atom.

4. The actinic-ray- or radiation-sensitive resin composition according to claim 1, wherein in general formula (II-1) or (II'-1), n is an integer of 2 or greater.

5. The actinic-ray- or radiation-sensitive resin composition according to claim 1, wherein in general formula (II-1) and (II'-1), n is an integer of 3 or greater.

6. A resist film formed from the actinic-ray- or radiation-sensitive resin composition according to claim 1.

7. A method of forming a pattern, comprising forming the actinic-ray- or radiation-sensitive resin composition according to claim 1 into a film, exposing the film and developing the exposed film.

8. The method of forming a pattern according to claim 7, wherein the exposure is performed using X-rays, electron beams or EUV.

9. The actinic-ray- or radiation-sensitive resin composition according to claim 1, wherein G represents a single bond.

10. An actinic-ray- or radiation-sensitive resin composition comprising:
a compound (AI) having a feature (1) below; and
a resin (B) having a feature (2) below; or a resin (C) and an acid crosslinking agent (D) having a feature (3) below, wherein (1) the compound (AI) is represented by general formula (II'-1), and when exposed to actinic rays or radiation, generates any of acids of general formula (I) below,
(2) the resin (B), when acted on by an acid, is decomposed to thereby increase its solubility in an alkali developer,
(3) the resin (C) soluble in an alkali developer and the acid crosslinking agent (D) is capable of crosslinking with the resin (C),

(I)

in which
$W_1$ represents an optionally substituted alkylene group,
$W_2$ represents a bivalent connecting group, W₃ represents an optionally substituted organic group having 15 or more carbon atoms, and Z represents or a fluoroalkylsulfonamido group having at least one fluorine atom introduced therein as a substituent,

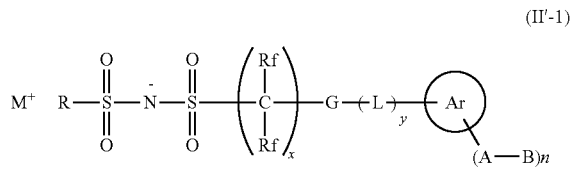

(II'-1)

in which

R represents an alkyl group substituted with at least one fluorine atom, each of Rf's independently represents a fluorine atom or an alkyl group substituted with at least one fluorine atom, and x is an integer of 1 or greater, G represents a single bond, an alkylene group optionally containing an ether oxygen, a cycloalkylene group optionally containing an ether oxygen, an arylene group or a group composed of a combination of these, provided that combined groups may be linked to each other through an oxygen atom, Ar represents an aromatic ring optionally containing a heteroatom, in which a substituent other than -(A-B) groups may further be introduced, A represents a single bond or a bivalent connecting group, B represents a hydrocarbon group, and n is an integer of 1 or greater, L represents a bivalent connecting group, and y is an integer of 0 or greater, provided that -(L)y- does not represent —SO₂—O—, provided that when x is 2 or greater, two or more Rf—C—Rf's may be identical to or different from each other, and that when y is 2 or greater, two or more L's may be identical to or different from each other, and that when n is 2 or greater, two or more A-B's may each be identical to or different from each other, and M+ represents an organic onium ion of general formulae (ZI) or (ZII) below,

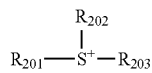

(ZI)

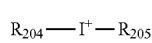

(ZII)

in which, each of $R_{201}$, $R_{202}$ and $R_{203}$ independently represents an organic group, and each of $R_{204}$ and $R_{205}$ independently represents an aryl group, an alkyl group or a cycloalkyl group.

11. The actinic-ray-or-radiation-sensitive resin composition according to claim 10, wherein L represents —SO₂— and y is 1.

12. The actinic-ray- or radiation-sensitive resin composition according to claim 10, wherein in general formula (I), $W_1$ represents an alkylene group containing at least one fluorine atom.

13. A method of forming a pattern, comprising forming the actinic-ray- or radiation-sensitive resin composition according to claim 10 into a film, exposing the film and developing the exposed film.

14. A method of forming a pattern, comprising forming the actinic-ray- or radiation-sensitive resin composition into a film, exposing the film and developing the exposed film, wherein the exposure is performed using X-rays, electron beams or EUV, and wherein the resin composition comprises:

a compound (AI) having a feature (1) below; and a resin (B) having a feature (2) below; or a resin (C) and an acid crosslinking agent (D) having a feature (3) below, wherein (1) the compound (AI) is represented by general formula (II-1) or (II'-1), and when exposed to actinic rays or radiation, generates any of acids of general formula (I) below, (2) the resin (B), when acted on by an acid, is decomposed to thereby increase its solubility in an alkali developer, (3) the resin (C) is soluble in an alkali developer and the acid crosslinking agent (D) is capable of crosslinking with the resin (C),

(I)

in which $W_1$ represents an optionally substituted alkylene group, $W_2$ represents a bivalent connecting group, $W_3$ represents an optionally substituted organic group having 15 or more carbon atoms, and Z represents a hydroxyl group or a fluoroalkylsulfonamido group having at least one fluorine atom introduced therein as a substituent,

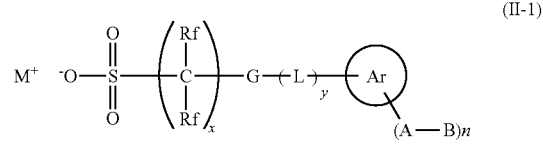

(II-1)

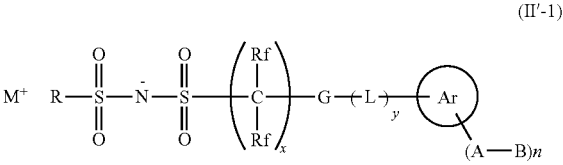

(II'-1)

in which

R represents an alkyl group substituted with at least one fluorine atom, each of Rf's independently represents a fluorine atom or an alkyl group substituted with at least one fluorine atom, and x is an integer of 1 or greater, G represents a single bond, an alkylene group optionally containing an ether oxygen, a cycloalkylene group optionally containing an ether oxygen, an arylene group or a group composed of a combination of these, provided that combined groups may be linked to each other through an oxygen atom, Ar represents an aromatic ring containing no heteroatom, in which a substituent other than -(A-B) groups may further be introduced, A represents a single bond or a bivalent connecting group, B represents a noncyclic hydrocarbon group containing a tertiary or quaternary carbon atom, or a cycloaliphatic hydrocarbon group having 3 to 30 carbon atoms, wherein said tertiary or quaternary carbon atom is selected from an isopropyl group, a t-butyl group, a t-pentyl group, a neopentyl group, an s-butyl group, an iso-butyl group, an isohexyl group, a 3,3-dimethylpentyl group and a 2-ethylhexyl group, and n is an integer of 1 or greater, L represents $-S(=O)_2-$, and y is 1, provided that when x is 2 or greater, two or more Rf—C—Rf's may be identical to or different from each other, and that when n is 2 or greater, two or more A-B's may each be identical to or different from each other, and M+ represents an organic onium ion of general formulae (ZI) or (ZII) below,

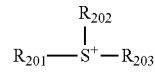

(ZI)

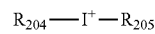

(ZII)

in which, each of $R_{201}$, $R_{202}$ and $R_{203}$ independently represents an organic group, and each of $R_{204}$ and $R_{205}$ independently represents an aryl group, an alkyl group or a cycloalkyl group.

* * * * *